(12) United States Patent
Seko et al.

(10) Patent No.: US 8,787,068 B2
(45) Date of Patent: Jul. 22, 2014

(54) SEMICONDUCTOR DEVICE

(75) Inventors: Akiyoshi Seko, Tokyo (JP); Tatsuya Matano, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 289 days.

(21) Appl. No.: 13/440,633

(22) Filed: Apr. 5, 2012

(65) Prior Publication Data

US 2012/0257437 A1 Oct. 11, 2012

(30) Foreign Application Priority Data

Apr. 7, 2011 (JP) ................................ 2011-085636
Mar. 13, 2012 (JP) ................................ 2012-055195

(51) Int. Cl.
*G11C 11/00* (2006.01)

(52) U.S. Cl.
USPC .................. 365/148; 365/185.05; 365/185.23

(58) Field of Classification Search
CPC .. G11C 2213/79; G11C 8/08; G11C 13/0002; G11C 13/0038
USPC ................. 365/148, 185.05, 185.23
See application file for complete search history.

(56) References Cited

U.S. PATENT DOCUMENTS

| 8,009,456 | B2 | 8/2011 | Shimomura et al. | |
|---|---|---|---|---|
| 8,531,869 | B2* | 9/2013 | Katoh et al. | 365/148 |
| 8,619,460 | B2* | 12/2013 | Kanzawa et al. | 365/148 |
| 2011/0002157 | A1 | 1/2011 | Shimomura et al. | |
| 2011/0069533 | A1 | 3/2011 | Kurosawa et al. | |
| 2011/0075469 | A1* | 3/2011 | Wei et al. | 365/148 |
| 2012/0075910 | A1* | 3/2012 | Yasuda | 365/148 |
| 2013/0003439 | A1* | 1/2013 | Azuma et al. | 365/148 |
| 2013/0070516 | A1* | 3/2013 | Tomotani et al. | 365/148 |
| 2013/0135921 | A1* | 5/2013 | Owada | 365/148 |
| 2013/0208529 | A1* | 8/2013 | Tomotani et al. | 365/148 |
| 2014/0043886 | A1* | 2/2014 | WU et al. | 365/148 |

FOREIGN PATENT DOCUMENTS

| JP | 2009-170006 A | 7/2009 |
|---|---|---|
| JP | 2011-065737 A | 3/2011 |

OTHER PUBLICATIONS

U. Russo et al., 'Study of Multilevel Programming in Programmable Metallization Cell (PMC) Memory', IEEE Transactions on Electron Devices vol. 56, No. 5, p. 1040-1047, 2009.

H.Y. Lee et al., 'Low Power and High Speed Bipolar Switching with a Thin Reactive Ti Buffer Layer in Robust $HfO_2$ Based PRAM', international electron Device meeting 2008 (IEDM 2008), p. 297-300.

(Continued)

*Primary Examiner* — Tuan T Nguyen
(74) *Attorney, Agent, or Firm* — McGinn IP Law Group, PLLC

(57) ABSTRACT

A semiconductor device includes first and second interconnects, a variable resistance element that may assume a first resistance value or a second resistance value in response to the current flowing therein, first and second transistors connected between the first and second interconnects in series with each other on both sides of the variable resistance element, and a power supply circuit unit that delivers the power supply to a control electrode of the first transistor. The power supply circuit unit supplies the power of a first power supply when the variable resistance element is to make transition to the first resistance value and the power supply circuit unit supplies the power of a second power supply when the variable resistance element is to make transition to the second resistance value, thereby allowing transitioning of the resistance values of the variable resistance element.

20 Claims, 37 Drawing Sheets

(56) References Cited

OTHER PUBLICATIONS

Tomohisa Mizuno, 'Physics of transistor characteristic fluctuations', Applied Physics vol. 75 No. 9 p. 1103-1108, 2009.

Kenji Taniguchi, 'Introduction to CMOS Analog Circuit', p. 146, CQ Publications.

W. W. Zhuang et al., 'Novel Colossal Magnetoresistive Thin Film Nonvolatile Resistance Random Access Memory (PRAM)', 2002, 12, pp. 193-196.

* cited by examiner

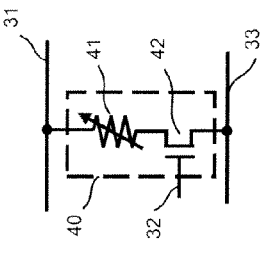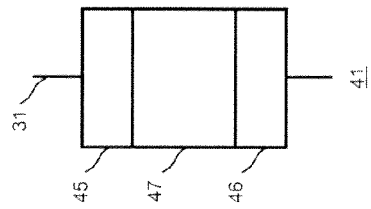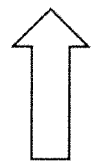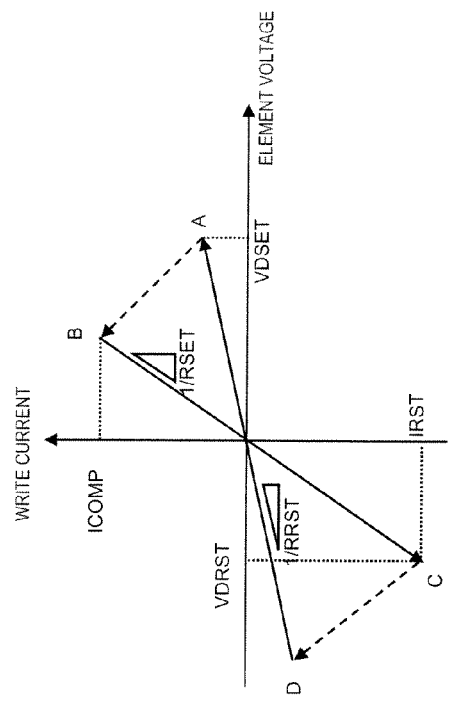
FIG. 4A  FIG. 4B  FIG. 4C

SEMICONDUCTOR DEVICE

REFERENCE TO RELATED APPLICATION

This application is based upon and claims the benefits of the priorities of Japanese patent application No. 2011-085636, filed on Apr. 7, 2011 and 2012-055195, filed on Mar. 13, 2012, the disclosures of which are incorporated herein in their entirety by reference thereto. This invention relates to a semiconductor device, a controlling method therefor, and a memory system. More particularly, it relates to a semiconductor device including a variable resistance element as a storage element.

BACKGROUND

As a present-day semiconductor memory of large capacity, a DRAM is most popular, and is extensively used in e.g., a computer system. As a non-volatile semiconductor memory, on the other hand, a flash memory is extensively used. However, the DRAMs or the flash memories, which now are mainstream devices, are said to be reaching the limit of miniaturization in several years to come. Hence, investigations into a variety of large-capacity semiconductor memory devices, capable of replacing the DRAMs or flash memories, are now going on. In particular, variable resistance memories or resistive switching memories that exploit the phenomenon in which changes in resistance are produced by applying a voltage to transition metal oxides, such as perovskite oxides or NiO, are stirring up notice. Examples of these semiconductor memory devices include RRAMs or ReRAMs. The variable resistance memories, in which the variable resistance states may be maintained even after power down, may operate as volatile memories. These variable resistance memories or resistive switching memories are disclosed in Non-Patent Documents 1 and 2.

FIG. 4A shows an example configuration of a memory cell 40 of the variable resistance memory. This memory cell 40 includes a variable resistance element 41 and a cell transistor 42 connected in series between a bit line 31 and a source line 33. A resistance value may be written in the variable resistance element 41 by way of programming. The resistance value may be read out by allowing the current to flow through the variable resistance element 41.

FIG. 4B shows an example inner configuration of the variable resistance element 41. The variable resistance element includes a first electrode 45, connected to the bit line 31, a second electrode 46, connected to a cell transistor, not shown, and an insulation film 47, sandwiched between the first and second electrodes 45, 46. It is reported that, in case a transition metal oxide is used for the insulation film 47, a wide variety of characteristics may be exhibited depending on the combination of substances used for the first and second electrodes 45, 46.

In writing (programming) data in the variable resistance element, two different sorts of write are needed. One is the write of changing the high resistance state (sometimes referred to below as Register to ReSet or RRST) to the low resistance state (sometimes referred to below as Register to SeT or RSET). The other is the write of changing the low resistance state (RSET) to the high resistance state (PRST). In the description to follow, the write for changing the high resistance state (PRST) to the low resistance state (RSET) is also referred to as SET write or Set, and the write for changing the low resistance state to the high resistance state is also referred to as RESET write or Reset.

The operation of SET write or the RESET write may be classified into a unipolar operation and a bipolar operation. In the unipolar operation, the write is performed as the voltage is applied to the variable resistance element in the same direction for Set and Reset. In the bipolar operation, the write is performed as the voltage is applied to the variable resistance element in the opposite directions for Set and Reset. The bipolar write operation will now be described with reference to FIG. 4C, in which the voltage applied across the electrodes of the variable resistance element is plotted on the abscissa and the value of the current flowing between both ends at this time is plotted on the ordinate. It is assumed that the variable resistance element is initially in the reset state. This state is the high resistance state. If, in this reset state, positive voltage VDSET is applied across both terminals of the variable resistance element (point A in FIG. 4C), the variable resistance element is set to the low resistance state from the high resistance state (transition from point A to point B in FIG. 4C). The maximum current flowing at this time is labeled ICOMP.

If conversely the write is from the Set state to the Reset state, the voltage is applied in the reverse direction to that to the Set state. That is, a voltage VDRST is applied to the variable resistance element in an opposite direction to that for Set (point C in FIG. 4C). The current flowing at this time is labeled IRST. This resets the variable resistance element from the Set state so that the resistance element reverts to the large resistance state (transition from a point C to a point D in FIG. 4C). In reading out from the resistance element, a voltage lower than VDSET is applied to the resistance element to check the current flowing at such time to verify whether the resistance element is in the Set state or in the Reset state.

In the Non-Patent Documents 1, 2, it is stated that, in a memory that uses a variable resistance element as a storage element, the resistance value after SET write (resistance value of RSET) depends on the maximum current value used at the write time. In the Non-Patent Documents 3, 4, it is stated that variations in Vth (threshold value voltage) of a MOS transistor depend on the channel area, although the statement is not directly relevant to the semiconductor device that uses the variable resistance element as memory element. The Non-Patent Documents 3, be referred to in the description of exemplary embodiments of the present invention.

The Non-Patent Document 5 shows a variable resistance memory having a memory cell arrangement in which a MOS transistor is connected in series with a variable resistance element. The Non-Patent Documents 1 and 2 show a memory that uses a variable resistance element (variable element memory or resistance switching memory). The variable element memory distinguishes between states 0 and 1, depending on resistance values, so as to be used as memory. Patent Document 1 shows that the memory is the above mentioned bipolar memory which controls write-0 as a preset current is allowed to flow in a first direction through the variable resistance element while controlling write-1 as a preset current is allowed to flow in a second direction opposite to the first direction through the variable resistance element.

[Patent Document 1]

JP Patent Kokai Publication No. JP2009-170006A, which corresponds to U.S. Pat. No. 8,009,456B2 and US2011/002157A1

[Patent Document 2]

JP Patent Kokai Publication No. JP2011-65737A, which corresponds to US2011/069533A1

[Non-Patent Document 1]
U. Russo et al., 'Study of Multilevel Programming in Programmable Metallization Cell (PMC) Memory', IEEE TRANSACTIONS ON ELECTRON DEVICES VOL. 56, No. 5, P 1040-1047, 2009
[Non-Patent Document 2]
H. Y. Lee et al., 'Low Power and High Speed Bipolar Switching with A Thin Reactive Ti Buffer Layer in Robust $HfO_2$ Based PRAM', international electron Device meeting 2008 (IEDM 2008), P 297-300
[Non-Patent Document 3]
Tomohisa MIZUNO, 'Physics of transistor characteristic fluctuations', Applied Physics vol. 75 No. 9 P 1103-1108, 2009
[Non-Patent Document 4]
Kenji TANIGUCHI, 'Introduction to CMOS Analog Circuit', P 146, CQ Publications
[Non-Patent Document 5]
W. W. Zhuang et al., 'Novel Colossal Magnetoresistive Thin Film Nonvolatile Resistance Random Access Memory (PRAM)', 2002, 12, pp 193-196

SUMMARY

The disclosure of the above Patent Documents and Non-patent Documents are incorporated herein in their entirety by reference thereto. The following analysis is made from the side of the present invention.

If, in changing the resistance value of the variable resistance element for (programming), the t caused to flow in the variable resistance element is not up to a preset value, there is a possibility that write cannot be made. If the current exceeds the preset value, there is a possibility that the resistance is changed to an unforeseeable value.

If, in a semiconductor device that uses the variable resistance element as a memory element, in particular, the variable resistance element is to transition from a high resistance state to a low resistance state, the post-transition resistance is of a value that depends on the maximum current applied during the transition time. This is stated in Non-Patent Documents 1 and 2. Our analysis has shown that, if the resistance value of the variable resistance element transitions rapidly from a high resistance to a low resistance, the terminal voltage of the variable resistance element is rapidly changed with change in the resistance value. By such rapid change in voltage, the parasitic capacitance stored in a parasitic capacitance element, associated with the terminals of the variable resistance element, flows instantaneously through the variable resistance element to render it difficult to control the maximum current value accurately. For example, the parasitic capacitance element and the parasitic capacitance value are present on a bit line and a data bus between the variable resistance element and a current control element (write amplifier) that controls the supply of the current to the variable resistance element. The reason is that, even though the current value delivered by the current control element is controlled in response to rapid changes in the resistance value of the variable resistance element, the parasitic charges present on the parasitic capacitance element supply the current to the variable resistance element. This problem will be treated in detail in the explanation of exemplary embodiments. Thus there has been much to be desired in the art.

In one aspect of the present disclosure, there is provided a semiconductor device comprising first and second interconnects, a variable resistance element that may assume a first resistance value or a second resistance value in response to the current flowing therein, first and second transistors connected between the first and second interconnects in series with each other on both sides of the variable resistance element, and a power supply circuit unit that delivers the power supply to a control electrode of the first transistor. The power supply circuit unit supplies the power of a first power supply when the variable resistance element is to make transition to the first resistance value, while supplying the power of a second power supply differing from the first power supply when the variable resistance element is to make transition to the second resistance value, such as to allow transitioning of the resistance values of the variable resistance element.

In another aspect of the present disclosure, there is provided a semiconductor device comprising a memory cell including a series connection of a variable resistance element and a transistor accessing the variable resistance element, a bit line connected to one end of the memory cell, a source line connected to the other end of the memory cell, a word line connected to the gate electrode of the transistor and a word line driving circuit that delivers a voltage to the word line. The variable resistance element stores the information by resistance values. In setting a resistance value of the variable resistance element from a high resistance to a low resistance, the word line driving circuit causes the word line to transition from a first voltage that turns the transistor off to a third voltage that turns the transistor on at a second impedance higher than a first impedance to change the resistance value of the variable resistance element to a third resistance value intermediate between the high resistance and the low resistance. The third voltage is a voltage intermediate between the first voltage and a second voltage, and the transistor is turned on at the first impedance with the second voltage. The word line is made to transition from the third voltage to the second voltage after preset time as from transitioning to the third voltage to set the resistance value of the variable resistance element at the low resistance.

In a third aspect of the present disclosure, there is provided a method for controlling a semiconductor device including a plurality of memory cells arranged in a matrix pattern at intersection points of a plurality of bit lines and a plurality of word lines. Each memory cell includes a variable resistance element that has one end connected to an associated one of the bit lines and that may have its resistance value changed to a high resistance value state or to a low resistance value state by way of writing. Each memory cell also includes a transistor connected to a word line and a source line corresponding to the other end of the variable resistance element. The current conduction/non-conduction between the other end of the variable resistance element and the source line is controlled by a voltage applied to the associated word line. The method includes first control, second control and third control. The first control is such control in which, in selecting the bit line and the word line and in writing the resistance value of a relevant one of the variable resistance elements from a high resistance value to a low resistance value, the selected bit line is connected to a current source, the selected word line is made to transition from a first voltage at a non-selection level to a third voltage intermediate between the first voltage and a second voltage at a selection level to cause the resistance value of the associated variable resistance element to transition to a resistance value intermediate between the high resistance value and the low resistance value. The second control is such control in which the selected word line is made to transition from the third voltage to the second voltage to set the resistance value of the associated variable resistance element at the low resistance value. The third control is such control in which the selected word line is reverted to the first voltage and the selected bit line is disconnected from the current source to terminate the writing in the associated variable resistance element.

In a fourth aspect of the present disclosure, there is provided a memory system including a memory unit and a controller that controls the operation of the memory unit and that performs information processing using the information stored in the memory unit. The memory unit includes a memory cell in turn including a variable resistance element that stores the information as a resistance value and a transistor that accesses the variable resistance element. The memory unit also includes a bit line connected to one end of the memory cell, a source line connected to the other end of the memory cell, a word line connected to the gate electrode of the transistor and a word line driving circuit that provides the word line with voltage. In setting a resistance value of the variable resistance element from a high resistance to a low resistance, the word line driving circuit causes the word line to transition from a first voltage that turns the transistor off to a third voltage that turns the transistor on at a second impedance higher than a first impedance to change the resistance value of the variable resistance element to a third resistance value intermediate between the high resistance and the low resistance. The third voltage is a voltage intermediate between the first voltage and a second voltage, and the transistor is turned on at the first impedance with the second voltage. The word line is made to transition from the third voltage to the second voltage after preset time as from transitioning to the third voltage to set the resistance value of the variable resistance element at the low resistance.

In the above aspects of the present disclosure, the current values caused to flow in changing the resistance value of the variable resistance element may be controlled to high accuracy. In particular, in making the variable resistance element transition from a high resistance state to a low resistance state, it is possible to prevent acute variations in the terminal voltage (voltage across terminals) of the variable resistance element to control the maximum current value to high accuracy.

BRIEF DESCRIPTION OF THE DRAWINGS

FIG. 4A is a circuit diagram showing an inner configuration of a memory cell of a resistive switching memory.

FIG. 4B is a block diagram showing a further inner configuration of a variable resistance element.

FIG. 4C is a graph showing I-V characteristics of the variable resistance element.

PREFERRED MODES

Figure 1:
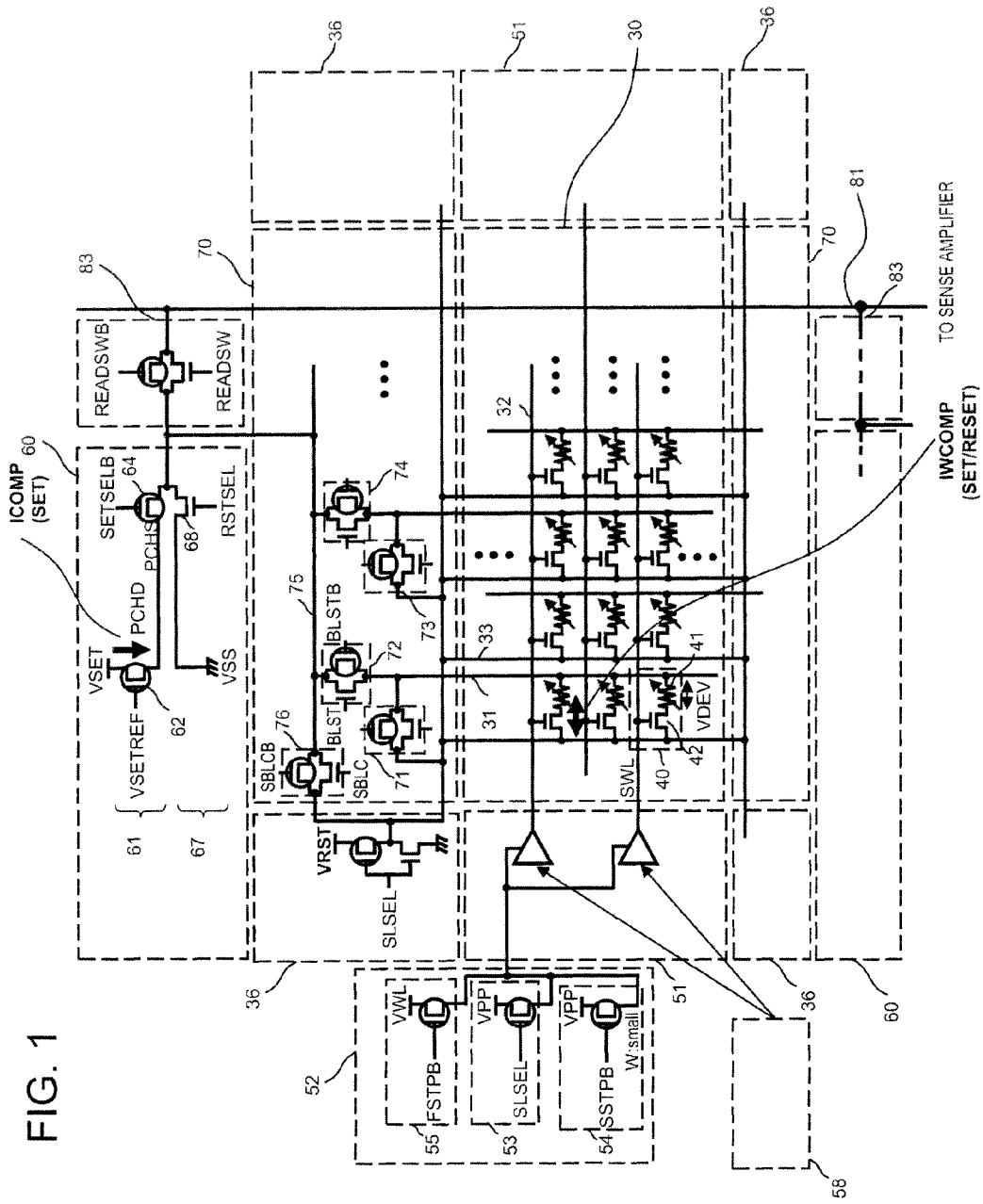
FIG. 1 is a circuit block diagram showing a memory cell array with its periphery of a semiconductor device according to an exemplary embodiment 1 of the present disclosure.

Before detailed description of the exemplary embodiments of the present disclosure, an outline of the exemplary embodiment will be explained. It is noted that the drawings and reference numerals added to the explanation of the outline are merely for assisting in the understanding and are not intended to restrict the disclosure to the matters shown.

Preferred examples of a semiconductor device according to exemplary embodiments of the present invention are shown in FIGS. 1, 8, 27, 34 and 35. Such semiconductor device includes first and second interconnects (one and the other of a common bit line 75 and a source line 33), and a variable resistance element (41) that may assume a first resistance value or a second resistance value in response to the current flowing therein. The semiconductor device also includes first and second transistors (one and the other of bit line selection transistors 72, 142A and a cell transistor 42) connected between the first and second interconnects in series with each other on both sides of the variable resistance element (41), and a power supply circuit unit (52 of FIG. 1, 152 of FIGS. 8 and 189 of FIG. 34) that delivers the power supply to a control electrode of the first transistor. The power supply circuit unit supplies the power of a first power supply when the variable resistance element is to transition to the first resistance value, while supplying the power of a second power supply when the variable resistance element is to transition to the second resistance value, such as to allow transitioning of the resistance values of the variable resistance element.

A semiconductor device according to an exemplary embodiment of the present disclosure includes a memory cell (40) including a variable resistance element (41) and a transistor (42), as shown in FIG. 1. The variable resistance element is connected to a bit line and may be written to a high resistance state or to a low resistance state by the current flowing therein. The transistor (42) is connected in series with the variable resistance element and has its current conduction/non-conduction controlled by a voltage applied to an associated word line. It is assumed that the resistance value of the relevant variable resistance element is to be written from the high resistance (RBST) to the low resistance (RSET), as indicated by RCELL in FIG. 3. In this case, the word line (SWL) selected is made to transition from a first voltage (VSS) to a third voltage (VWL) intermediate between the first voltage and a second voltage (VPP). Note that, for the first voltage (VSS), the transistor (42) is not selected and that, for the second voltage (VPP), the transistor (42) is selected. The resistance value of the associated variable resistance element is thus changed to a resistance value intermediate between the high and low resistance values (refer to the resistance value at t5 in FIG. 3). The word line selected is then made to transition from the third voltage to the second voltage (VPP) (from t5 to t6 in FIG. 3) to set the resistance value of the associated variable resistance element at low resistance (RSET). With the second voltage, the transistor (42) is turned on at a first impedance value. With the third voltage, the transistor (42) is turned on at a second impedance value higher than the first impedance value. Note that the intermediate voltage (intermediate level) is a voltage level of the word line (SWL) which is only sufficient to turn on the transistor (42) but is not a voltage equal to one-half (½) of the voltage difference between the power supplies VPP and VSS. Also note that the resistance value at the intermediate stage is not a resistance value one-half (½) of the resistance difference between the high resistance (RRSET) and the low resistance (RSET).

The voltage at the word line SWL selected is set at the third voltage at the intermediate level to make the resistance of the variable resistance element transition once to an intermediate level resistance. It is thus possible to prevent potential variations of the selected bit line otherwise brought about by rapid decrease in the resistance value of the variable resistance element. By so doing, the electrical charges may be prevented from instantaneously flowing from the parasitic capacitance on the selected bit line to the variable resistance element to make its resistance transition to a resistance value lower than the scheduled value.

The above is the explanation of the summary of the invention. The exemplary embodiments will now be explained with reference to the drawings.

Exemplary Embodiment 1

Configuration of Exemplary Embodiment 1

Figure 2:
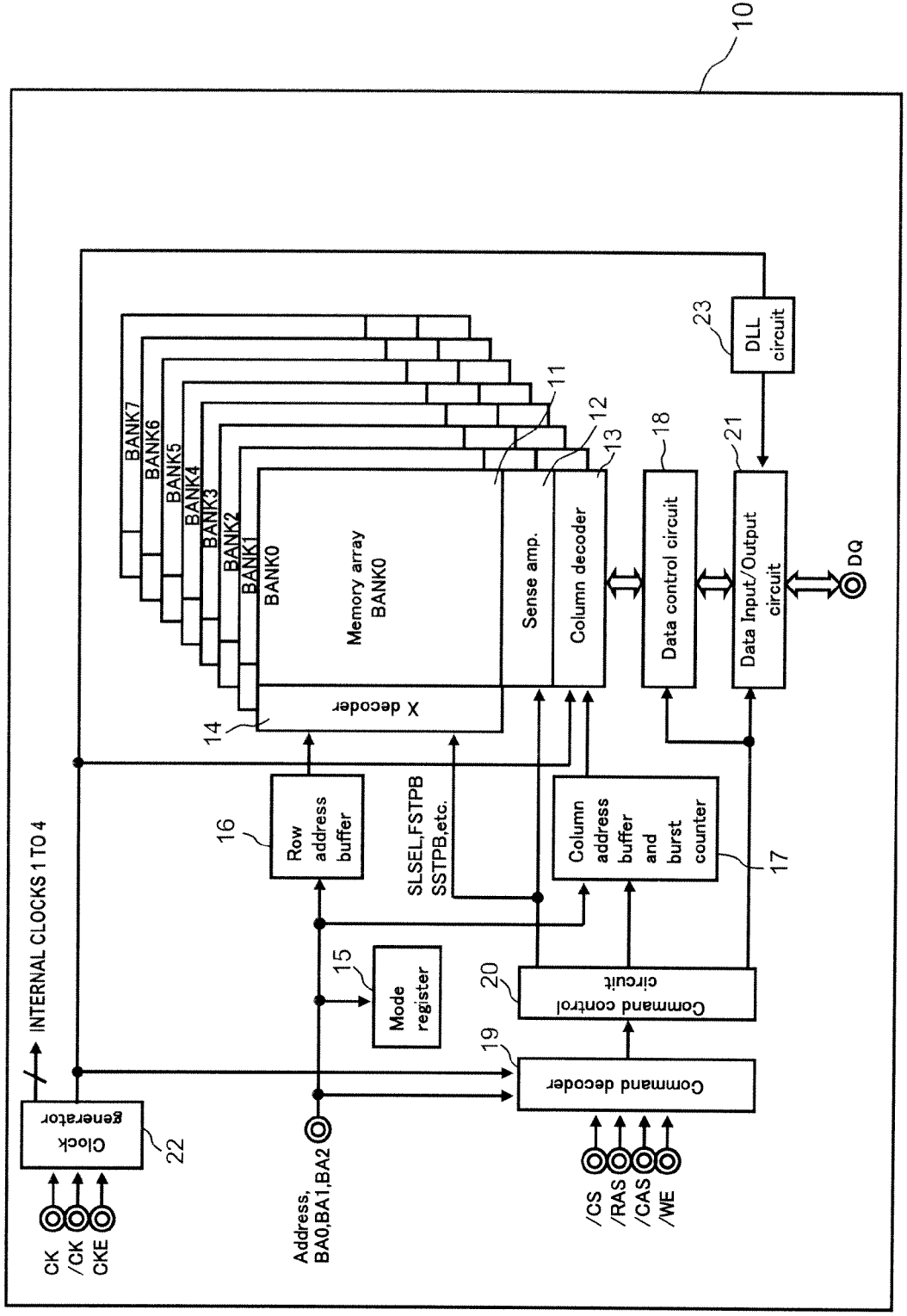
FIG. 2 is a block diagram showing the semiconductor device in its entirety according to the exemplary embodiment 1.

FIG. 2 depicts a block diagram of a semiconductor device 10 of the exemplary embodiment in its entirety. The semiconductor device 10 of FIG. 2 includes a large capacity read-write memory array 11 with eight memory banks. In FIG. 2, an X-decoder (row decoder) 14 decodes a row address to drive a selected word line, not shown. During the readout operation, a sense amplifier 12 verifies the current or the potential at a bit line, not shown, of the memory array 11 to output the verified value as output to outside. A column decoder 13 decodes a column address to turn on a selected Y-switch, not shown, to select a bit line to connect the so selected bit line to an IO line, not shown. A command decoder 19 inputs a preset address signal, while inputting, as control signals, chip select signal /CS, a row address strobe signal /RAS, a column address strobe signal /CAS and a write enable signal /WE to decode a command. Note that a slash/preceding a signal name indicates that the signal in question is low active. A command control circuit 20 receives an output signal of the command decoder 19 to output control signals required to execute each command to respective parts the inside of the semiconductor device 10. In particular, at the write operation, the command control circuit outputs control signals, such as SLSEL, FSTPB or SSTPB, to the X-decoder 14. A column address buffer-burst counter 17 generates an address of a length equal to the burst length from the input column address to deliver the so generated address to the column decoder 13 under control by the command control circuit 20. A mode register 15 inputs the address signal and signals BA0, BA1 and BA2 for bank selection, that is, for selecting one of the eight banks, to output a control signal to the command control circuit 20. A row address buffer 16 receives an input row address to deliver it to the X-decoder 14.

A clock generator 22 receives complementary external clocks CK, /CK, delivered from outside to the semiconductor device 10 and, if a clock enable signal CKE is high, outputs an internal clock to each relevant part in the semiconductor device. The internal clock ceases to be delivered as from the time the clock enable signal CKE is LOW in level.

A data control circuit 18 inputs/outputs write data and readout data. In outputting the readout data, a data input/output circuit 21 converts data read out in parallel from the data control circuit into serial data, in synchronism with a clock signal delivered from the DLL circuit, to output the serial data generated at a data input/output terminal DQ. At write time, the data input/output circuit converts data, serially delivered from the data input/output terminal DQ, into parallel data, which then is delivered to the data control circuit 18.

FIG. 1 depicts a circuit block diagram showing an area of a portion of the memory array 11 of one of eight memory banks. In FIG. 1, there is shown a memory array 11, in which there are provided a plurality of memory cell arrays (MATS) 30 arranged in a matrix in a known manner. In the drawing, there are shown one of such memory cell arrays and associated peripheral circuits. Note that an address decoder 58, a circuit arranged outside the memory array 11, is here shown. The memory cell array 30 includes a plurality of bit lines 31, a plurality of word lines (sub-word lines) 32 arranged to intersect the bit lines 31, and a plurality of memory cells 40 arranged in a matrix at the points of intersections of the bit lines 31 and the word lines 32. Each memory cell 40 includes a variable resistance element 41, having its one end connected to the associated bit line 31, and a transistor 42 the source or the drain of which are connected to the other end of the variable resistance element 41 and the gate of which is connected to the associated word line 32. The transistor 42 is to be a cell transistor and has drain or source connected to a source line 33. The transistor 42 is preferably an NMOS transistor, only by way of an example. Each source line 33 is connected common to the transistors of the memory cells. Since each source line is connected common to the transistors of the memory cells, it is not mandatory that the source lines are in the configuration shown. That is, the source lines may be arranged in a planar or meshed configuration within the memory cell array 30. In particular, if a vertical transistor (a transistor whose channel is arranged in a perpendicular direction) is used as the transistor 42, there may be such a case where the source lines are arranged in a planar form using e.g., an n+ diffusion layer.

A sub-word driver 51 drives a selected word line, selected by an address signal, delivered from the address decoder 58, to a HIGH level (VPP: second voltage). Non-selected word lines are maintained at LOW levels (VSS: first voltage). The sub-word driver 51 includes a word line power supply circuit unit 52 that delivers the power on selection of the word line. The word line power supply circuit unit 52 includes a first word line power supply circuit 53, a second word line power supply circuit 54 and a third word line power supply circuit 55. The first word line power supply circuit 53 is used at reset and readout, while the second and third word line power supply circuits 54, 55 are used at set.

The first word line power supply circuit 53 includes a PMOS transistor whose source is connected to a power supply VPP, whose gate is coupled to a control signal SLSEL and whose drain is connected to a high level side power supply terminal of the sub-word driver 51. The PMOS transistor is turned on when the control signal SLSEL is active (goes LOW) to deliver the power supply VPP as HIGH level side power supply of the sub-word driver 51.

The second word line power supply circuit 54 includes a PMOS transistor whose source is connected to the power supply VPP, whose gate is coupled to a control signal SSTPB and whose drain is connected to a high level side power supply terminal of the sub-word driver 51. The PMOS transistor is turned on when the control signal SSTPB is active (goes LOW) to deliver the power supply VPP as power supply of the sub-word driver 51. It is noted that the PMOS transistor of the second word line power supply circuit 54 is of a channel size W smaller than that of the PMOS transistor of the first word line power supply circuit 53. Hence, the on-resistance of the second word line power supply circuit 54 turned on is greater than that of the first word line power supply circuit 53 turned on.

The third word line power supply circuit 55 includes a PMOS transistor whose source is connected to the power supply VWL (third voltage), whose gate is coupled to a control signal FSTPB and whose drain is connected to a high level side power supply terminal of the sub-word driver 51. The PMOS transistor is turned on when the control signal FSTPB is active (goes LOW), and delivers the power of the power supply VWL as high-level side power supply of the sub-word driver 51. It is noted that the power supply VWL is lower in level than the power supply VPP, and outputs a voltage level intermediate between the high-level side power supply VPP and the low-level side power supply VSS of the word line.

A source line driver 36 is connected to VRST as a positive power supply and receives the control signal SLSEL to drive the source line. When the control signal SLSEL is HIGH, the source line 33 is driven to a VSS level (fifth voltage) and, when the control signal SLSEL is LOW, the source line 33 are driven to a VRST level (seventh voltage).

A bit line selection circuit 70 includes bit line selection switches 72, 74 that connect the bit lines 31 to a common bit line 75 and bit line selection switches 71, 73 that connect the bit lines 31 to the source line 33. A control signal BLST and its inverted control signal BLSTB, as signals that control the on/off of the bit line selection switches 71, 72, are connected to the bit line selection switches 71, 72. When the control signal BLST is HIGH, the corresponding bit lines 31 are connected to the common bit line 75 and, when the control signal BLST is LOW, the corresponding bit lines 31 are connected to the source line 33. It is noted that different signals are coupled as the control signal BLST, such that just a selected one of the bit lines 31 is connected to the common bit line 75, with the remaining bit lines 31 being connected to the source line 33.

The bit line selection circuit 70 includes a source line common bit line connection switch 76 that connects an output of the source line driver 36 to the common bit line 75. The source line common bit line connection switch 76 is controlled to be on/off by a control signal SBLC and its inverted signal SBLCB so that, when the control signal SBLC is HIGH (when the inverted signal SBLCB is LOW), the source line 33 and the common bit line 75 are connected to each other via the source line common bit line connection switch 76.

A write amplifier 60 includes a SET driver 61 and a RESET selector 67. The SET driver 61 includes a constant current source transistor 62, operating as a current source in writing the selected variable resistance element 41 from the high resistance to the low resistance, and a switch transistor 64 to control the on/off of the current to be delivered to the variable resistance element 41. The constant current source transistor 62 and the switch transistor 64 are both PMOS transistors. The constant current source transistor 62 has a source connected to a positive power supply VSET, while having a gate coupled to a current control signal VSETREF. The switch transistor 64 has a source connected to a drain of the constant current source transistor 62, while having a drain connected to the common bit line 75 and having a gate connected to a selection signal SETSELB.

The SET driver 61 adjusted by the current flowing through the constant current source transistor 62 so that the maximum current at SET write will be a constant current value of ICOMP, such as to maintain a constant resistance value of the variable resistance element 41 which is in a RSET (low resistance) following the SET write.

The RESET selector 67 includes a switch transistor 68, which is an NMOS transistor whose source is connected to a reference power supply VSS (sixth voltage), whose drain is connected to the common bit line 75 and whose gate receives a control signal RSTSEL.

SET write is by supplying the current from the write amplifier 60 via bit line 31 and memory cell 40 to the source line 33. RESET write is by supplying the current in the reverse direction, that is, from the source line 33 via memory cell 40 and bit line 31 to the RESET selector 67 of the write amplifier 60.

A global bit line selection switch 83 connects the common bit line 75 to a global bit line (GBL) 81. A signal READSW and its inverted signal READSWB control the turning on/off of the global bit line selection switch 83. This global bit line selection switch 83 connects the common bit line 75 to the global bit line (GBL) 81 at readout, while being open at write. In FIG. 1, the global bit line selection switch 83 is arranged in a CMOS transmission gate configuration. It may also be arranged otherwise provided that it operates as a switch controlling the current conduction on or non-conduction between the common bit line 75 and the global bit line 81. A sense amplifier, not shown, is provided ahead of the global bit line 81. The write amplifier 60, global bit line selection switch 83 and the bit line selection circuit 70 are included in the bit line control circuit, while the source line driver 36 is included in a source line control circuit.

Operation of Exemplary Embodiment 1

Figure 3:
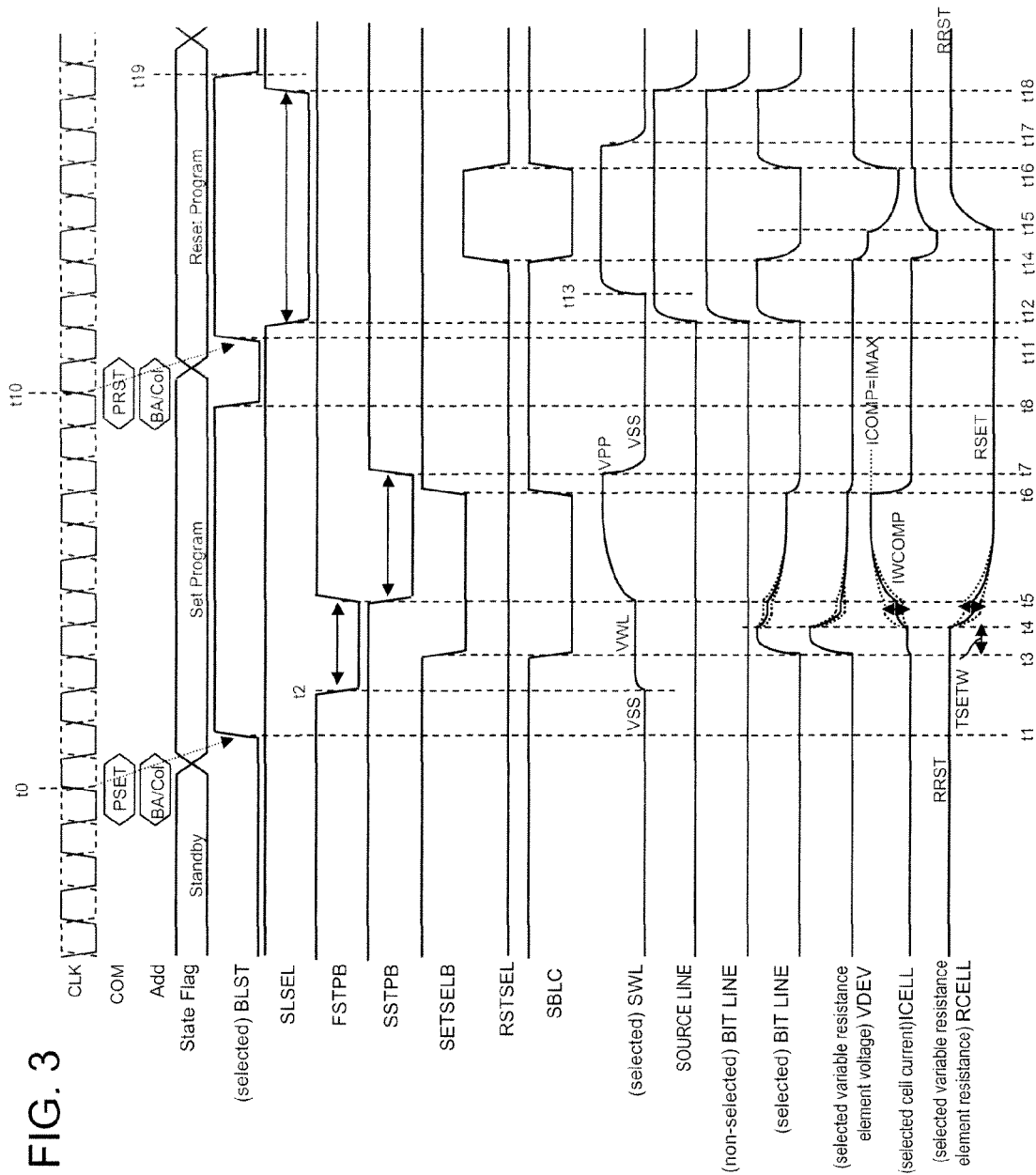
FIG. 3 is a waveform diagram showing the write operation of the exemplary embodiment 1.

FIG. 3 depicts a write operation waveform diagram for the exemplary embodiment 1. The operation for write will now be explained with reference to FIG. 3 as well as to FIG. 1.

In FIG. 3, SET write is performed during the former half and RESET write is performed during the latter half. It is assumed that the initial state is the standby state when no command is executed. In this state, the bit line selection signal BLST is LOW. Hence, the bit line 31 is disconnected from the common bit line 75 and connected to the source line 33. Since the source line control signal SLSEL is HIGH, the source line 33 and the bit line 31 are brought LOW (VSS level). The control signals SLSEL, SSTPB and FSTPB of the word line power supply circuit unit 52 are all HIGH so that the (sub) word lines 32 are fixed at LOW (VSS level). The switch signals SETSELB and RSTSEL of the write amplifier 60 are HIGH and LOW, respectively. The SET driver 61 and the RESET selector 67 of the write amplifier 60 are disconnected from the common bit line 75 such that no current flows between the write amplifier 60 and the common bit line 75. The control signal SBLC is High and the common bit line 75 is connected to the source line 33. Similarly to the source line 33, the common bit line 75 is fixed at LOW level.

Hence, in the initial state, no current flows through any cell 40, so that the voltage across the terminals of each variable resistance element 41 is 0V, with the memory cell current ICELL being 0. It is assumed that, in the initial state, the resistance value of the variable resistance element 41 of the memory cell being programmed is RRST, that is, in the high resistance state.

A PSET command is entered from outside at a timing t0 in this state in synchronism with a system clock CLK. The PSET command sets the resistance of the selected memory cell to a low resistance state. The bank and the column address are also entered at this time simultaneously. As for the row address, it is assumed to have already been entered. When the PSET command has been entered, the semiconductor device 10 releases the standby state to enter into SET write.

At a timing t1, the bit line selection signal BLST of the selected bit line 31 is brought HIGH to disconnect the bit line 31 selected from the source line 33 to connect the bit line to the common bit line 75.

At a timing t2, the control signal FSTPB that activates the third word line power supply circuit 55 is brought LOW to deliver to the sub-word driver 51 the voltage VWL as supply power. It is noted that the voltage VWL is a voltage intermediate between the low level voltage VSS and the high level voltage VPP. In response thereto, the sub-word driver 51 raises the selected word line from the low level VSS to the intermediate voltage VWL.

At a timing t3, the control signal SBLC is brought LOW to disconnect the common bit line 75 from the source line 33. The switch control signal SETSELB of the SET driver 61 of the write amplifier 60 is brought LOW to allow the current to flow from the constant current source transistor 62 of the SET driver 61 to the common bit line 75. At this time, the bit line 31, already selected by the bit line selection circuit 70, has been connected to the common bit line 75. Hence, the current flows to the source line 33 via the selected memory cell 40. At this time, the variable resistance element 41 of the selected memory cell 40 is in the RRST (high resistance) state. Hence, the voltage VDEV across the terminals of the variable resistance element 41 of the selected memory cell 40 is of a larger value so that the voltage of the selected bit line rises to a fourth voltage. In this state, the constant current source transistor 62 of the SET driver 61 operates in a non-saturated region, and hence just a small amount of ent flows through the selected memory cell 40. The resistance value of the selected variable resistance element 41 is maintained in the RRST (high resistance) state.

At a timing t4 when the large voltage VDEV has continued to be applied across the terminals of the variable resistance element 41 for a predetermined time TSETW, the resistance value of the variable resistance element 41 commences to change to low resistance. The time TSETW since application of the voltage VDEV across the terminals of the variable resistance element 41 until the resistance value commences to change to the low resistance depends on device characteristics. The time TSETW may thus be instant or the time of a certain length, as shown in FIG. 3.

When the resistance value of the variable resistance element 41 commences to change to a low value at timing t4, the selected bit line voltage is concomitantly decreased. The current ICELL flowing from the selected bit line to the selected cell also increases. However, since the intermediate voltage VWL is applied at this stage to the gate electrode of the cell transistor 42, the on-resistance of the cell transistor 42 is relatively high (second impedance). Hence, if the current ICELL flowing through the selected cell is increased, the source-drain potential difference of the cell transistor increases, so that the resistance value of the variable resistance element is changed to a lower value (third resistance value). Even if the voltage VDEV across the terminals of the variable resistance element is decreased, the voltage of the selected bit line is not decreased appreciably. The maximum value of the write current at this time is limited to IWCOMP. The potential VWL is adjusted so that the IWCOMP will be sufficiently low as compared to the current limiting value (ICOMP) by the SET driver 61. Attention ought to be focused at this time so that the maximum value of the variations of IWCOMP ascribable to variations in the characteristic of the cell transistor will be less than ICOMP.

At a timing t5, the control signal FSTPB of the word line power supply circuit unit 52 is set at a HIGH level. The third word line power supply circuit 55 is controlled to be turned off, and the control signal SSTPB is brought LOW to control the second word line power supply circuit 54 to be turned on. This causes the power supply voltage delivered from the word line power supply circuit unit 52 to the sub-word driver 51 to rise from the intermediate voltage level VWL to the voltage VPP. The voltage at the selected (sub)word line SWL also commences to rise from the intermediate voltage level VWL to the voltage VPP. The rise rate (slue rate) is to be low to suppress transient current (the first slue rate=small). This may be by adjusting the size W of the transistor of the second word line power supply circuit 54. As the voltage at the selected (sub)word line SWL rises gradually from VWL to the voltage VPP, the on-resistance of the cell transistor 42 decreases gradually. In short, the impedance of the cell transistor 42 transitions to the first impedance lower than the second impedance. With decrease in the on-resistance of the cell transistor 42, the selected cell current ICELL increases gradually. As the selected cell current ICELL increases further, the resistance value RCELL of the variable resistance element 41 gradually decreases. However, if the preset constant current value ICOMP of the constant current source transistor 62 of the write amplifier 60 is reached, the constant current source transistor 62 is saturated so that the selected cell current ICELL ceases to increase further. This maximum current value ICOMP determines the preset constant resistance value in the SET (low resistance) state of the variable resistance element 41.

The time as from timing t3 until timing t5 is set at an optimum time in consideration of variations in time TSETW, which depend on device characteristics.

At a timing t6, the switch control signal SETSELB of the SET driver 61 is brought HIGH to disconnect the SET driver 61 from the common bit line 75. The control signal SBLC is brought HIGH to connect the common bit line 75 to the source line 33. The selected cell current then ceases to flow and the voltage VDEV across the terminals of the variable resistance element 41 is zero. The voltage at the selected bit line decreases to the VSS level.

At a timing t7, the control signal SSTPB of the word line power supply circuit unit 52 is brought HIGH to control the second word line power supply circuit 54 to be turned off. The voltage on the sub-word line SWL is lowered by the address decoder 58 to the VSS level.

At a timing t8, the control signal BLST of the selected bit line 31 is brought LOW to disconnect the selected bit line 31 from the common bit line 75 for connection to the source line 33. This terminates the sequence of operations for SET write of setting the resistance of the selected memory cell by the PSET command.

At a timing t10, a PRST command, as a new command, is applied from outside in synchronism with a system clock CLK. The PRST command is a RESET write command to set the resistance of the selected memory cell from the low resistance state to the high resistance state. At this time, the bank and the column address are entered simultaneously.

At a timing t11, the bit line selection signal BLST of the selected bit line 31 is brought HIGH to disconnect the selected bit line 31 from the source line 33 for connection to the common bit line 75.

At a timing t12, the control signal SLSEL is brought LOW to raise the source line voltage to a high-level voltage VRST. It is because the current is to flow in RESET write in a reverse direction to that in SET write, that is, from the source line 33 to the write amplifier 60. The non-selected bit lines are also connected to the source line 33 and hence are raised to the same potential. Note that the control signal SBLC is maintained at HIGH level, the source line 33 and the common bit line 75 are connected to each other by the source line common bit line connection switch 76, such that the common bit line 75 and the selected bit line connected to the common bit line 75 are raised to the same potential as that on the source line 33. Also, when the control signal SLSEL is brought LOW, the first word line power supply circuit 53 of the word line power supply circuit unit 52 is activated to deliver the high-level voltage VPP as supply power to the sub-word driver 51.

At a timing t13, the voltage on the selected sub-word line SWL is raised from the low level voltage VSS to the VPP level by the signal from the address decoder 58. Note that the first word line power supply circuit 53 uses a transistor with a larger channel width W so that the rise rate of the selected sub-word line SWL is high. In short, the slue rate of the selected sub-word line SWL at the reset time (second slue rate) is higher than the slue rate of the selected sub-word line SWL at the set time (first slue rate). With this second slue rate, the time of the reset program cycle, controlling the source line and the total of the bit lines, may be suppressed from increasing.

At a timing t14, the control signal SBLC is brought LOW to disconnect the common bit line 75 from the source line 33. On the other hand, the control signal RSTSEL is brought HIGH. The RESET selector 67 of the write amplifier 60 causes the common bit line 75 to be lowered to the LOW level (VSS level). A preset current then flows from the source line 33 to the RESET selector 67 of the write amplifier 60 via the variable resistance element 41 of the selected memory cell 40 and the selected bit line. In addition, a negative potential VDEV is produced across the terminals of the variable resistance element 41 if the terminal of the element connected to the source or the drain of the selected transistor 42 is to be a reference.

By allowing the preset current to flow through the selected variable resistance element 41, the element 41 commences transitioning from the RSET (low resistance) state to the RRST (high resistance) state at a timing 115 after a preset time as from timing t14 which depends on device characteristics. With rise in the resistance value of the selected variable resistance element, the absolute value of the current ICELL flowing in the reverse direction through the selected cell decreases. With decrease in the ICELL, the potential on the selected bit line gradually approaches to VSS.

At a timing t16, the control signal RSTSEL is brought LOW. With the control signal RSTSEL thus brought LOW, the RESET selector 67 of the write amplifier 60 disconnects the common bit line 75 from the write amplifier 60. On the other hand, the control signal SBLC is brought HIGH to connect the common bit line 75 to the source line 33. The current ICELL then ceases to flow through the selected cell. The voltage on the selected bit line becomes HIGH and at a value substantially equal to that on the source line.

At a timing t17, the selected sub-word line SWL is brought LOW by a signal from the address decoder 58.

At a timing t18, the control signal SLSEL is brought HIGH and the source line voltage is brought back to LOW. With the source line voltage thus brought back to LOW, the voltage on the non-selected bit line is also LOW.

At a timing t19, the sequence of processing of RESET write is terminated. It is noted that this sequence of operations consists in bringing the bit line selection signal BLST of the selected bit line 31 LOW to disconnect the selected bit line 31 from the common bit line 75 to connect it to the source line 33 to set the resistance of the memory cell selected by the PRST command input to a high resistance state.

In the exemplary embodiment 1, described above, acute variations on the selected bit line may be prohibited in SET write of changing the resistance state of the variable resistance element from the high resistance state (PRST) to the low resistance state (RSET). That is, the voltage on the selected word line is moderately changed from the non-selection voltage level to the selection voltage level, and data write is performed during the time the voltage on the selected word line transitions from the non-selection level to the selection level. To elucidate the technical meaning in further detail, a Comparative Example will now be explained.

Figure 5:
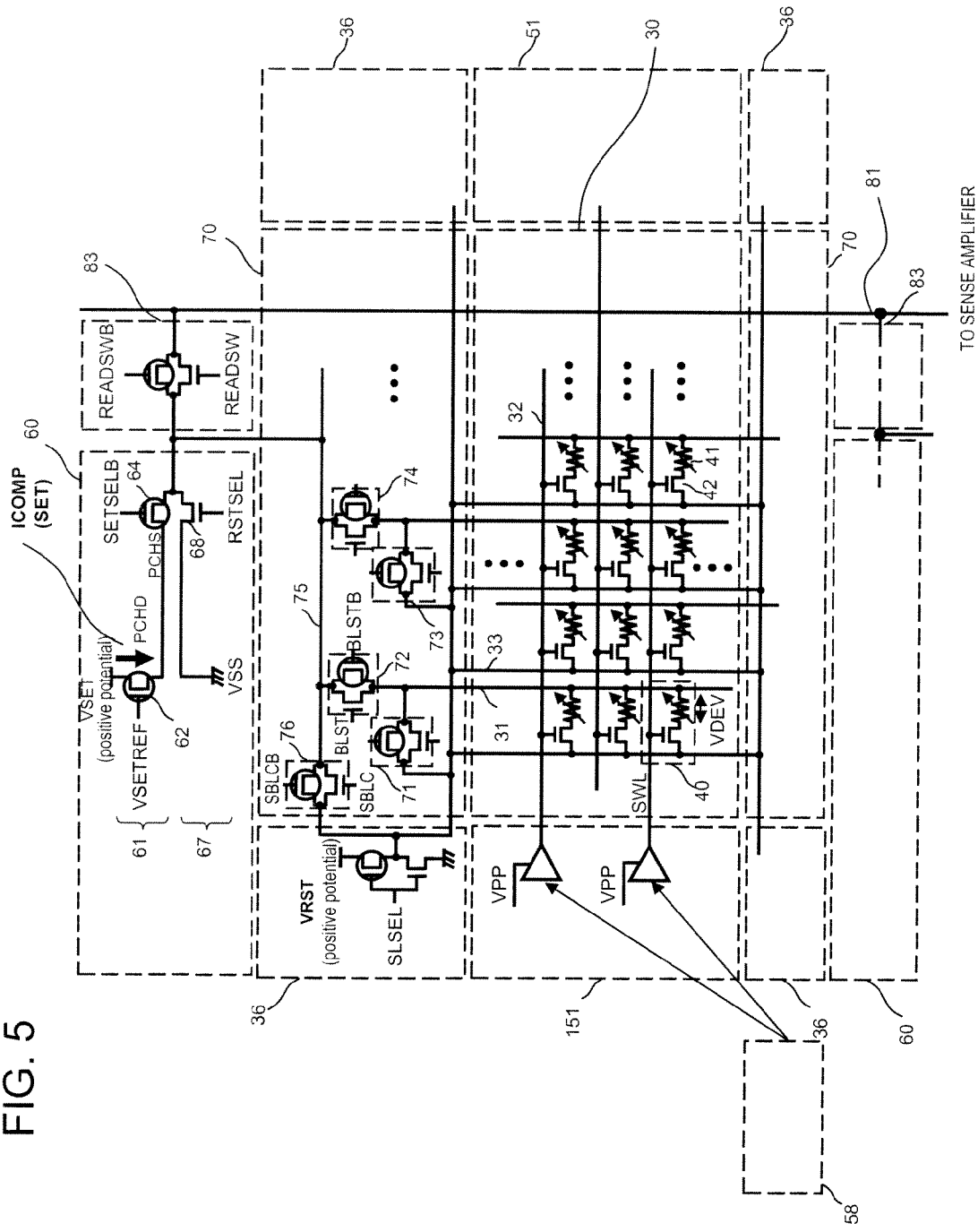
FIG. 5 is a circuit block diagram of a memory cell array and its periphery in a resistive switching memory of Comparative Example 1.

FIG. 5 depicts a circuit block diagram of a memory cell array with its periphery in a variable resistance memory or resistive switching memory according to a Comparative Example 1. In FIG. 5, the parts which are approximately equal to those of FIG. 1 of the exemplary embodiment 1 are depicted by the same reference numerals and redundant explanation is dispensed with. In the Comparative Example 1 shown in FIG. 5, the word line power supply circuit unit 52 is not provided and, to activate the sub-word driver 151, supply power is received at all times from the power supply VPP. Otherwise, FIG. 5 is approximately the same as FIG. 1 showing the exemplary embodiment 1.

Figure 6:
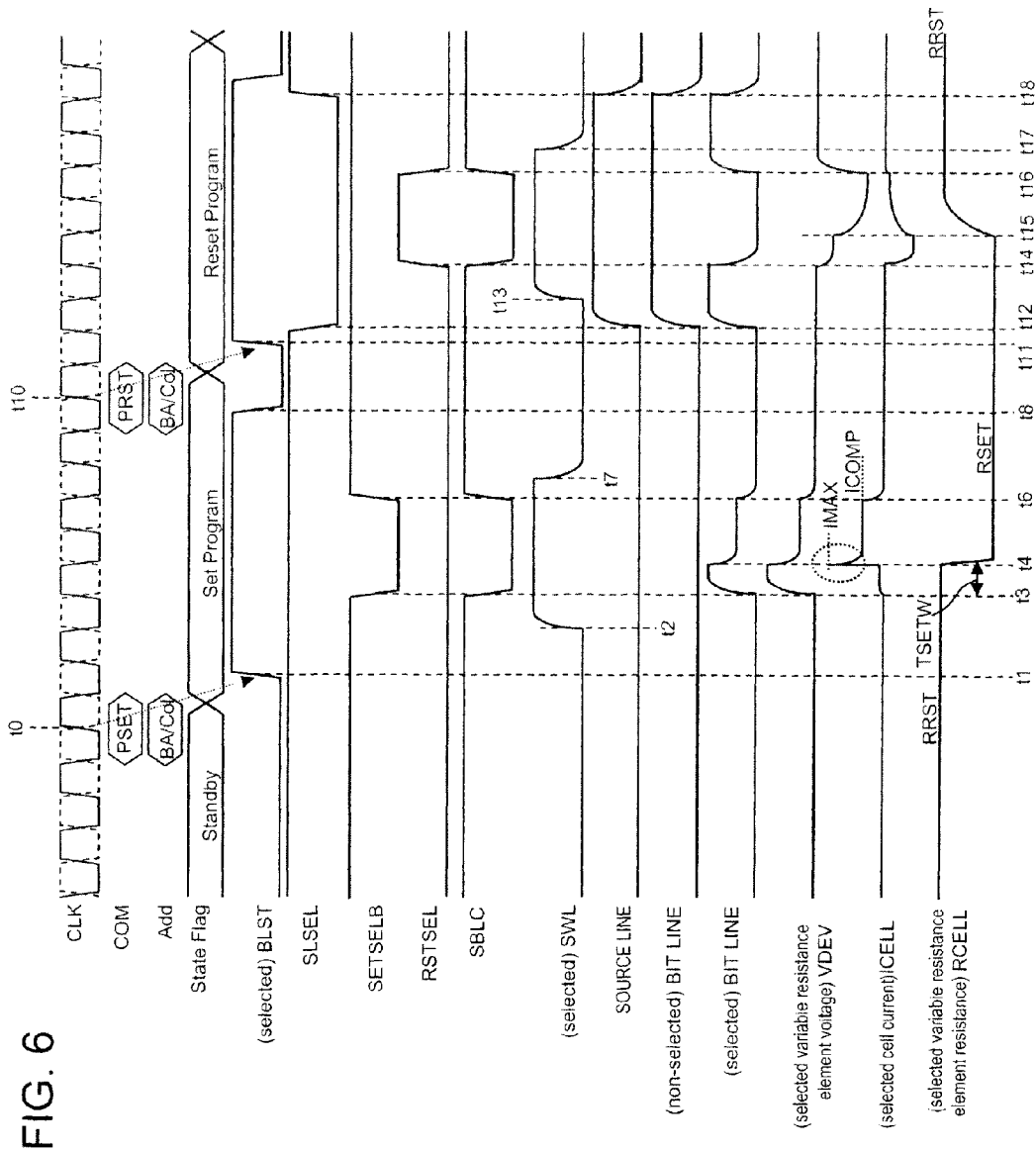
FIG. 6 is a waveform diagram showing the write operation in the resistive switching memory of Comparative Example 1.

FIG. 6 depicts a waveform diagram for a WRITE operation by the variable resistance memory or resistive switching memory of Comparative Example 1. The following explanation is only for those portions of the circuit where the waveform differs from that of the exemplary embodiment 1 of FIG. 3. It is noted that the latter half of FIG. 6 is the same in waveform as the corresponding latter half of the waveform diagram of the exemplary embodiment 1 shown in FIG. 3 so that redundant explanation is dispended with.

The SET operation in will be explained only insofar as those portions of the waveform different from those of the exemplary embodiment of FIG. 3 are concerned. The operation until timing t1 is the same as that in FIG. 3. At a timing t2, the selected sub-word line is raised to a voltage VPP based on a signal from the address decoder 58. Hence, the on-resistance of the cell transistor 42 is set at a sufficiently low value.

At a timing t3, the switch control signal SETSELB is brought LOW to allow the current ICELL to flow from the constant current source transistor 62 of the SET driver 61 to the selected cell. At this stage, the current ICELL in the selected cell is limited because the variable resistance element is in RRST (high resistance) state.

During SET write, changes in the resistance of the variable resistance element are made to take place at a timing t4 when time TSETW has elapsed since a timing t3 when the voltage is applied to the memory cell. The voltage division relationship, in terms of DC, of the impedance of the write circuit and the variable resistance element is changed appreciably by changes in the resistance. Hence, the bit line potential is lowered appreciably before and after the change in the voltage division relationship. The common bit line and the selected bit line possess large parasitic capacitance due to the capacitance of the diffusion layer of the transistors connected to each bit line, gate capacitance of the transistor in the on-state and to the interconnect capacitance. Thus, if the resistance change rate is high, electrical charges are released from the parasitic capacitance due to rapid changes the voltage division relationship, such that a transient current larger than ICOMP indicated by a maximum value (IMAX) flows through the selected memory cell, if only instantaneously. The SET driver 61 is at a location higher in potential than the common bit line 75, and hence is unable to suppress the transient current.

Thus, in the circuit of the Comparative Example 1, the transient current larger than the maximum current ICOMP, as set by the SET driver, flows through the selected memory cell. The RSET of the variable resistance element depends strongly on the maximum current flowing at the time of SET write and hence is determined by the transient current so that it may not be determined at an arbitrary value. Moreover, if the interconnect resistance of the bit line is of a high value, IMAX at the bit line distal end differs from that at the bit line proximal end, resulting in a distal-proximal end difference in cell characteristics.

Figure 7:
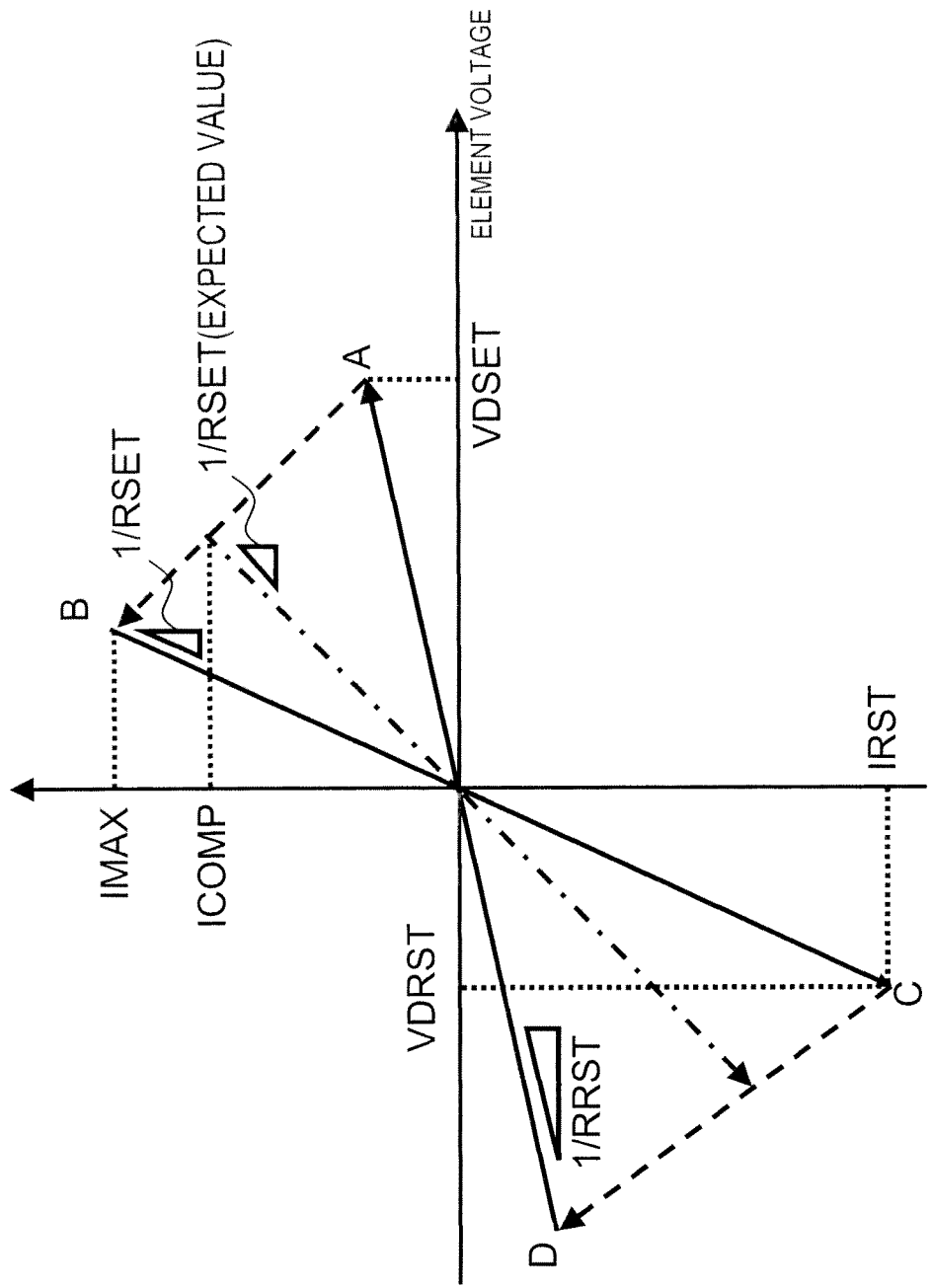
FIG. 7 is a graph for illustrating the problem inherent in Comparative Example 1.

FIG. 7 shows an operating point of the Comparative Example 1 on a graph of I-V characteristics of the variable resistance element. It is noted that the voltage is actually not swept and just an image of an operating point is shown. The RSET (resistance value of the low resistance) is determined by IMAX The Comparative Example 1 thus is beset with a problem that the maximum current may not be properly controlled by controlling ICOMP by the write amplifier alone.

Comparison of Comparative Example 1 and Exemplary Embodiment 1

Figure 11:
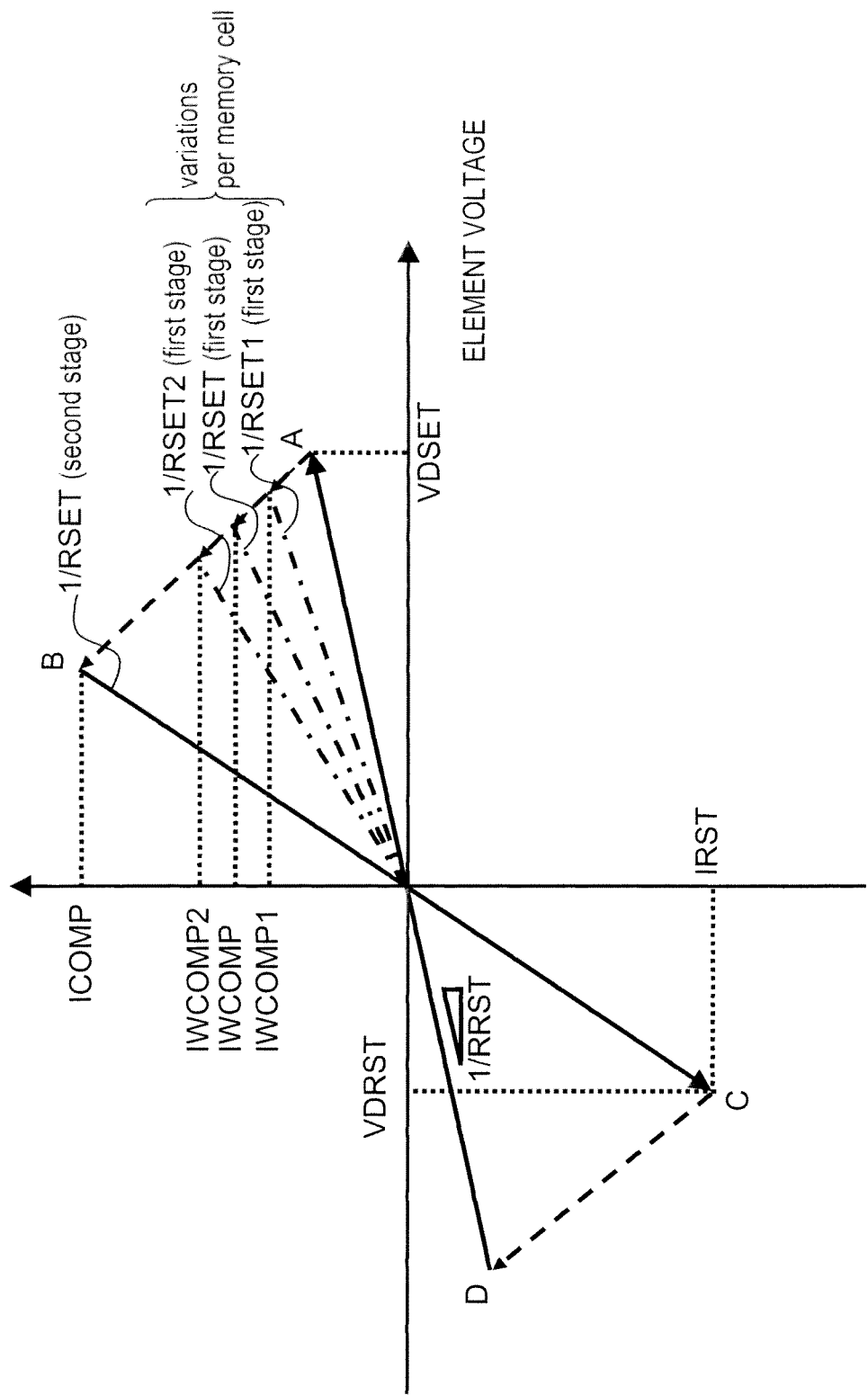
FIG. 11 is a graph for illustrating the meritorious effect of the exemplary embodiment 1.

FIG. 11 shows an operating point of the exemplary embodiment 1 on a graph of I-V characteristics of the variable resistance element. It is noted that the voltage is actually not swept and just an image of an operating point is shown. By two-stage word line potential control, the difference in ICOMP from one memory cell to another may be reduced to make the RSET difference from one memory cell to another smaller.

That is, during the timing t3-t5 period in FIG. 3, a first state of SET write is performed as the maximum value of the SET current is limited to IWCOMP by word line potential control (VWL). Then, as the word line potential is made to transition to VPP, a second stage of SET write is performed by the maximum current ICOMP determined by the SET driver 61 of the write amplifier 60.

By two-stage SET write, it is possible to prevent the maximum current exceeding ICOMP from flowing as the transient current, due to rapid resistance change in the variable resistance element, which is the case with the Comparative Example 1 shown in FIG. 7. That is, in the first-stage write, the resistance value of the variable resistance element is made to transition to an intermediate resistance between a high resistance and a low resistance. It is thus possible to reduce the width of change of the resistance value for the second stage write to prevent the large transient current from flowing due to rapid resistance change as is the case with the Comparative Example 1. This meritorious effect may be enhanced by controlling to make changes in the gate voltage in the second stage more moderate by, for example, reducing the transistor size in the second word line power supply circuit unit. Note that, by reducing the transistor size of the second word line power supply circuit unit to render changes in the second stage gate voltage moderate, current changes until the current value reaches ICOMP and hence bit line potential changes may further be relaxed to further reduce the transient current.

On the other hand, the maximum value of the SET current during the first stage tends to be varied with progress in the miniaturization of memory cell transistors. Specifically, the variations in VTH (gate threshold value voltage) of a transistor depend on the channel area, as stated in Non-Patent Documents 3 and 4. For example, the standard deviation ΔVTH of VTH fluctuations ascribable to variations in the impurity concentration in a depletion layer is represented by the [Equation 1]:

$$\Delta VTH \approx A \frac{T_{ox}}{\sqrt{LW}} \quad \text{[Equation 1]}$$

In the [Equation 1]. A denotes a constant determined by e.g., physical constants, L denotes a channel length, W denotes a channel width and Tox denotes thickness of a gate insulating film.

In a memory cell array miniaturized to a size of scores of nm, the channel area of a cell transistor is extremely small, and ΔVTH amounts to scores to hundreds of mV. On the other hand, Non-Patent Document 4 states that the effects on transistor characteristics not only of impurity concentrations but of processing of miniaturization, variations in the insulation film thicknesses or fluctuations in the carrier mobility increase with progress in miniaturization.

Due to these factors, the on-currents of cell transistors of miniaturized memory cells are varied from one memory cell to another, and hence the maximum value (IWCOMP) of the SET current of the first stage is varied from one memory cell to another. This tendency is more pronounced the smaller the current value used. It is because the ID sensitivity to VGS becomes higher the smaller the current value used.

However, in the exemplary embodiment 1, shown in FIG. 11, the maximum value ICOMP of the SET current of the second stage is controlled by the SET driver 61 of the write amplifier 60. It is thus possible to control the maximum current value ICOMP to high accuracy depending on the precision of the current of the SET driver 61.

(Measures Against TSETW Variations)

Note that TSETW in FIG. 3 is the time dependent on e.g., device characteristics, as set out above, such that it is necessary to control the timing as from timing t5 in consideration of time variations of TSETW. For this, the following alternatives may be used.

(1) Time Adjustment with the Use of a ROM by Test-Time Search

In part of cells of product chips or test chips, cell write tests are carried out under a test mode, using a wide variety of TSETW periods, such as to derive a TSETW period for which all cells, or almost all cells, as the case may be, undergo resistance changes, and which will be the smallest. The product chip is provided with a circuit to adjust the TSETW period by changing over ROM switches, such as metal fuses or laser fuses, using e.g., a delay circuit, to adjust the TSETW period, and optimum values derived are set therein. If, in a product chip, there is such cell(s) not correctly rewritten due to the short TSETW period, such cell(s) is replaced by another cell(s) (redundant memory cell(s)).

(2) Time Adjustment that Uses Feedback by a Reference Cell

There are separately provided one or more cells (reference cells) to decide on TSETW. These cell(s) are normally in reset states. In writing in main cells, operation is performed simultaneously in the reference cell(s). The potential of the bit line of the reference cell is monitored. The time directly after detection of the potential decrease on the bit line ascribable to resistance change of the reference cell or a time a preset period after such detection is to be the timing to shift to the next operation (such as timing t5 in FIG. 3). If a plurality of reference cells are used, the time after detection of potential changes in the total of the reference cells is to be the timing of the end of the TSETW period. For the detection, there may be a method of monitoring current changes in addition to methods of detecting the bit potential.

Exemplary Embodiment 2

Figure 12:
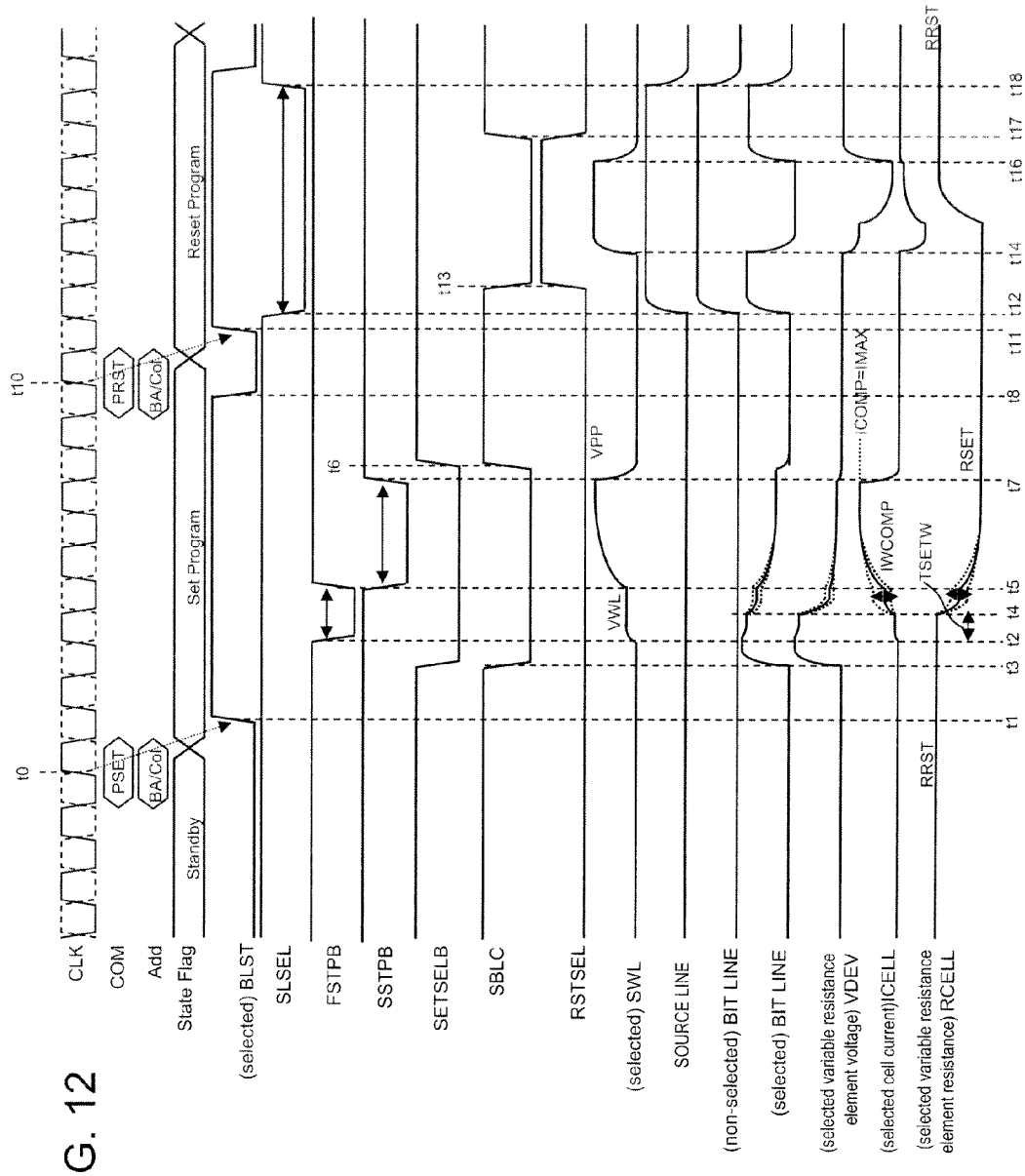
FIG. 12 is a waveform diagram showing the operation of the semiconductor device according to an exemplary embodiment 2.

In the exemplary embodiment 1, the selected sub-word line SWL is raised at timing t2, in SET write, and the switch control signal SETSELB of the SET driver 61 is then brought LOW at timing t3 to connect the SET driver 61 to the common bit line (FIG. 3). The timing that the SETSELB is brought LOW and the timing that the (selected) SWL is brought HIGH, that is, the timing of charging the selected bit line LBL and that of charging the selected sub-word line SWL, may be interchanged. For example, the selected bit line LBL may initially be charged at timing t3, and the selected sub-word line SWL may then be charged at a timing t2, as shown in FIG. 12. Suppose that, in case SET write has been performed in the cell in the SET (low resistance) state, the selected bit line LBL is initially charged. If, in such case, two-stage voltage rise of the selected sub-word line SWL is not used, there is fear that transient current flows through the selected cell due to voltage rise in SWL, thus further changing the resistance value of the selected cell towards the low resistance side. However, in the two-stage voltage rise, explained in the exemplary embodiment 1, the on-resistance of the cell transistor is high during the first stage, and hence expectation may be made to suppress the transient current. The timing control of the selected bit line LBL and the selected sub-word line SWL at SET write may be taken charge of by the command control circuit 20 shown in FIG. 2. Hence, the circuit configuration of the exemplary embodiment 2 differs simply in the control timing in the inside of the command control circuit 20 and, as for other details, the circuit configuration of the exemplary embodiment 1 shown in FIG. 1 may directly be used.

Exemplary Embodiment 3

Figure 13:
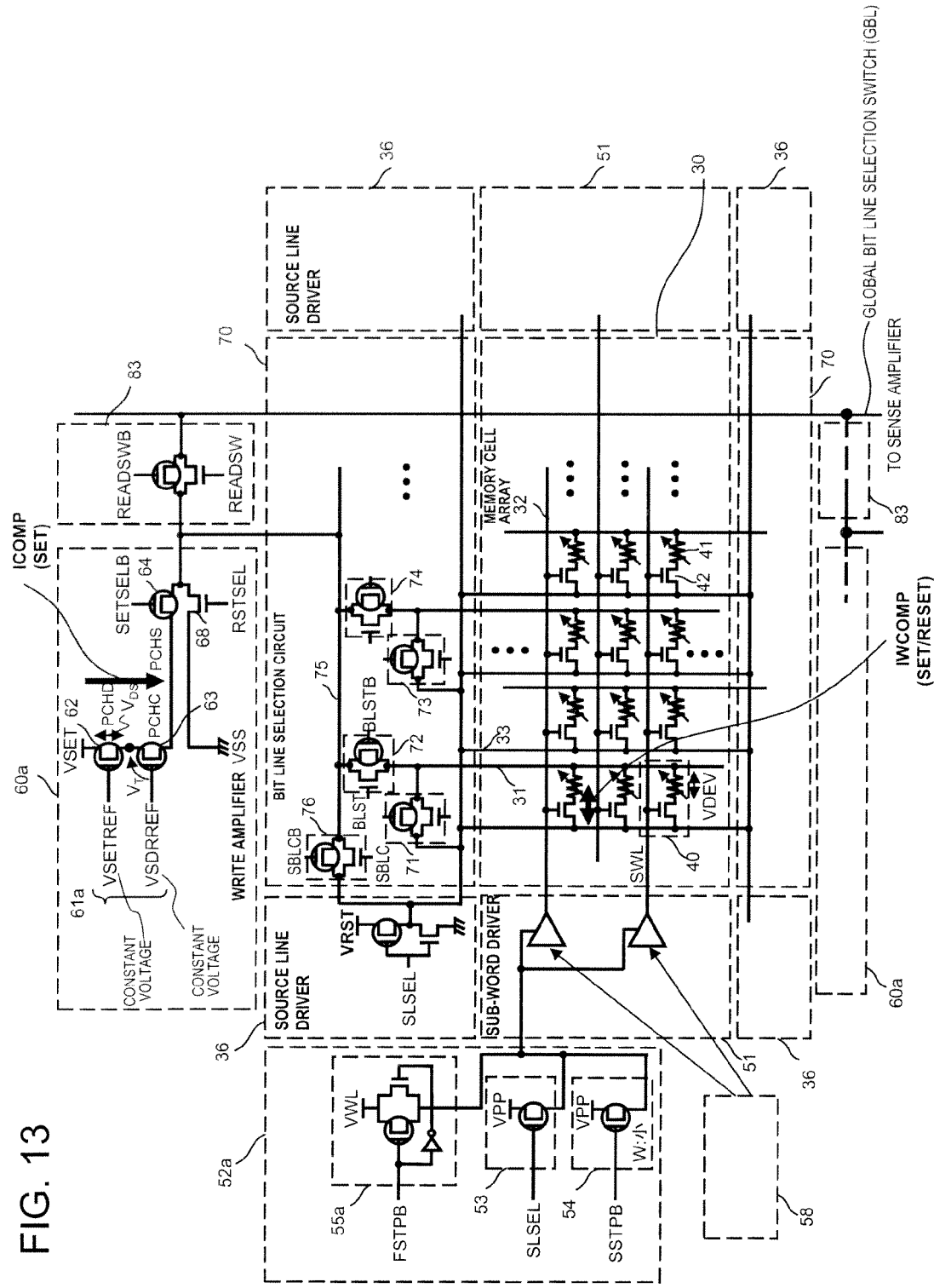
FIG. 13 is a circuit block diagram of a memory cell array and its periphery in a semiconductor device according to an exemplary embodiment 3.

FIG. 13 depicts a circuit block diagram showing a memory cell array with its periphery of a semiconductor device according to an exemplary embodiment 3. The circuit block diagram of FIG. 13 is similar to the circuit block diagram of the exemplary embodiment 1 of FIG. 1 except that the configuration of a write amplifier 60a and a third word line power supply circuit 55a differ from FIG. 1.

If, in the exemplary embodiment 1 shown in FIG. 1, the constant current source transistor 62 as a set driver is operating in a saturation region, the transistor 62 becomes constant current source the drain current of which depends only on the gate voltage (VGS). However, if the current setting value is large or VDS is small, the transistor may be operating in a non-saturation region. In the non-saturation region, the drain current depends not only on VGS but on VDS. Since VDS is varied depending on the resistance value of the variable resistance element 41, the constant current source transistor 62 is hardly capable of performing the role of a constant current source in the non-saturation region.

In light of above, a clamp transistor 63 may be connected in series with the constant current source transistor 62, a PMOS transistor, in the inside of a SET driver 61a, as shown in FIG. 13. The role of the clamp transistor 63 is to make VDS of the constant current source transistor 62 constant. A constant voltage VSDRREF is applied to the gate electrode of the clamp transistor 63. The drain potential of the constant current source transistor 62 is approximately equal to the sum of the constant voltage VSDRREF and the threshold value VT of the clamp transistor 63. As a result, the VDS of the constant current source transistor 62 is approximately a constant value (VSET−(VSDRREF+VT)) without dependency on the impedance of the load connected to the SET driver 61*a*. Hence, the SET driver 61*a* is capable of operating as a current source even at an operating point at which the constant current source transistor 62 is in a non-saturation region.

The word line power supply circuit unit 52 of FIG. 1 uses a P-type (PMOS) transistor to deliver the supply power (to select the potential). However, this is merely illustrative such that a CMOS switch or an N-type (NMOS) transistor may be used for selection. Although the CMOS switch is used for only a third word line power supply circuit 55*a* in FIG. 13, a CMOS switch or an N-type transistor may be used for other power supply circuits as well.

Exemplary Embodiment 4

Figure 14:
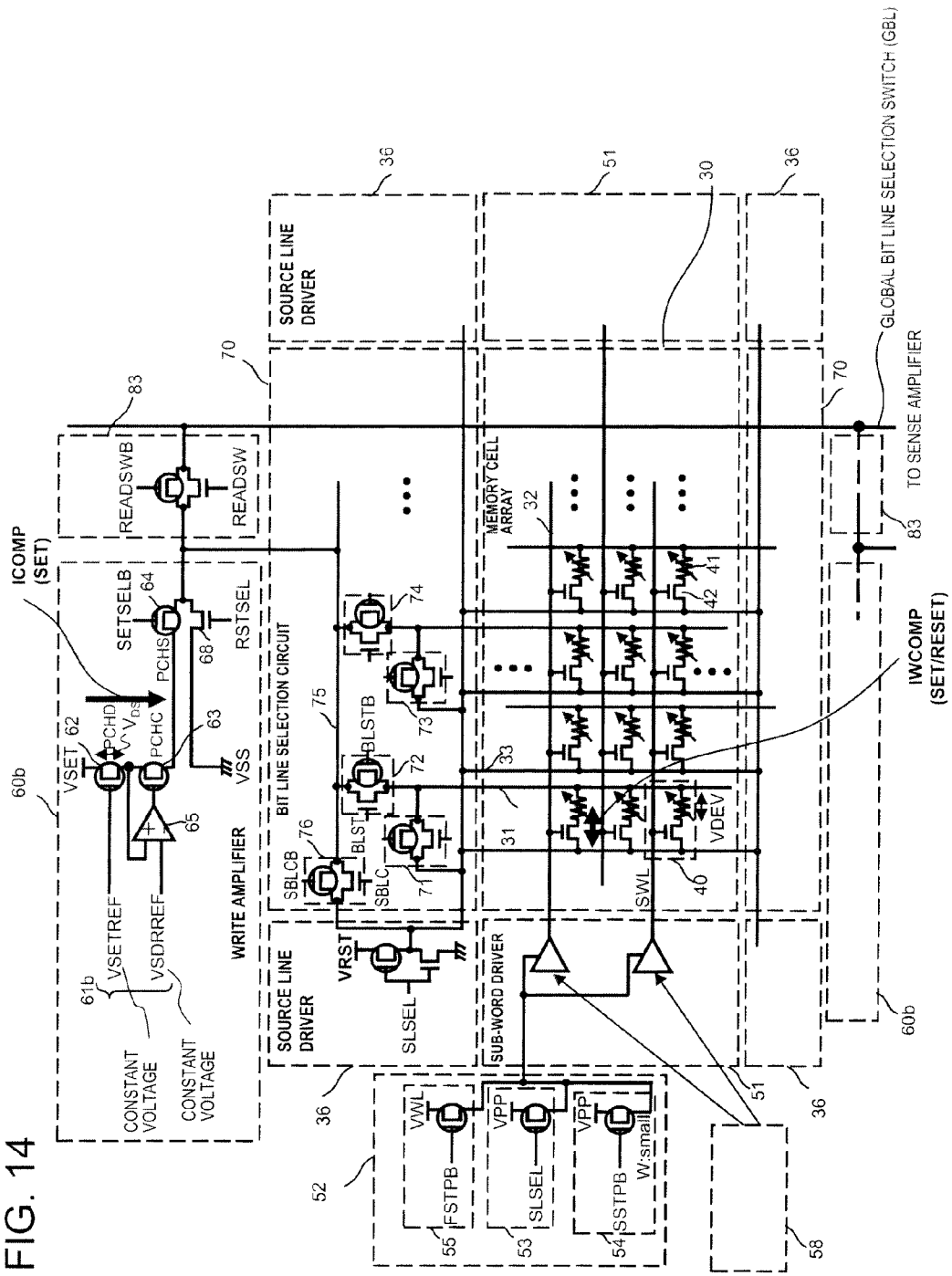
FIG. 14 is a circuit block diagram of a memory cell array and its periphery in a semiconductor device according to an exemplary embodiment 4.

FIG. 14 is a circuit block diagram showing a memory cell array with its periphery of a semiconductor device according to an exemplary embodiment 4. The circuit block diagram of FIG. 14 is similar to the circuit block diagram of the exemplary embodiment 1 of FIG. 1 except that the configuration of a write amplifier 60*b* differs from the write amplifier 60 of FIG. 1.

A SET driver 61*b* of the write amplifier 60*b* shown in FIG. 14 includes a differential amplifier 65 in addition to the SET driver 61*a* of the write amplifier 60*a* of the exemplary embodiment 3 shown in FIG. 13. With the use of the differential amplifier 65 in the SET driver 61*b*, the drain source voltage VDS of the constant current source transistor 62 is controlled to be constant. In this case, the layout area of the write amplifier 60*b* and the power consumption are increased, however, the drain voltage of the constant current source transistor 62 may be controlled to be equal to the voltage VSDRREF. In addition, the maximum current ICOMP during write may be controlled to high accuracy.

Exemplary Embodiment 5

Figure 15:
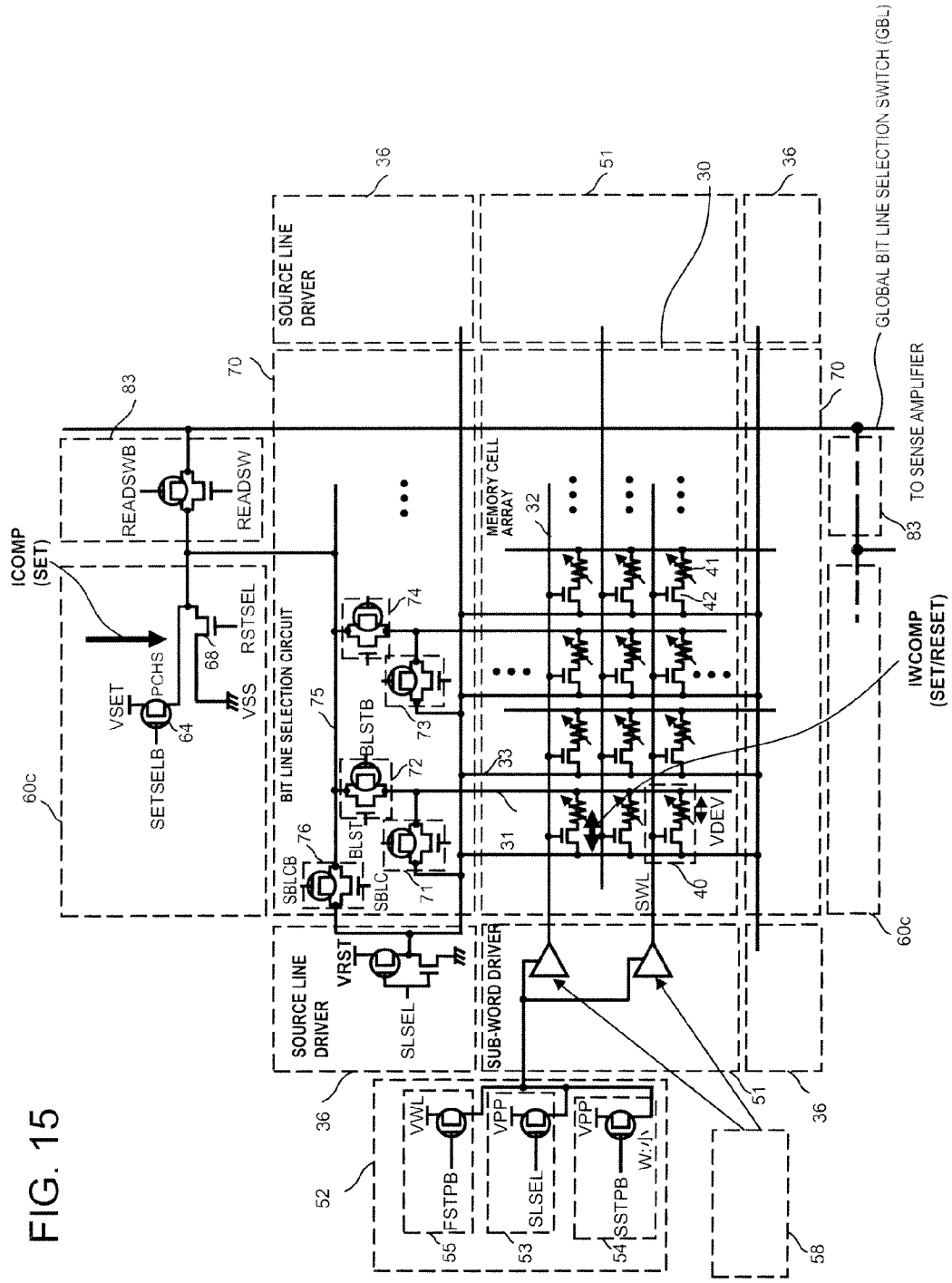
FIG. 15 is a circuit block diagram of a memory cell array and its periphery in a semiconductor device according to an exemplary embodiment 5.

If the cell resistance change characteristic at write is rather dull with respect to the write current, the SET driver may further be simplified as compared to the exemplary embodiment 1 shown in FIG. 1. In a write amplifier 60*c*, shown in FIG. 15, the constant current is generated by simply adjusting the size of the channel width W of the switch transistor 64 which is a write pulse selection switch. In this case, a constant voltage reference signal line VSETREF is not needed, and hence a power supply circuit may be dispensed with. Hence, the number of interconnects in the memory array may be reduced, while the layout area of the write amplifier may also be reduced.

Exemplary Embodiment 6

Figure 16:
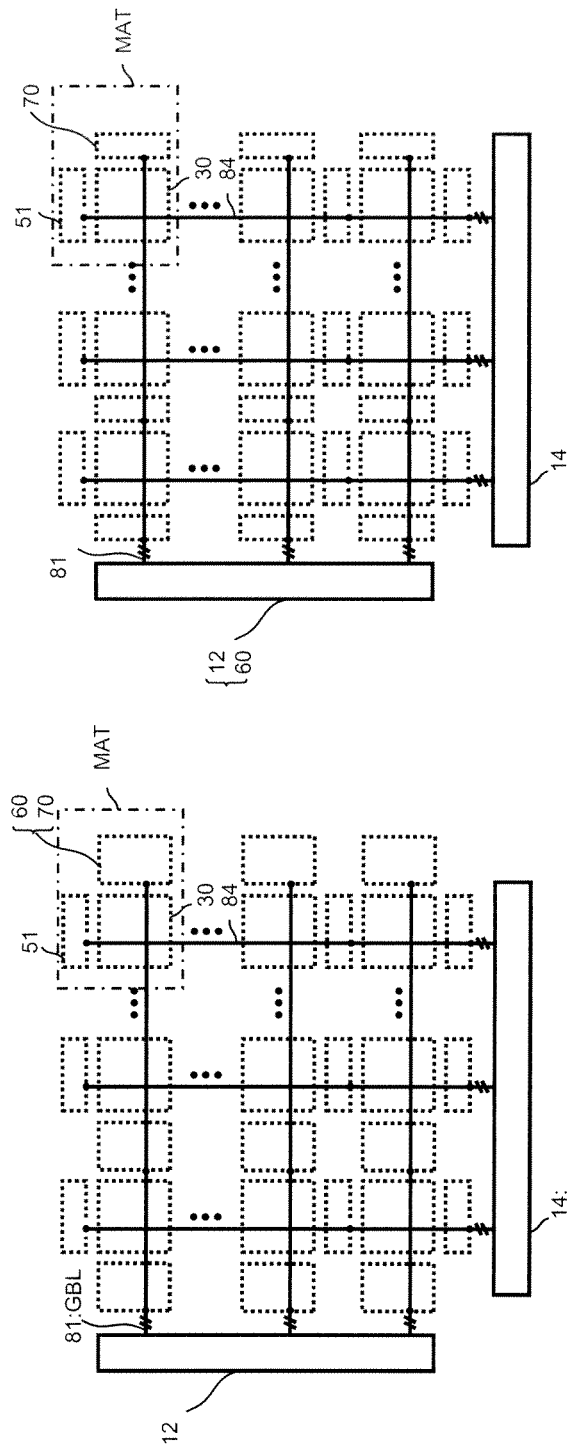
FIG. 16A, showing a memory array in its entirety, is a circuit diagram showing an exemplary embodiment 6.
FIG. 16B, also showing a memory array in its entirety, is a circuit diagram showing an exemplary embodiment 7.

Exemplary embodiments 6, 7 relate to arrangements within the memory array 11 (see FIG. 2). FIG. 16A shows a global arrangement within the memory array 11 of the exemplary embodiment 6. FIG. 16A shows a layout of a single MAT unit centered about a single memory cell array 30. Within the memory array 11, a sub-word driver 51, a write amplifier 60 and a bit line selection circuit 70 are arranged, in addition to a plurality of memory cell arrays 30, from one MAT to another (FIG. 16A). A plurality of global bit lines (GBL) 81 and a plurality of main word lines (MWL) 84 are arranged so as to intersect each other and so as to pass through the MATs. A sense amplifier 12 is connected to the global bit lines (GBL) 81 and shared by the memory cell arrays 30 connected to the same global bit line 81. Similarly, the main word lines 84 are connected to the X-decoder 14 and are shared by the memory cell arrays 30 arranged in the direction of the main word lines 84. In FIG. 16A, the write amplifier 60 is arranged for each memory cell array 30. However, the write amplifier 60 may be designed to be shared by two memory cell arrays 30 neighboring to each other in the direction of extension of the global bit lines 81.

Exemplary Embodiment 7

FIG. 16B shows a global arrangement within the memory array 11 according to an exemplary embodiment 7. In the exemplary embodiment 7, the write amplifier 60 is not arranged on the MAT basis. Specifically, a single write amplifier 60 is shared, as is the sense amplifier 12, by a plurality of MATs via global bit lines 81. That is, the SET driver 61 and the RESET selector 67, shown in FIG. 1, are arranged via global bit line 81 as well as via global bit line selection switch 83.

The memory array 11 may be arranged not only as shown in FIGS. 16A and 16B but in other ways. For example, the global bit line 81 and the sense amplifier 12 may be arranged for each MAT. Or, in a configuration where the write amplifier 60 is arranged for each MAT, as shown in FIG. 16A, a plurality of, for example, two, four or eight, write amplifiers may be arranged for each MAT in keeping with the number per MAT of the write cells programmed simultaneously.

Exemplary Embodiment 8

In FIG. 1, the word line power supply circuit unit 52 is arranged on the periphery of each memory cell array (MAT) 30. The word line power supply circuit unit 52 may, however, be arranged in, for example, the X-decoder 14. In exemplary embodiments 8, 9, the word line power supply circuit unit 52 is arranged in the X-decoder 14 so that the word line power supply circuit unit 52 has the decoding function.

Figure 17:
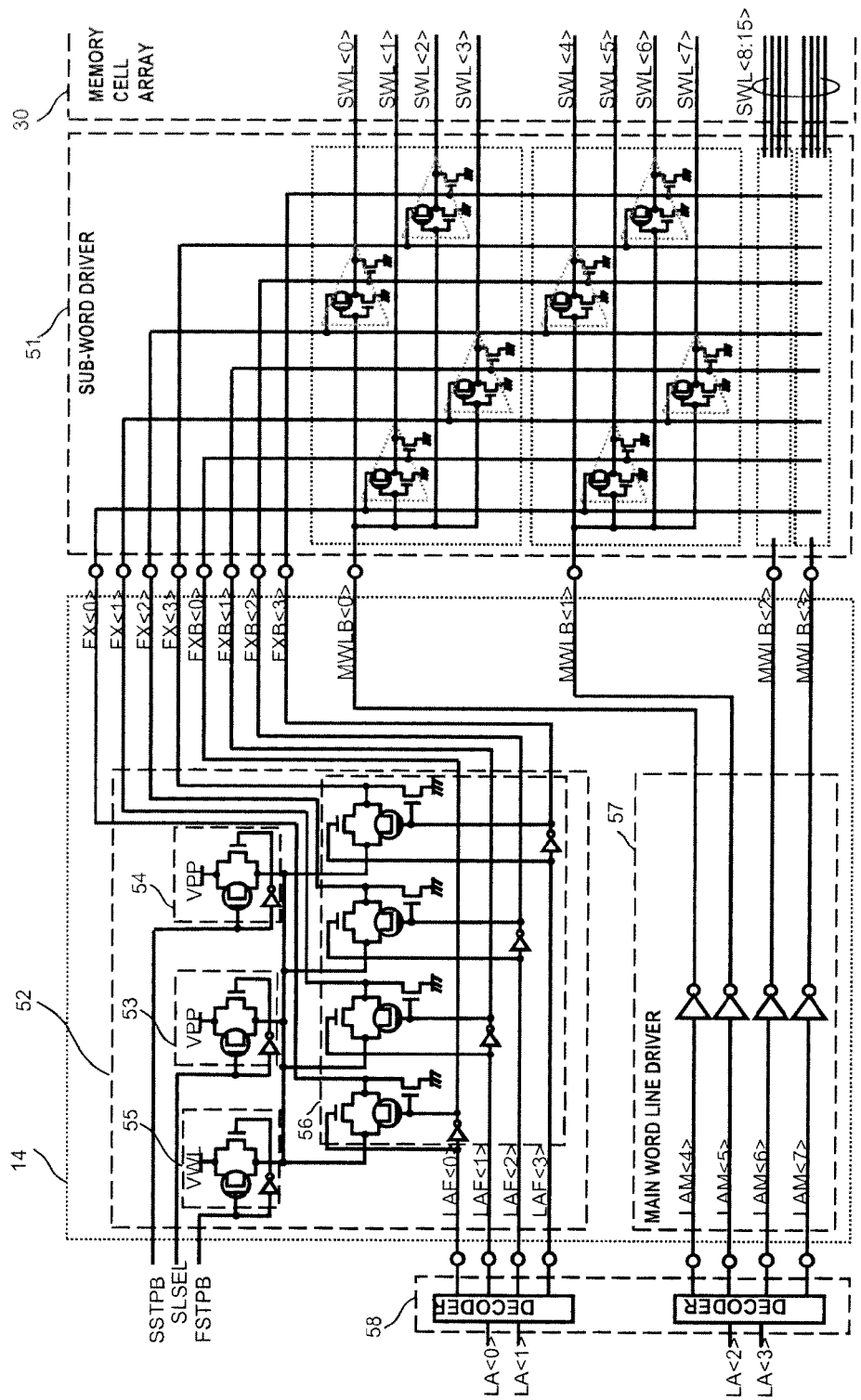
FIG. 17 is a circuit block diagram showing a word line decoder and a driver in an exemplary embodiment 8.

FIG. 17 depicts a circuit block diagram of the X-decoder 14 and the sub-word driver 51 according to the exemplary embodiment 8. In the drawing, LA<0> to LA<3> denote row addresses decoded by the address decoder 58. The so decoded addresses are entered to a selector 56 provided in the word line power supply circuit unit 52 and to a main word line driver 57 two-bits at a time. From the selector 56 of the word line power supply circuit unit 52, non-inverted and inverted signals of Fx lines are coupled to the sub-word driver 51. From the main word line driver 57, main word lines (MWL (B)) are coupled to the sub-word driver 51. In the sub-word driver 51, a single sub-word line SWL is selected based on these signals. In the exemplary embodiment 8, shown in FIG. 17, word line power supply circuits 53 to 55 are of the CMOS switch or CMIS switch configuration.

Exemplary Embodiment 9

Figure 18:
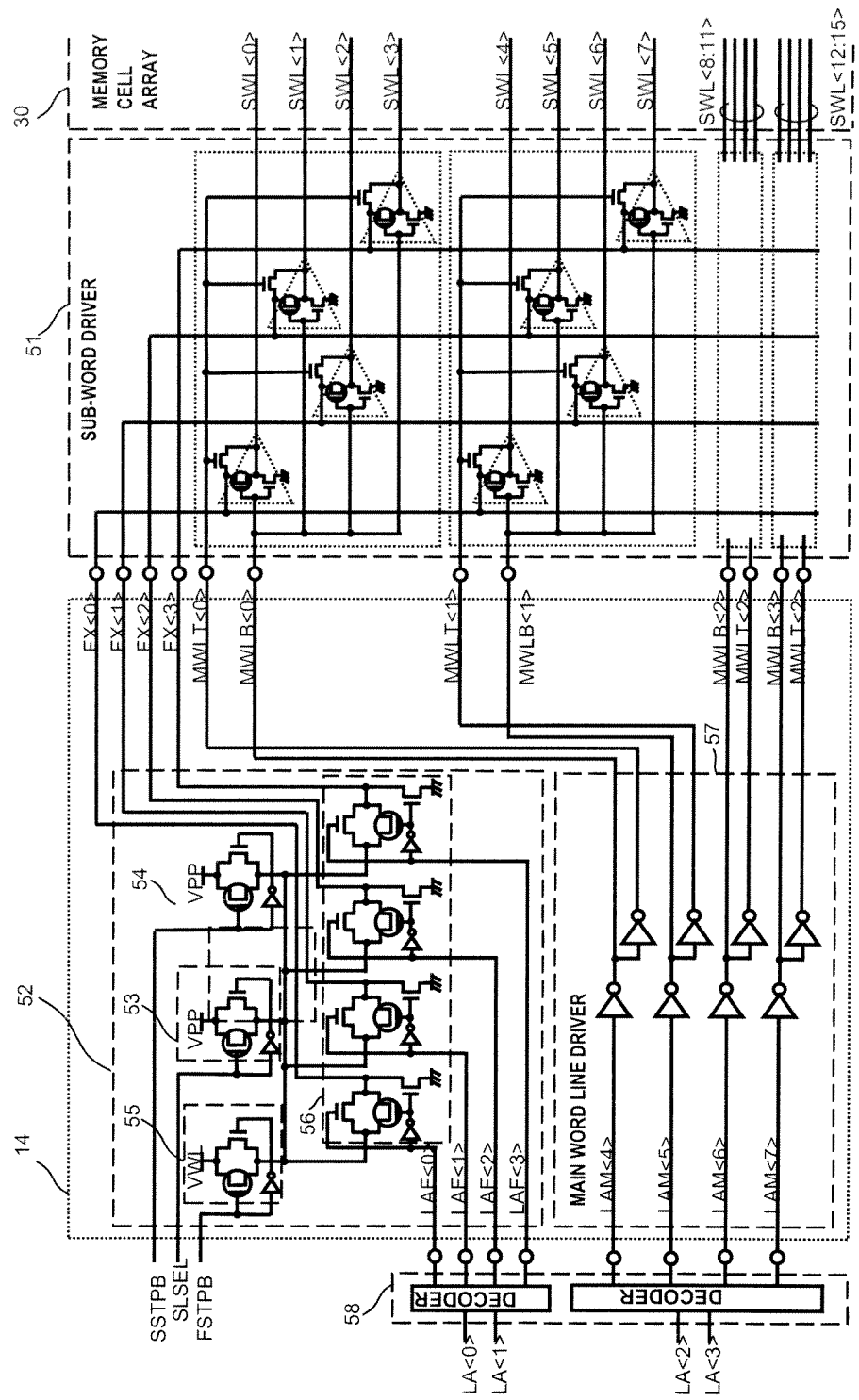
FIG. 18 is a circuit block diagram showing a word line decoder and a driver in an exemplary embodiment 9.

FIG. 18 shows a circuit block diagram showing an X-decoder 14 and a sub-word driver 51 according to an exemplary embodiment 9. In the exemplary embodiment 9, just the non-inverted signals of the Fx lines are coupled to the sub-word driver 51 from the selector 56 of the word line power supply circuit unit 52, and main word lines (MWL(B)) the inverted level and the main word lines (MWL(T)) of the non-inverted level are coupled from the main word driver 57 to the sub-word driver 51. The sub-word driver 51 selects a single sub-word line SWL based on these signals.

Exemplary Embodiment 10

Figure 19:
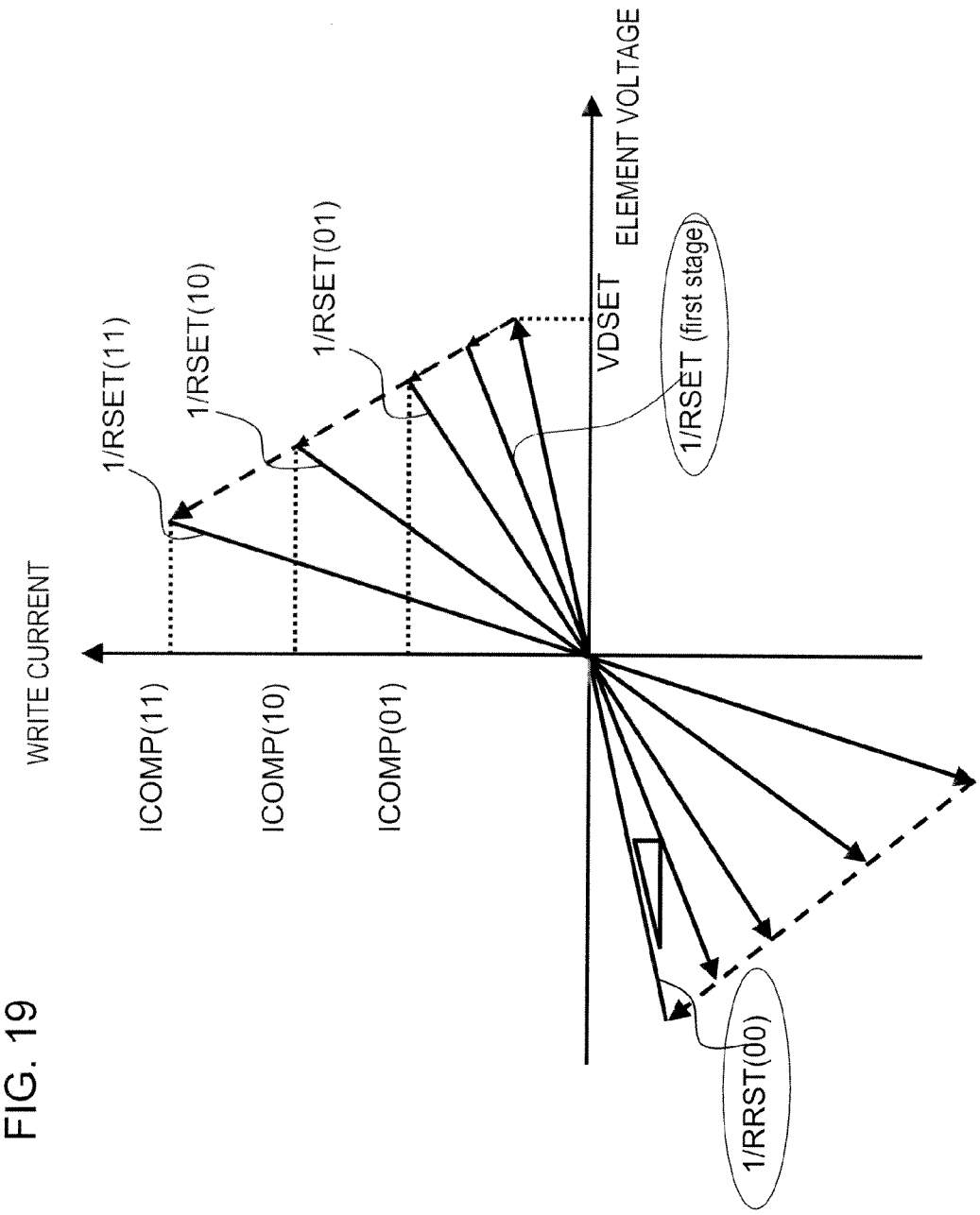
FIG. 19 is a graph showing I-V characteristics of a semiconductor device according to an exemplary embodiment 10.

In the exemplary embodiment 10, the value of the maximum current ICOMP in case of SET write for the variable resistance element is controlled to a plurality of levels to control the RSET state (low resistance state) to multiple values. FIG. 19 depicts a graph showing I-V characteristics of a variable resistance element in a semiconductor device of the exemplary embodiment 10. In SET write, the resistance value is initially set at an intermediate stage between RRST (high resistance) and RSET (low resistance). The maximum write current ICOMP is then set to a plurality of levels to implement a multi-valued memory. In the exemplary embodiment 10, the resistance value of the RSET (low resistance state) is controlled to three levels [RSET(01), RSET(10), RSET(11)]. These three levels plus the RRST (high resistance) value [RRST(00)] give a multi-valued memory (four-valued memory).

Figure 20:
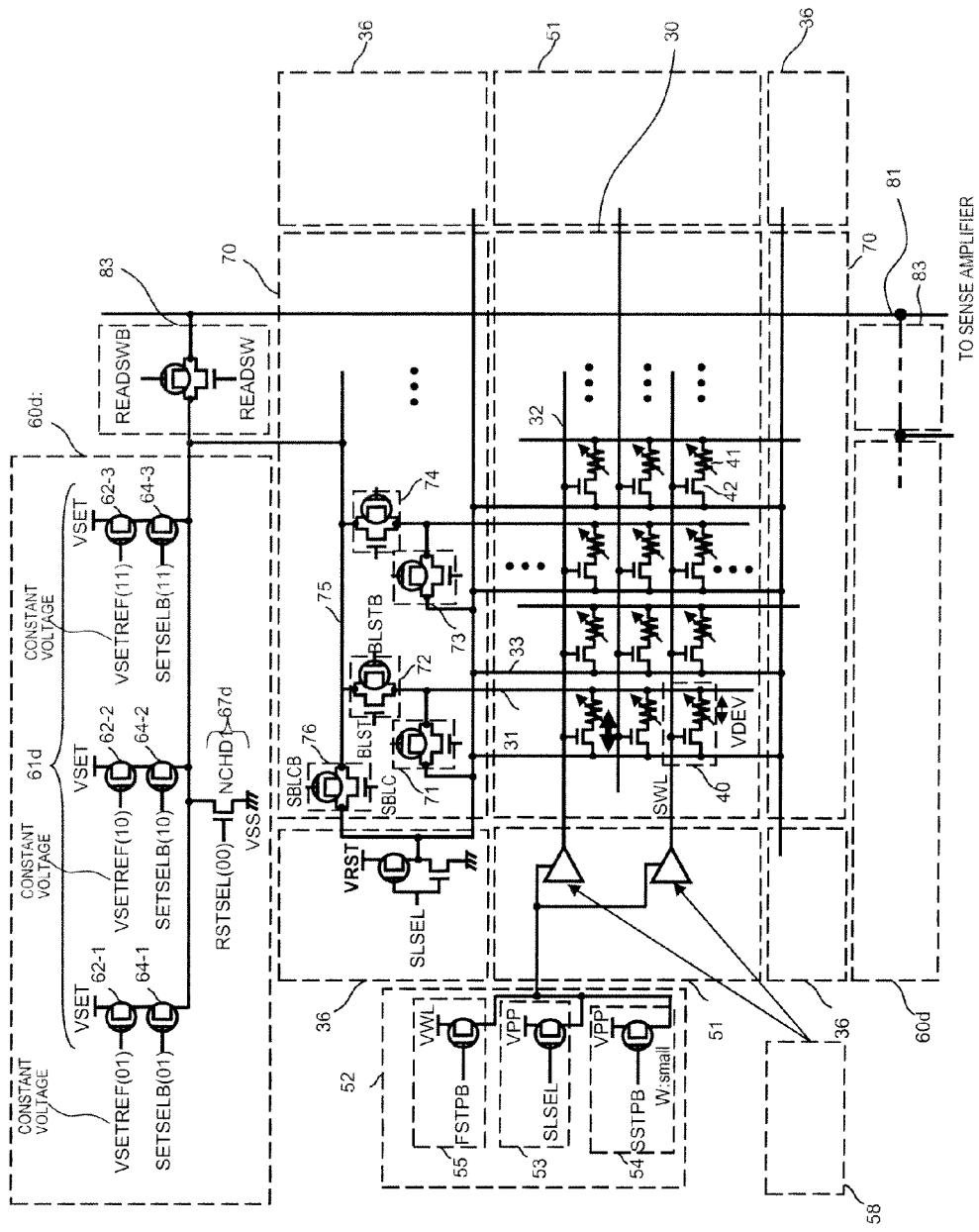
FIG. 20 is a circuit block diagram showing a memory cell array with its periphery of a semiconductor device according to the exemplary embodiment 10.

FIG. 20 depicts a circuit block diagram showing a memory cell array with its periphery of a semiconductor device according to the exemplary embodiment 10. The parts which are similar to those of the exemplary embodiment 1 shown in FIG. 1 are depicted by the same reference numerals and redundant description is omitted for simplicity.

The circuit block diagram of the exemplary embodiment 10, shown in FIG. 20, is the same as the circuit block diagram of the exemplary embodiment 1 shown in FIG. 1, except the circuit configuration of a SET driver 61d of a write amplifier 60d. The SET driver 61d includes three constant current source transistors 62-n and three switch transistors 64-n, forming three constant current source transistor—switch transistor pairs, where n denote integers from 1 to 3. Three different constant voltages VSETREF (01), VSETREF (10) and VSETREF (11) are applied to the gates of the constant current source transistors 62-n to provide for respective different values of the constant currents of the constant current source transistors 62-n. In the exemplary embodiment 10, the constant current source transistors 62-1 is set to the smallest setting current, the constant current source transistors 62-3 is set to the largest setting current and the constant current source transistors 62-2 is set to an intermediate value therebetween. To the gates of the switch transistors 64-n, respective different control signals SETSELB (01), SETSELB (10) and SETSELB (11) are coupled.

Figure 21:
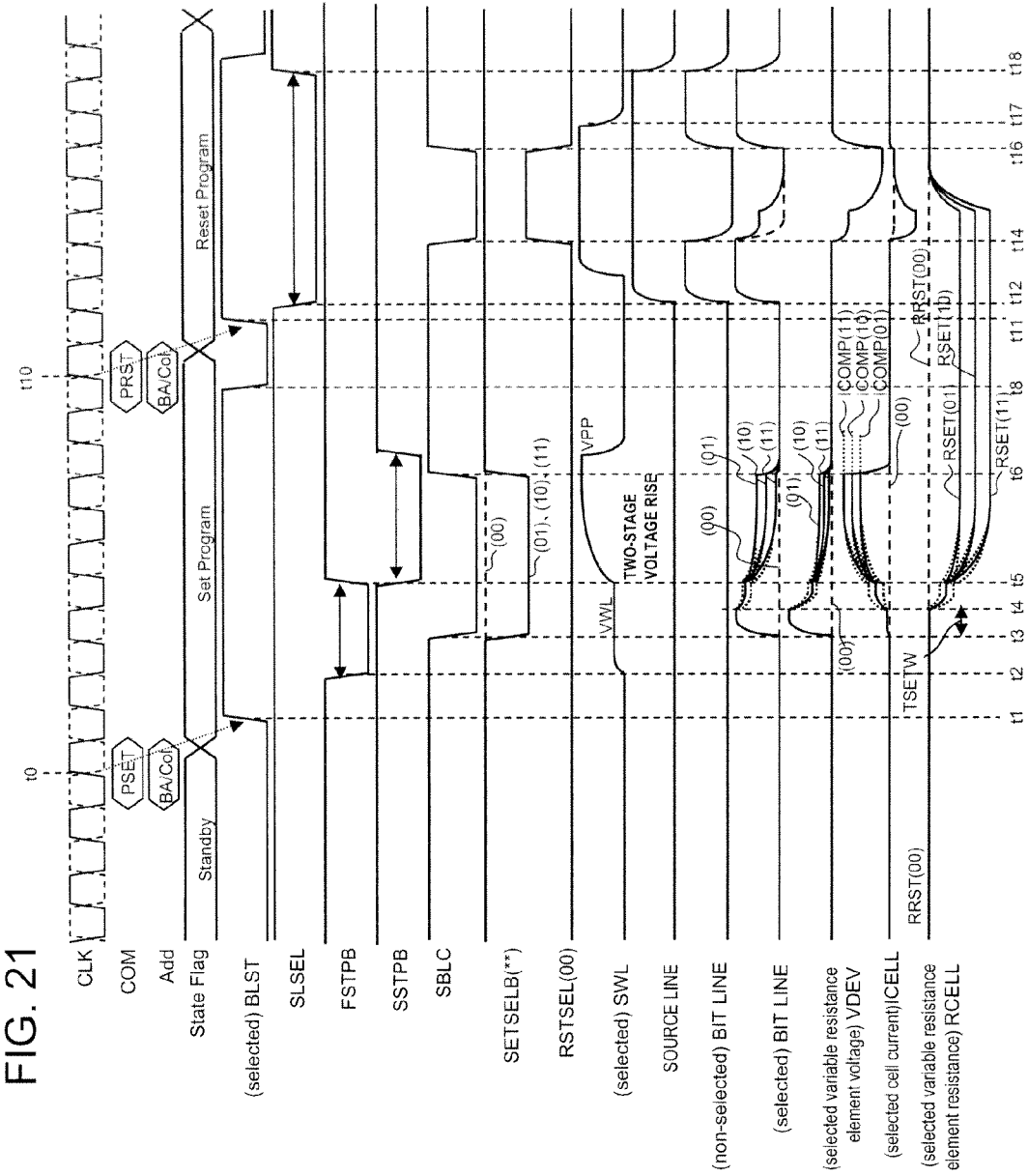
FIG. 21 is a waveform diagram for a write operation of the exemplary embodiment 10.

FIG. 21 depicts a waveform diagram for the write operation according to the exemplary embodiment 10. The write timings per se are the same as those of the exemplary embodiment 1 explained with reference to FIG. 3. Multi-valued write may be performed by writing multiple values by a PSET (program set) command in the cells reset by a PRST (program reset) command. If four-valued data of 00, 01, 10 and 11, for example, are to be written, the write operation may be performed as follows:

If any one of three values of 01, 10 and 11 is to be written by the PSET (program set) command, any one of SETSELB (01), SETSELB(10) and SETSELB(11) is selected (brought LOW).

In writing 00, write is masked by selecting none of the SETSELB signals (HIGH) to maintain the RESET state of the cells. This allows performing the write operation corresponding to FIG. 19.

In selecting or reading out four-valued data, the second bit is to be an address and the first bit is to be data to replace the memory by a bi-level memory.

Figure 22:
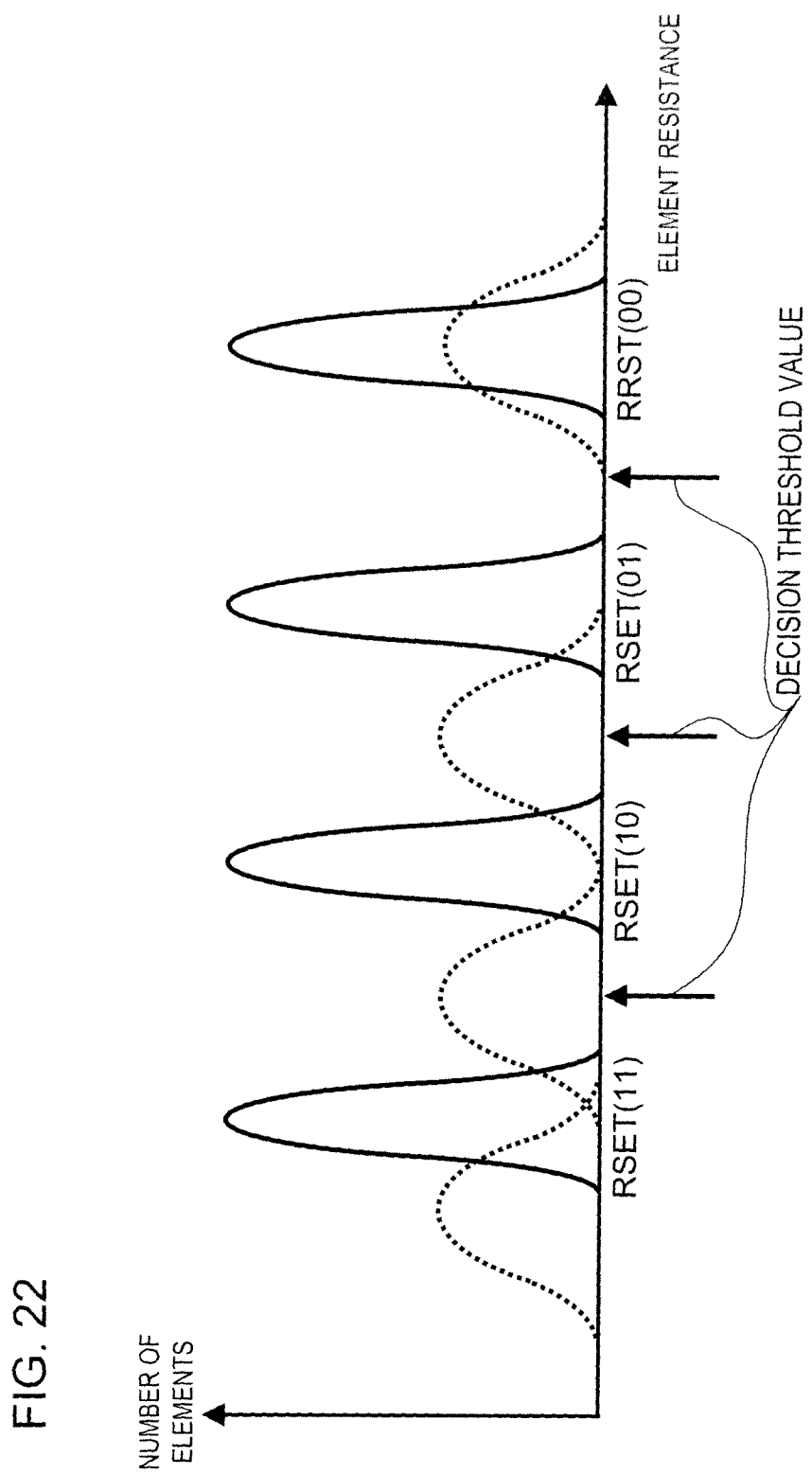
FIG. 22 is a graph for illustrating the meritorious effect of the exemplary embodiment 10.

FIG. 22 shows the beneficent result obtained with the exemplary embodiment 10. In FIG. 22, the abscissa denotes a resistance value of an element and the abscissa shows the number of elements (variations in the elements). The variations in the exemplary embodiment 10 are denoted by solid lines and those in a Comparative Example, in which two-stage writing is not performed, are denoted by broken lines. In the Comparative Example, the word line power supply circuit unit 52 is not provided in FIG. 20 and the power supply of the sub-word driver 51 is fixed at VPP as in FIG. 5. FIG. 22 shows the case of four-value storage cell. Decision threshold values denote voltages that operate as decision references of respective data in read-out. If, in the write method of the Comparative Example, one of three values of 01, 10, 11 is written by SET write, there is fear that the transient current IMAX (ICOMP) exceeding a desired maximum write current instantaneously flows, with the resistance value becoming then excessively low. In FIG. 22, the case where the resistance value has become excessively low by the transient current IMAX in the Comparative Example is shown by a broken line. However, in the exemplary embodiment 10, sufficient readout margin may be provided such that the resistance value can be written to high accuracy in the SET write.

Exemplary Embodiment 11

Figure 23:
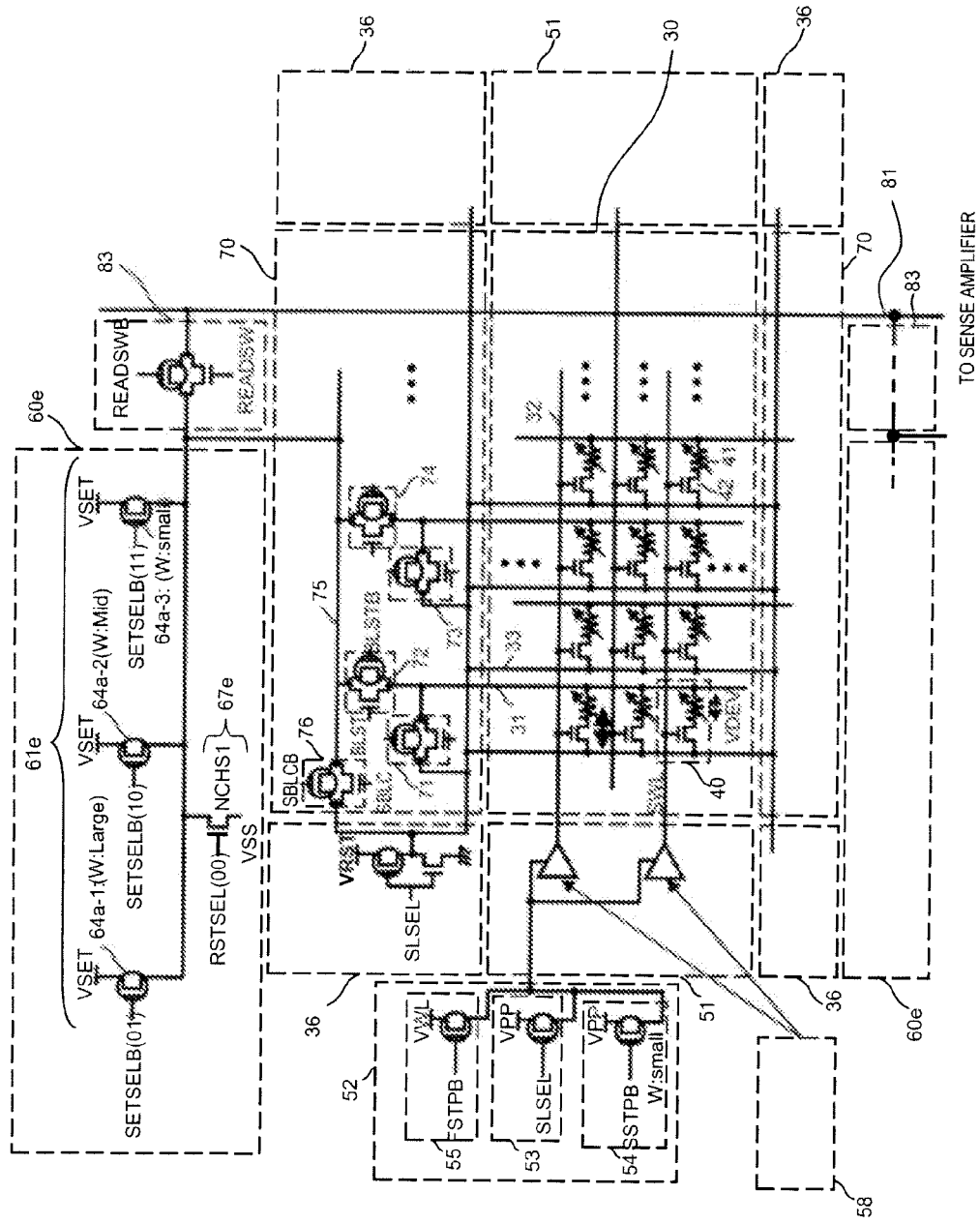
FIG. 23 is a circuit block diagram showing a memory cell array with its periphery of a semiconductor device according to an exemplary embodiment 11.

In multi-valued memory mode exemplary embodiments, the SET driver 61d of the exemplary embodiment 10 shown in FIG. 20 may be modified in many ways. FIG. 23 shows a circuit block diagram of a memory cell array with its periphery of a semiconductor device according to an exemplary embodiment 11. In a SET driver 61e of the exemplary embodiment 11, shown in FIG. 23, the current source transistors 62-1 to 62-3 in FIG. 20 are omitted and the transistor sizes W of switch transistors (driver select transistors) 64a-1 to 64a-3 are set to values differing from one driver to another. This allows controlling the current value by a simpler configuration. In the present exemplary embodiment 11, the gate voltages of the switch transistors 64a-1 to 64a-3 assume two values of HIGH and LOW. For selection, SETSELB is LOW in level corresponding to the GND (VSS) potential.

Exemplary Embodiment 12

Figure 24:
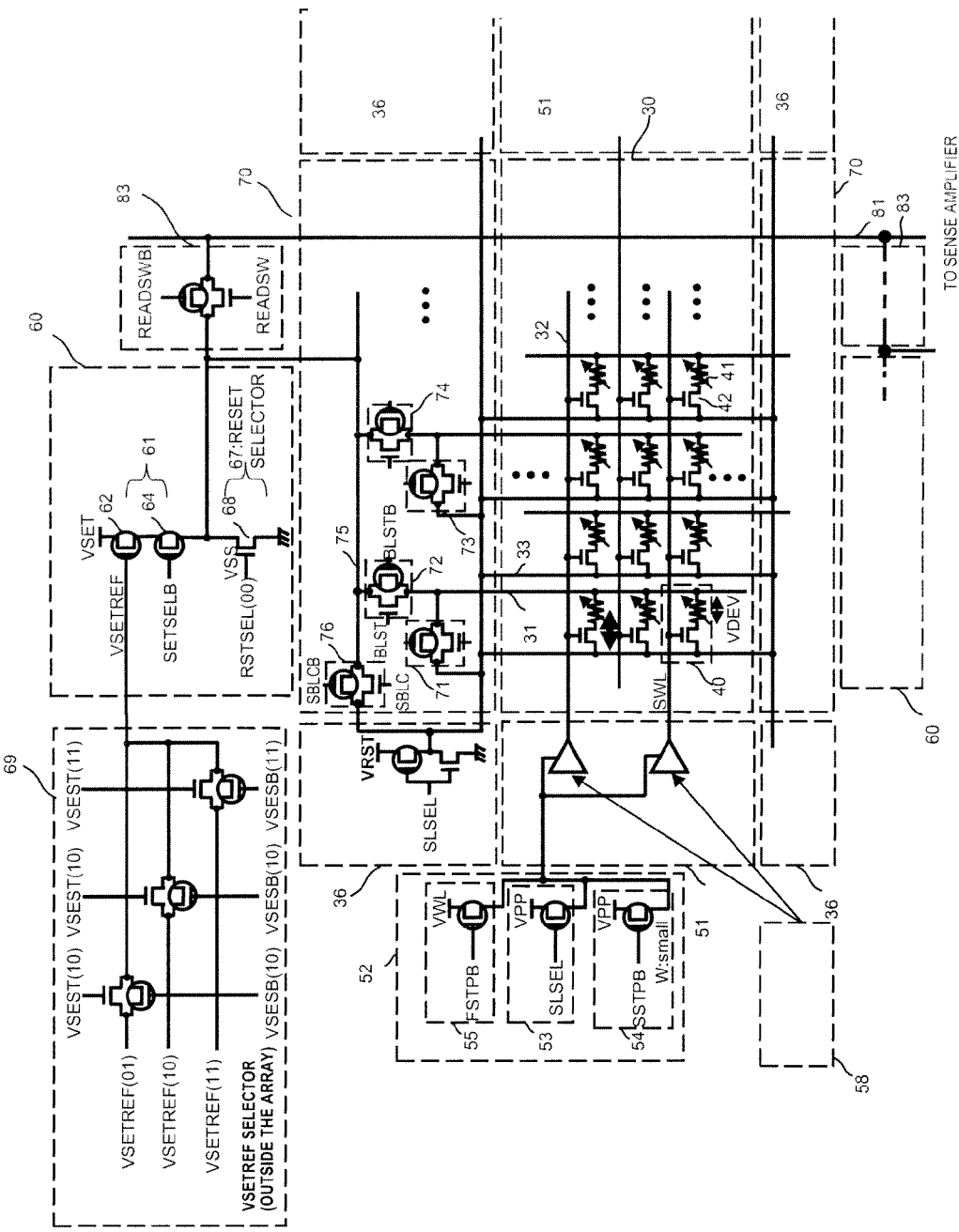
FIG. 24 is a circuit block diagram showing a memory cell array with its periphery of a semiconductor device according to an exemplary embodiment 12.

FIG. 24 depicts a circuit block diagram of a memory cell array with its periphery of a semiconductor device according to an exemplary embodiment 12. In the exemplary embodiment 12, each of multiple values is shared by the constant current source transistor 62 and the switch transistor 64. In the exemplary embodiment 12, shown in FIG. 24, the voltage values to be assigned to the constant current source transistor 62 are selected by a VSETREF selector 69 out of three voltage values, and the so selected voltage value is assigned. If, in the exemplary embodiment 12, the VSETREF selector 69 is arranged outside an array, and the multiple write amplifiers 60 share the VSETREF selector 69, it is possible to reduce the layout area of the write amplifiers 60.

If, in the exemplary embodiment 10, the operating waveform diagram of which is shown in FIG. 21, the write operation is to be performed simultaneously multiple cells, different values can be written simultaneously. If, in the exemplary embodiment 12, shown in FIG. 24, the VSETREF selector 69 is arranged outside the array and shared by the multiple write amplifiers 60, each of the multiple values (01, 10 and 11) must be written time-divisionally. In more concrete terms, in a four-valued memory, at least 01, 10 and 11 must be written in three separate timings. In this case, write or not-write at each timing (correspondence to data or addresses) may be determined depending on the state of selection of the SETSELB signal at each timing. That is, 01, 10 and 11 are written in three separate timings and, in writing 01, 10 and 11, they are written in cells whose write data are 01, 10 and 11.

Exemplary Embodiment 13

Figure 25:
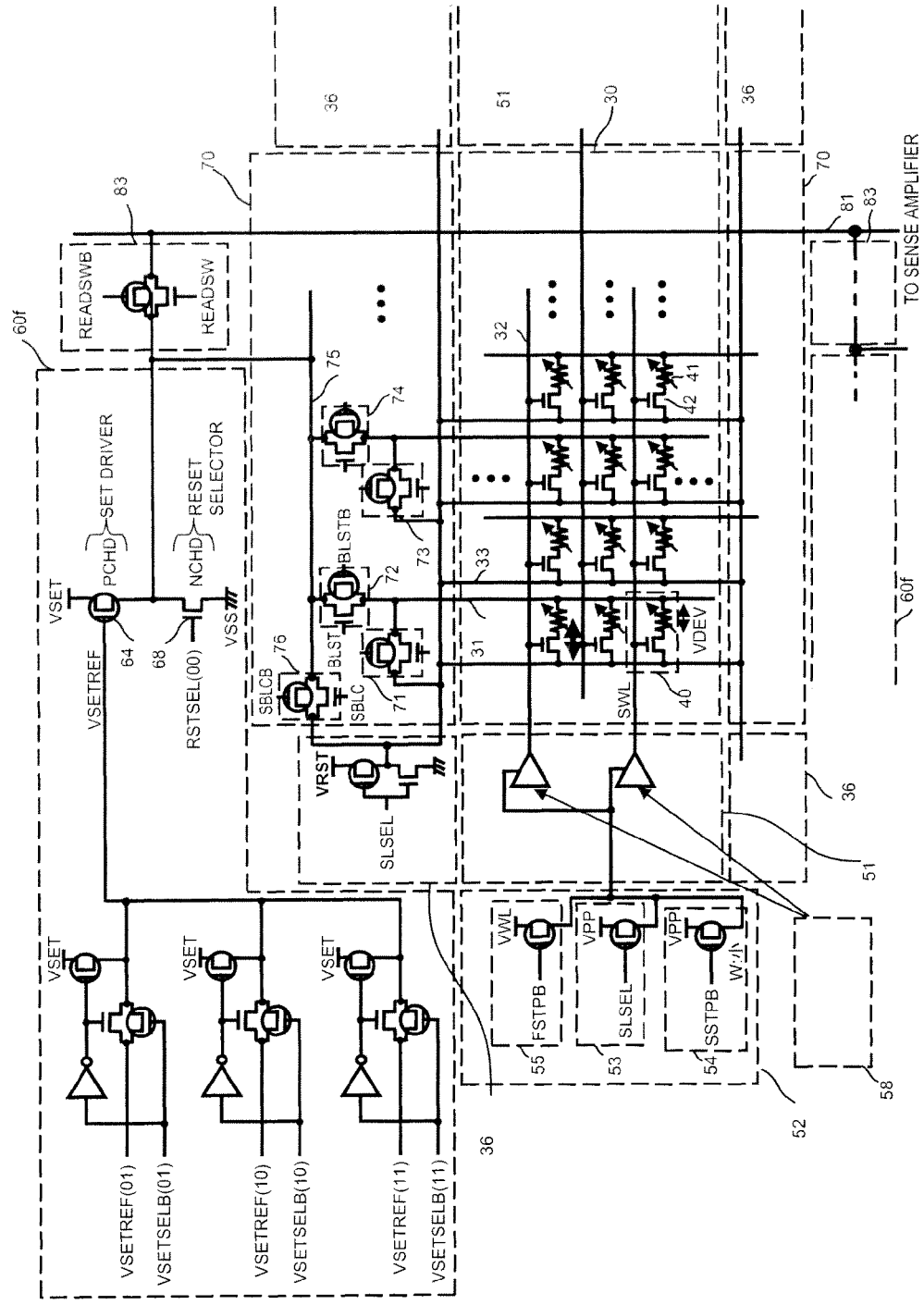
FIG. 25 is a circuit block diagram showing a memory cell array with its periphery of a semiconductor device according to an exemplary embodiment 13.

FIG. 25 depicts a circuit block diagram of a memory cell array with its periphery of a semiconductor device according to an exemplary embodiment 13. The present exemplary embodiment 13 is a further unique exemplary embodiment in the sense that, in implementing a multi-valued memory, the SET driver is shared. The operation may be as indicated in a timing chart similar to that of the exemplary embodiment 10 shown in FIG. 21 by providing the VSETREF() signal selection transistor (CMOS switch or the CMIS switch) and the VSETREF charging P-type transistor in association with each data. Since the small size of the transistor of each switch suffices, the exemplary embodiment 13 is effective in case it is necessary to enlarge the size of the SET driver transistor (switch transistor) 64**.

It should be noted that the present exemplary embodiment may be used in combination with the exemplary embodiments 2 to 9 to implement a multi-valued memory in the exemplary embodiments 10 to 13.

Exemplary Embodiment 14

Figure 8:
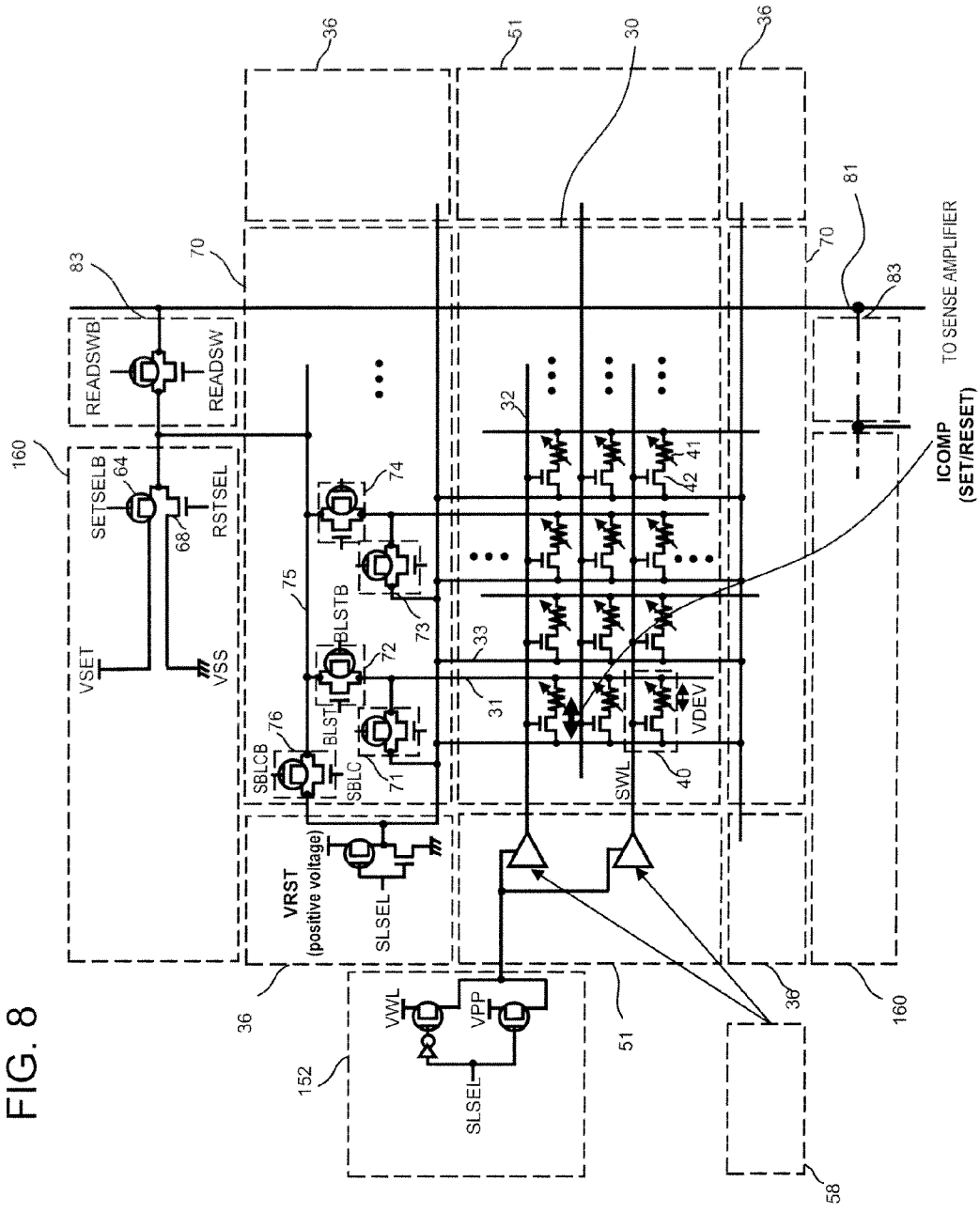
FIG. 8 is a circuit block diagram showing a memory cell array with its periphery of a semiconductor device according to an exemplary embodiment 14 of the present invention.

FIG. 8 depicts a circuit block diagram of a memory cell array with its periphery of a semiconductor device according to an exemplary embodiment 14. The parts which are similar to those of the exemplary embodiment 1 shown in FIG. 1 are depicted by the same reference numerals and redundant description is omitted for simplicity.

The semiconductor device according to the exemplary embodiment 14 adjusts the gate voltage of the cell transistor to adjust the maximum current ICOMP in SET write. In the exemplary embodiment 14, the constant current source transistor 62 shown in FIG. 1 is not provided in a write amplifier 160. In SET write, the maximum current ICOMP is controlled by adjusting the capability of the cell transistor by the potential (VWL) on the selected SWL. Note that VWL is selected by a word line power supply circuit unit 152. The circuit of the exemplary embodiment 14 shown in FIG. 8 is approximately the same as the figuration the exemplary embodiment 1 shown in FIG. 1 except that the constant current source transistor 62 is not provided in the write amplifier 160 and that the configuration of the word line power supply circuit unit 152 differs from that of the corresponding part in FIG. 1.

Figure 9:
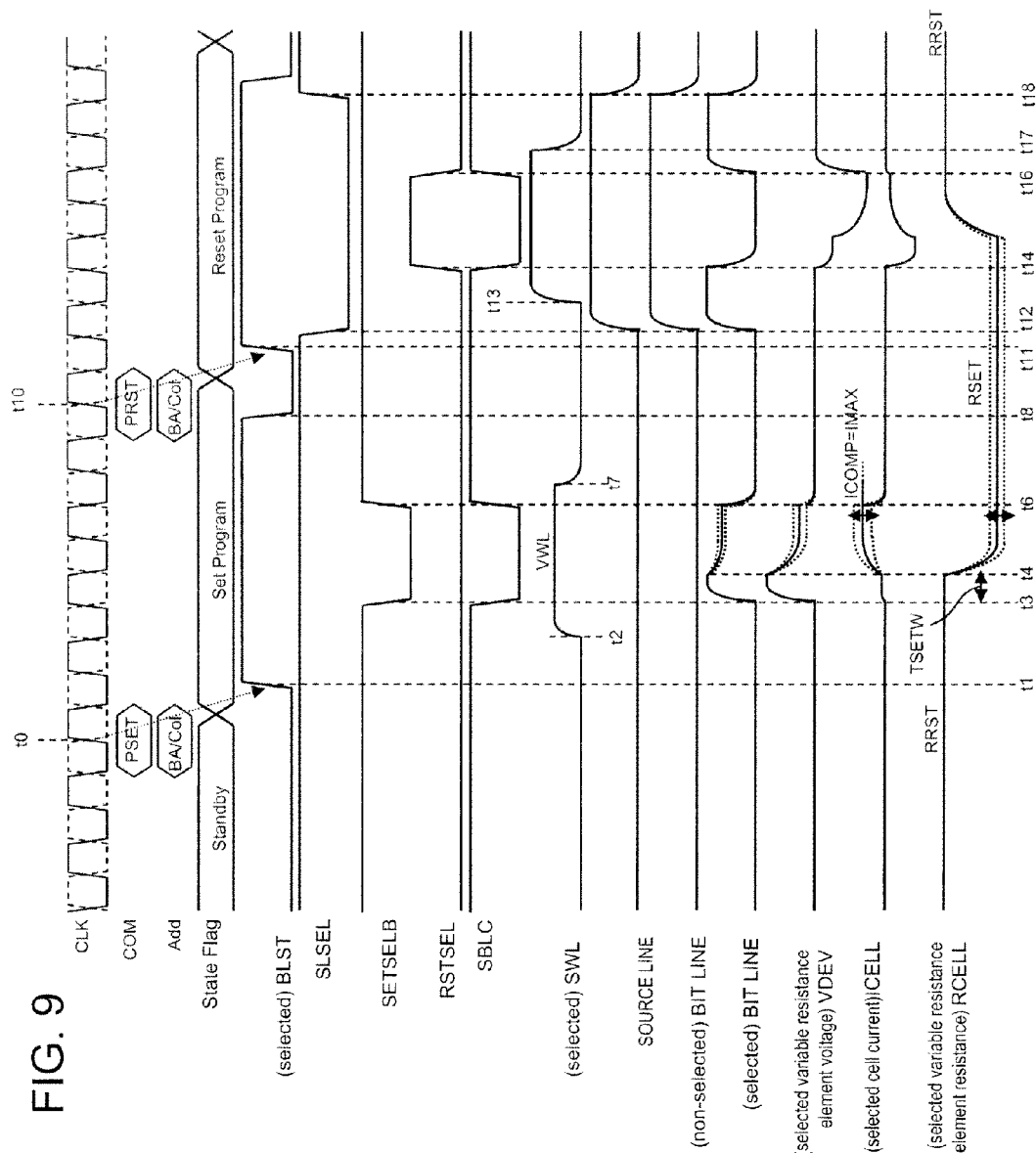
FIG. 9 is a waveform diagram showing the write operation of the exemplary embodiment 14.

FIG. 9 depicts a write waveform diagram of a semiconductor device of the exemplary embodiment 14. The cell transistor 42 is necessarily passed through by charges stored n the parasitic capacitance of the bit lime 31 and the common bit line 75. It is thus possible to suppress the transient current due to discharge by limiting the capability of the cell transistor 42.

Figure 10:
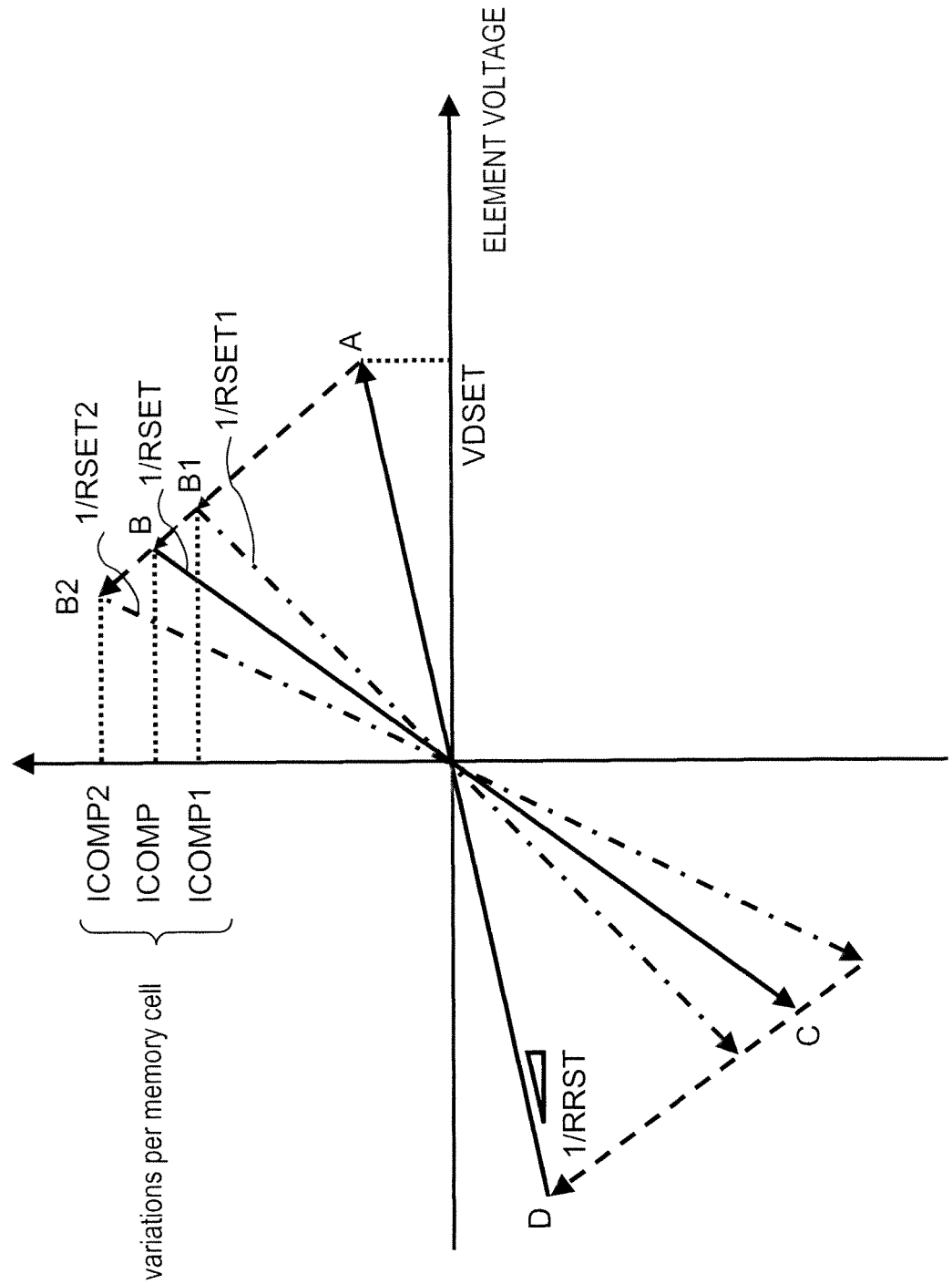
FIG. 10 is a graph showing I-V characteristics of the variable resistance element of the exemplary embodiment 14.

FIG. 10 depicts a graph showing characteristics of a variable resistance element in a semiconductor device of the exemplary embodiment 14. The ICOMP value undergoes variations due to variations in the cell transistor, as in the first-stage SET write in the exemplary embodiment 1 shown in FIG. 11. However, if these variations are in the allowable range, it is unnecessary to manage two-stage control in SET write such as is managed in the exemplary embodiment 1. It is thus possible to simplify the control circuit and to reduce the write-time.

Exemplary Embodiment 15

An exemplary embodiment 15 is directed to a word line power supply circuit unit. Although the word line power supply circuit unit of the exemplary embodiment 15 may apply to any of the exemplary embodiment, 1 to 14, it is assumed here that the word line power supply circuit unit of the present exemplary embodiment is to replace the word line power supply circuit unit 152 of the exemplary embodiment 14. FIG. 7 depicts a circuit block diagram of a word line supply circuit unit 152*a* of the exemplary embodiment 15. The word line power supply circuit unit 152*a* delivers the power of the power supply VWL to the sub-word driver 51. The sub-word driver 51 receives the power supply VWL from the word line power supply circuit unit 152*a*, and drives a word line WLs by this power supply VWL when it has selected the word line based on an address signal Xadd_s output from the address decoder 58. Note that non-selected word lines are pulled down to the ground-level power supply VSS.

The word line power supply circuit unit 152*a* includes a SET write power supply 131, a RESET write power supply 132 and a read power supply 133. A set reference voltage signal VREF_Set, a reset reference voltage signal VREF_Reset and a read reference voltage signal VREF_Read, as reference signals for the power supply output, are coupled to the SET write power supply 131, RESET write power supply 132 and to the read power supply 133, respectively.

The SET write power supply 131 outputs a power supply voltage signal VWL_s, used for SET write for the variable resistance element, based on the set reference voltage signal VREF_Set. The RESET write power supply 132 outputs a power supply voltage signal VWL_rs, used for RESET write for the variable resistance element, based on the reset reference voltage signal VREF_Reset. The read power supply 133 outputs a power supply voltage signal VWL_r, used for readout of the resistance value of the variable resistance element, based on the read reference voltage signal VREF_Read.

Power supply selection switches 134 to 136 selects which one of the power supply voltage signal VWL_s, power supply voltage signal VWL_rs and the power supply voltage signal VWL_r is to be supplied to the sub-word driver 51. Selection of one of the power supply selection switches 134 to 136 is by an internal command signal INT_com (corresponding to e.g., SLSEL) output by a command control circuit 20 (see FIG. 2) by one of SET write, RESET write and read operations, respectively.

Figure 28A:
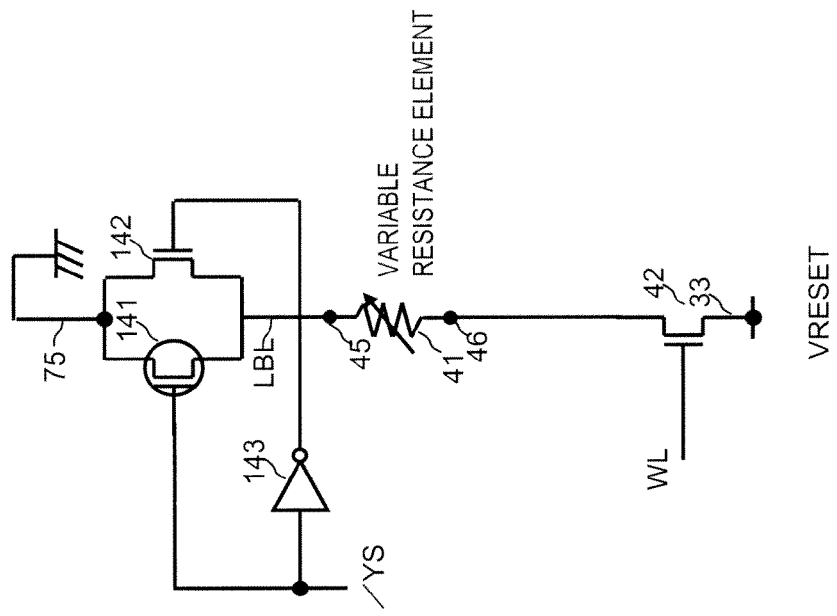
FIG. 28A illustrates a SET write operation for the variable resistance element of the exemplary embodiment 15.
Figure 28B:
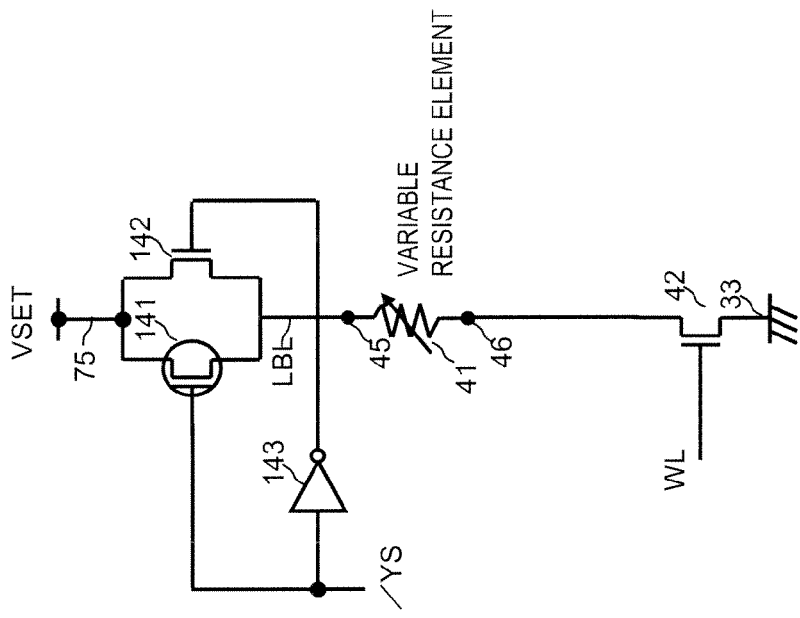
FIG. 28B illustrates a RESET write operation for the variable resistance element of the exemplary embodiment 15.

FIGS. 28A and 28B are schematic views for illustrating the operation of SET write and that for the RESET write for the variable resistance element, respectively, in the exemplary embodiment 15. Referring to FIGS. 28A and 28B, the operation for SET write and RESET write will now be explained.

FIGS. 28A and 28B show how connection is made from the write amplifier 160 (see FIG. 8) via the common bit line 75, bit line selection switches 141, 142 and the local bit line LBL to a memory cell composed of the variable resistance element 41 and the cell transistor 42. The variable resistance element 41 has one end (first electrode 45) connected to the local bit line LBL, while having its other end (second electrode 46) connected to one of the source and the drain of the cell transistor 42 which is an NMOS transistor. The other of the source and the drain of the cell transistor 42 is connected to the source line 33. In the exemplary embodiment 15, the bit line selection switch is formed by a CMOS transmission gate composed of the bit line selection switch 141, a PMOS transistor, and the bit line selection switch 142, an NMOS transistor. A column selection line /YS is coupled to the gate of the PMOS transistor 141 and an inverted signal of the column selection line/YS is coupled by an inverter 143 to the gate of the bit line selection switch 142. The variable resistance element 41 is such an element whose resistance value is varied in a range from 1.0 kΩ to 50 kΩ.

Initially, the SET write operation of FIG. 28A will be explained. The SET write is the write operation of changing the variable resistance element in the high resistance state to the low resistance state, as already explained. In this case, the set voltage VSET is applied to the common bit line 75, and the source line 33 is grounded. If a preset voltage is applied across the terminals of the variable resistance element 41, the resistance value of the variable resistance element is changed from the high resistance state to the low resistance state. For example, the voltage applied to the word line WL is controlled so that, when 3.0V is applied as the set voltage VSET, the voltage at the terminal 45 towards the local bit line LBL of the variable resistance element 41 will be 1.4V and that at the terminal 46 towards the cell transistor 42 will be 1.0V. By such control, the resistance value of the variable resistance element 41 may be changed to a desired low resistance. The word line power supply circuit unit 152a (see FIG. 27), applying the supply power to the sub-word driver 51, is to be controlled so that a proper voltage will be applied to the selected word line WL.

The RESET write operation of FIG. 28B will be explained. The RESET write is the write operation of changing the variable resistance element in the low resistance state to the high resistance state. In this case, the common bit line 75 is grounded and a reset voltage VREFSET is applied to the source line 33. If a preset voltage, which is the reverse of the voltage applied in the SET write, is applied across the terminals of the variable resistance element 41, the resistance value of the variable resistance element 41 is changed from the low resistance state to the high resistance state.

The voltage applied to the word line WL is controlled so that, when a voltage of 3.0V is applied as the reset voltage VRESET, the voltage at the terminal 45 towards the local bit line LBL of the variable resistance element 41 will be 1.0V and that at the terminal 46 towards the cell transistor 42 will be 1.4V. By such control, the resistance value of the variable resistance element 41 may be changed to a desired high resistance value. The word line power supply circuit unit 152a (see FIG. 7), applying the supply power to the sub-word driver 51, is to be controlled so that a proper voltage will be applied to the selected word line WL.

As for the readout operation, detailed description is not made. In short, current is caused to flow from the global bit line (GBL) (see FIG. 8) to the source line 33. The voltage value on the global bit line (GBL) or the current flowing through the global bit line (GBL) at this time is read out by the sense amplifier 12 (see FIG. 2) to read out the resistance value of the variable resistance element 41 as a logical value. By optimally controlling the selected voltage on the word line WL, the resistance value of the variable resistance element may be read out correctly at a high speed. It is feared that, if a large current close to the write current is allowed to flow through the variable resistance element, the resistance value is changed. However, by controlling the selected voltage on the word line WL by the word line power supply circuit unit 152a, the current flowing through the variable resistance element 41 may be suppressed to prevent the resistance value of the variable resistance element 41 from being changed at read time.

Figure 29:
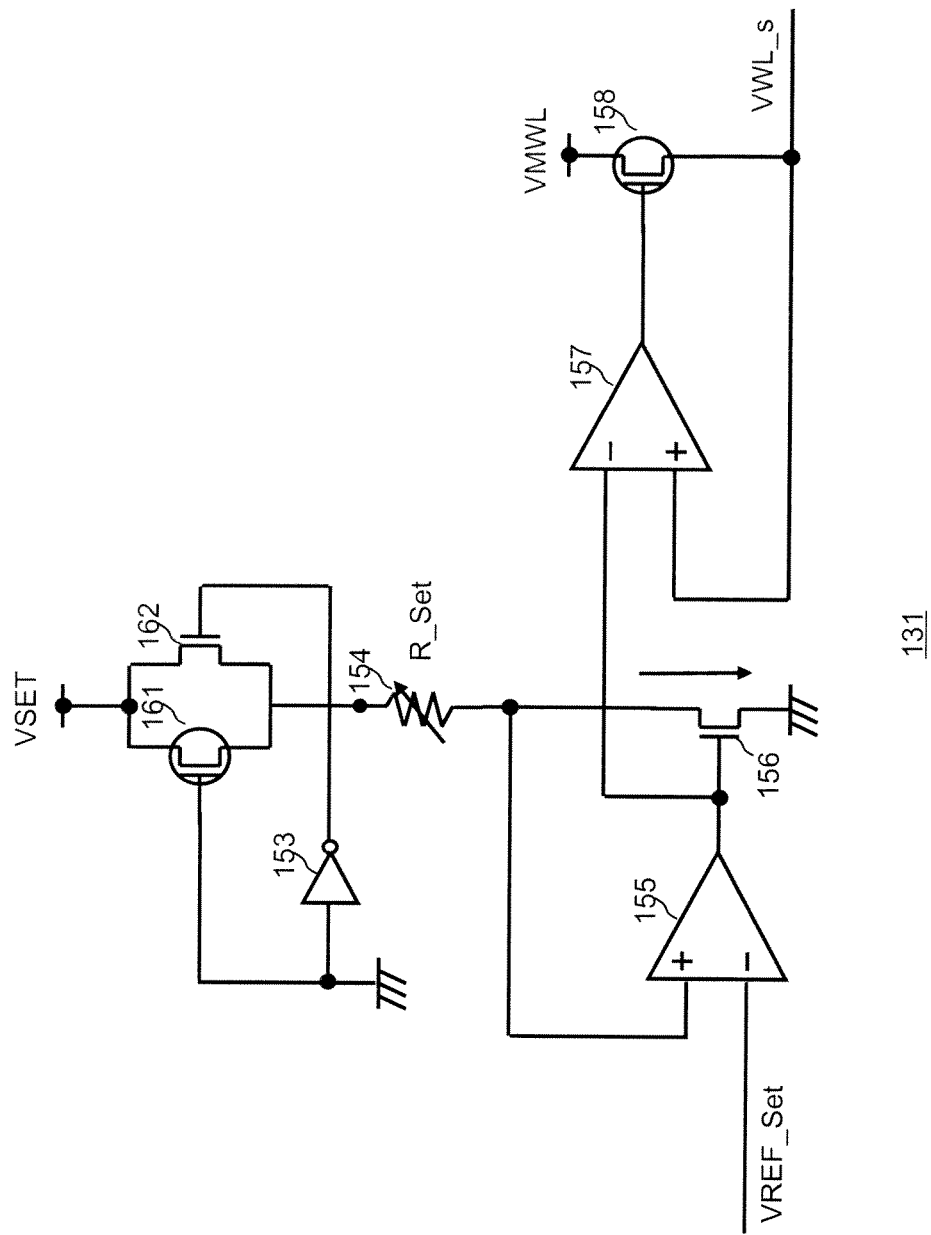
FIG. 29 is a block diagram of a SET write power supply unit according to the exemplary embodiment 15.

FIG. 29 is a block diagram showing an internal arrangement of the SET write power supply 131 of the word line power supply circuit unit 152a in the exemplary embodiment 15. Referring to FIG. 29, the configuration of the SET write power supply 131 will now be explained in detail. A PMOS transistor 161 and an NMOS transistor 162 are respectively equivalent in performance to the bit line selection switches 141, 142 (see FIG. 28). The drains and the sources of the transistors 161, 162 are connected to each other. A signal inverted from a signal applied to the gate of the PMOS transistor 161 is coupled by an inverter 153 to the gate of the NMOS transistor 162 to form a CMOS transmission gate equivalent in performance to the bit line selection switches. Note that, since the gates of the inverter 153 and the PMOS transistor 161 are grounded, the PMOS transistor 161 and the NMOS transistor 162 are in conducting states at all times.

The set voltage VSET is supplied to one ends of the source and the drain of the PMOS transistor 161 and the NMOS transistor 162 connected in common. The other ends of the source and the drain are connected to one end of a set reference resistance 154. The set reference resistance 154 operates as a reference for the current allowed to flow through the variable resistance element 41 at SET write, and is preferably a variable resistor with an adjustable resistance value. A replica transistor 156 has a drain connected to the other end of the set reference resistance 154. The replica transistor 156 has characteristics about equivalent or proportional to those of the cell transistor 42, and has a source grounded, while having a gate connected to an output terminal of an OP amp 155. The set reference voltage signal VREF_Set is coupled to the inverting input terminal of the OP amp 155, whose non-inverting input terminal is connected to a junction between the other end of the set reference resistance 154 and the drain of the replica transistor 156.

Another OP amp 157 has an inverting input terminal connected to an output terminal of the OP amp 155, while having an output terminal connected to a gate of a PMOS transistor operating as a power supply output unit 158. The PMOS transistor of the power supply output unit 158 has a source connected to a power supply VMWL, while having a drain, outputting a power supply VWL_s, connected to the non-inverting input terminal of the OP amp 157.

In the above configuration, the gate voltage of the replica transistor 156 is controlled so that the voltage at the junction between the set reference resistance 154 and the drain of the replica transistor 156 will be equal to the voltage of the set reference voltage signal VREF_Set. Also, a voltage about equal to the gate voltage of the replica transistor 156 is output as the power supply VWL_s. If it is assumed that the replica transistor 156 has characteristics about equal to those of the cell transistor 42, the current flowing through the variable resistance element 41 in case the resistance value of the variable resistance element 41 is equal to the resistance value of the set reference resistance 154 becomes approximately equal to the current flowing through the set reference resistance 154.

As a desirable example, it is assumed that, in case the voltage of the set reference voltage signal VREF_Set is 1.0V and the set voltage VSET is 3.0V, the terminal voltage on the transmission gate side of the set reference resistance 154 is 1.4V and its terminal voltage on the replica transistor side is 1.0V. The current of approximately 150 μA is then allowed to flow through the set reference resistance 154.

Preferably, the replica transistor 156 is a transistor produced by the same production process as that of the cell transistor 42, and tends to exhibit manufacturing tolerances in e.g., transistor threshold values which are the same as those of the cell transistor 42. It is however not mandatory that the replica transistor 156 is of the same size as the cell transistor 42, provided that the cell transistor 42 allows for monitoring the tendency to manufacturing tolerances.

Figure 30:
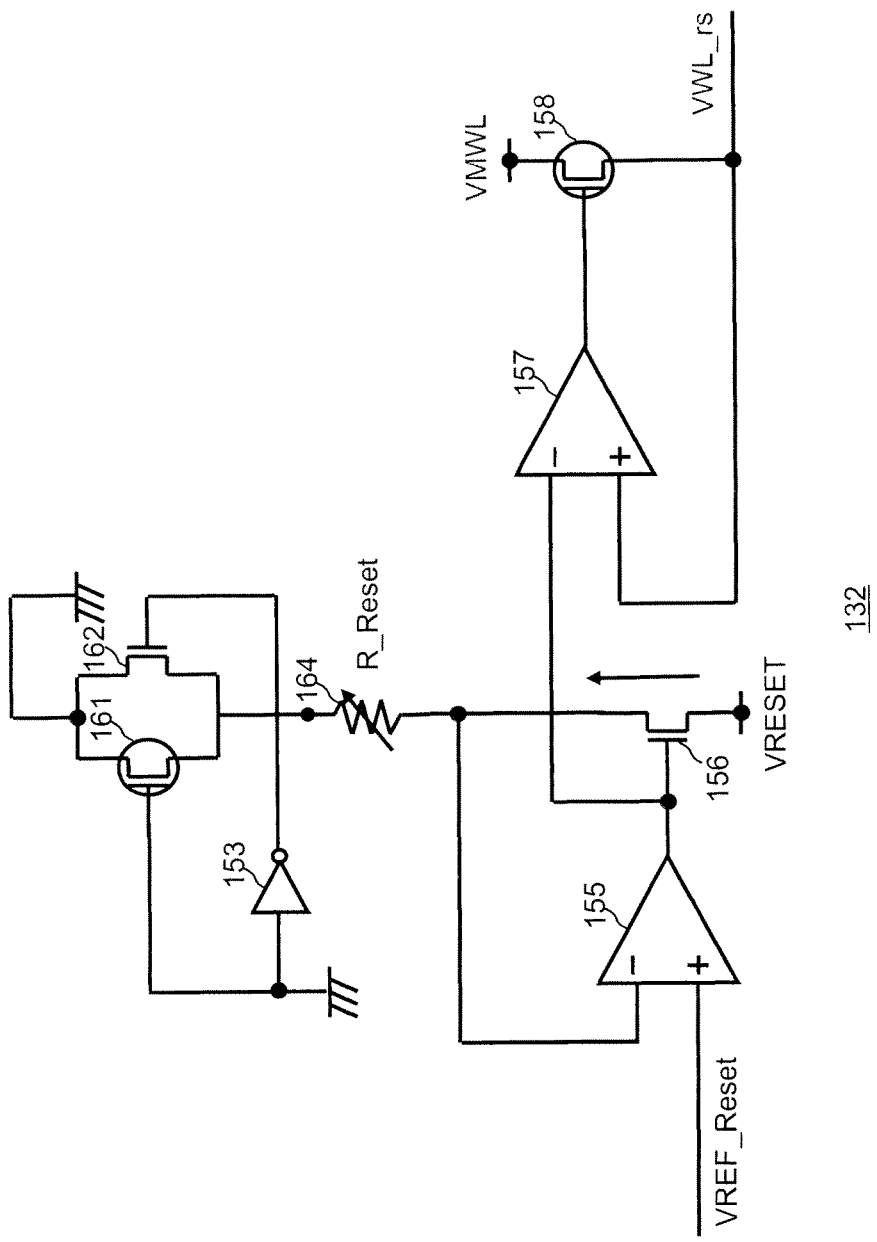
FIG. 30 is a block diagram of a RESET write power supply unit according to the exemplary embodiment 15.

FIG. 30 is a block diagram showing the internal arrangement of the RESET write power supply 132 in the exemplary embodiment 15. Referring to FIG. 30, the arrangement of the RESET write power supply 132 will now be explained in detail. The parts which are similar to those of the SET write power supply 131 shown in FIG. 29 are depicted by the same reference numerals and redundant description is omitted for simplicity.

In the RESET write power supply 132, a current path of the CMOS transmission gate composed of the PMOS transistor 161 and the NMOS transistor 162 has its one end grounded, while having its other end connected to one end of a reset reference resistance 164. This reset reference resistance 164 provides a reference of the current flowing through the variable resistance element 41 at RESET write and, similarly to the set reference resistance 154, is preferably a variable resistor with adjustable resistance. The source of the replica transistor 156 is connected to the other end of the reset reference resistance 164, and the reset voltage VRESET is applied to the drain of the replica transistor 156. An output terminal of the OP amp 155 is connected to the gate of the replica transistor 156. The reset reference voltage signal VREF_Reset is connected to the non-inverting input terminal of the OP amp 155, the inverting input terminal of the OP amp 155 of which is connected to a junction between the reset reference resistance 164 and the source of the replica transistor 156. The power supply voltage signal VWL_rs is output at a drain of the PMOS transistor of the power supply output unit 158.

The above described configuration of the RESET write power supply 132 is about equal to the configuration of the SET write power supply 131 except that the connection of the inverting and non-inverting terminals of the OP amp 155 is reversed. It is because the direction of the current flowing between the source and the drain of the replica transistor 156 is the reverse of that in the case of the replica transistor 156 of the SET write power supply 131.

In the above configuration, the gate voltage of the replica transistor 156 is controlled so that the voltage at the junction between the reset reference resistance 164 and the source of the replica transistor 156 will be equal to the voltage of the reset reference voltage signal VREF_Reset. A voltage approximately equal to the gate voltage of the replica transistor 156 is output as power supply voltage VWS_rs. In case the replica transistor 156 has a characteristic approximately equal to that of the cell transistor 42, the current flowing through the variable resistance element 41 is approximately equal to that flowing in the reset reference resistance 164 when the resistance value of the variable resistance element 41 is approximately equal to that of the reset reference resistance 164.

In a preferred example, with the voltage of the reset reference voltage signal VREF_Reset of 1.4V and the reset voltage VRESET of 3.0V, the terminal voltage of the reset reference resistance 164 towards the transmission gate is 1.0V and that towards the replica transistor 156 is 1.4V. The current of approximately 50 µA is allowed to flow through the reset reference resistance 164.

Figure 31:
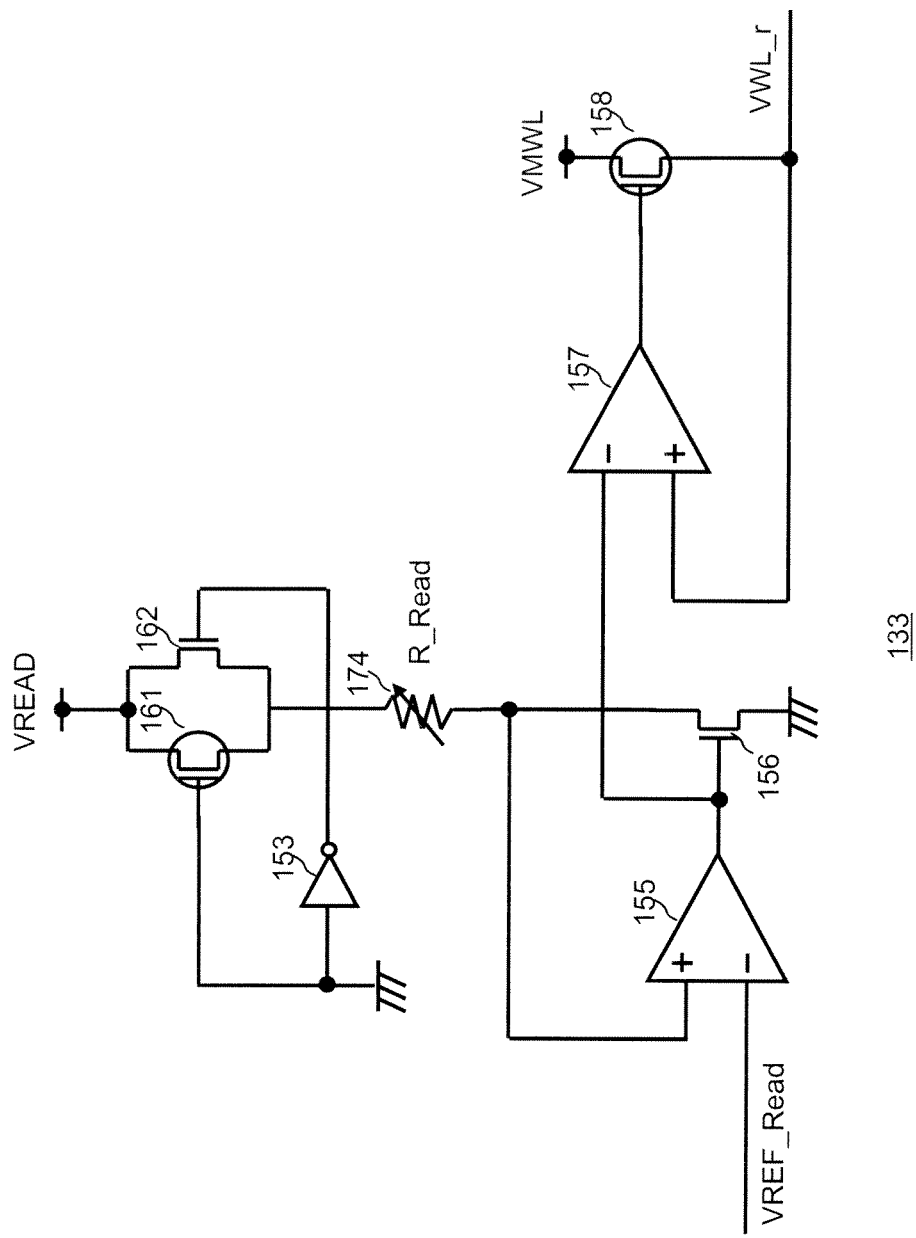
FIG. 31 is a block diagram of a read power supply unit according to the exemplary embodiment 15.

FIG. 31 depicts a block diagram showing the read power supply 133 in the exemplary embodiment 15. Referring to FIG. 31, the arrangement of the read power supply 133 will now be explained in detail. The parts which are similar to those of the SET write power supply 131 shown in FIG. 29 are depicted by the same reference numerals. In the read power supply 133, the set voltage VSET, set resistance 154 and the set reference voltage signal VREF_Set of the SET write power supply 131 are replaced by a read voltage VREAD, a read reference resistance 174 and a read reference voltage signal VREF_Read, respectively. The drain of the PMOS transistor of the power supply output unit 158 outputs a power supply VWL_r which is to be a power supply applied to the selected word line at read. Except the above points, the arrangement and the operation of the read power supply 133 is about the same as those of the SET write power supply 131 explained with reference to FIG. 29. Hence, redundant explanation is dispensed with. It is noted however that the voltage value of the power supply VWL_r output is controlled to be smaller than the voltage of the power supply VWL_s so that the current flowing through the variable resistance element when the power supply in question is applied to the control electrode of the cell transistor will be small.

A preferred arrangement in case the set reference resistance 154, reset reference resistance 164 and the read reference resistance 174 are arranged as variable resistances will now be explained.

Figure 32:
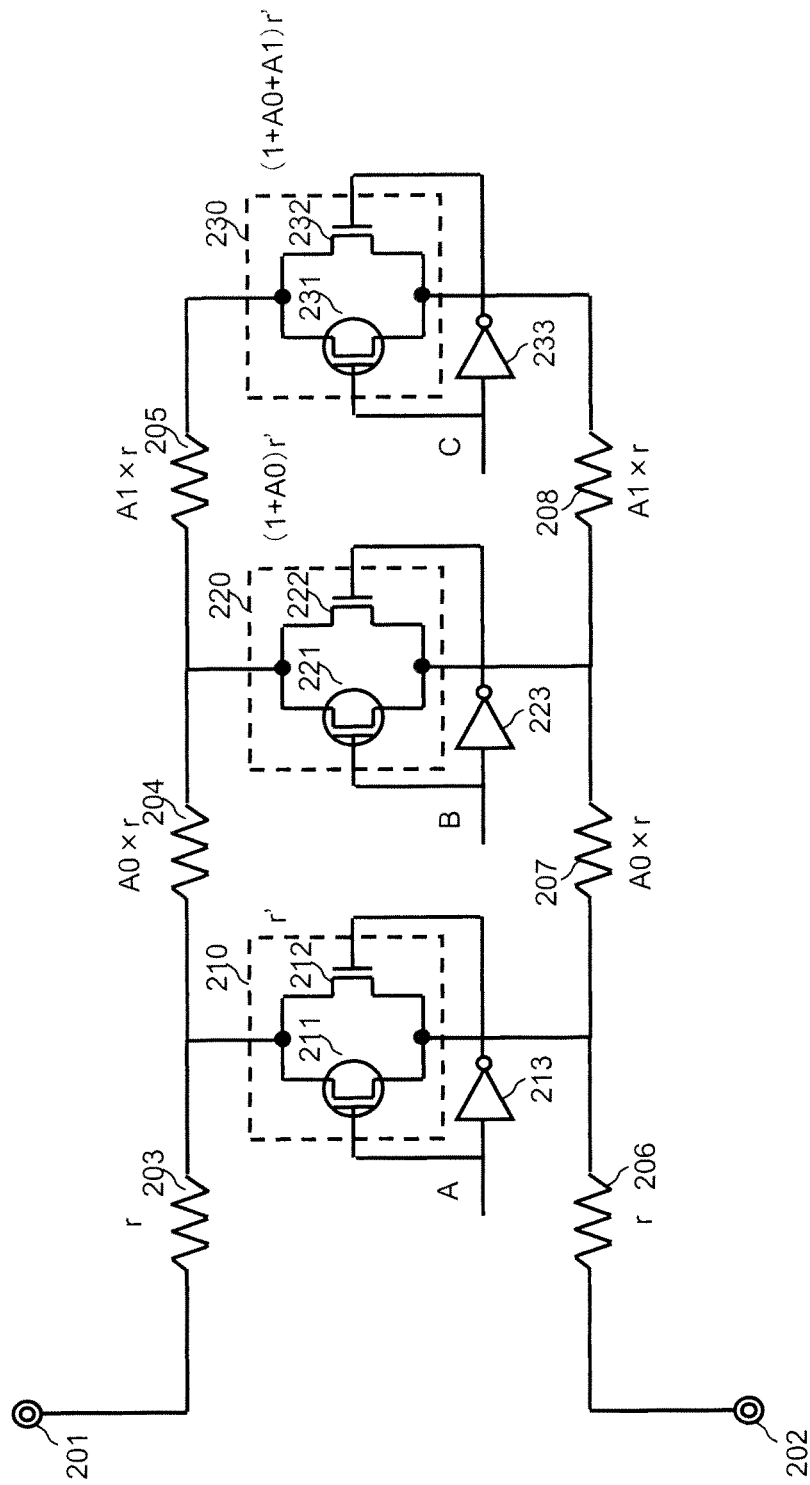
FIG. 32 is a block diagram showing an example configuration of a variable resistance used in the word line power supply circuit unit according to the exemplary embodiment 15.

FIG. 32 is a block diagram showing a preferred example of an arrangement of a variable resistance used in the word line power supply circuit unit 152a according to an exemplary embodiment 15. A series connection of fixed resistance elements 203, 204 and 205 and a series connection of fixed resistance elements 206, 207 and 208 are connected to terminals 201, 202 of a variable resistor, respectively. A switch 210 is provided between a junction of the fixed resistance elements 203, 204 and a junction of the fixed resistance elements 206, 207. Similarly, a switch 220 is provided between a junction of the fixed resistance elements 204, 205 and a junction of the fixed resistance elements 207, 208. A switch 230 is provided between free ends of the fixed resistance elements 207, 208. The switch 210 is of a CMOS transmission gate configuration composed of a PMOS transistor 211 and an NMOS transistor 212. In order for a signal A to control the opening/closure of the switch composed of the PMOS transistor 211 and the NMOS transistor 212, the signal A is coupled to the gate of the PMOS transistor 211, and a signal inverted from the signal A by the inverter 213 is coupled to the gate of the NMOS transistor 212. The switches 220, 230 are basically the same as the switch 210 in circuit configuration. Thus, the switch 220 includes a PMOS transistor 221 and an NMOS transistor 222, and a signal B is used to control the switch opening/closure. Similarly, the switch 230 includes a PMOS transistor 231 and an NMOS transistor 232, and a signal C is used to control the switch opening/closure. However, to raise the accuracy in the relative resistance values of the variable resistances, the switches 210, 220 and 230 differ in transistor sizes, as will now be explained.

As regards the resistance values of the fixed resistance elements, the resistance values of the resistance elements 203, 206 are r, those of the resistance elements 204, 207 are A0 times r and those of the resistance elements 205, 208 are A1 times r. Moreover, as regards the transistor sizes, they are set so that the on-resistances of the transistors the switch 220 are set at (1+A0) times those of the transistors 211, 212 in the switch 210 and so that the transistors 231, 232 in the switch 230 are set at (1+A0+A1) times those of the transistors 211, 212 in the switch 210. By so setting the transistor sizes, the resistance values of the on-resistances of the switches turned on may have a preset ratio to the sum total of the resistance values of the fixed resistance elements connected in series between the terminals 201, 202 irrespectively of which one of the switches 210, 220 and 230 has been turned on.

That is, if the switch 210 is turned on and the switches 220, 230 are turned off, the resistance value of the fixed resistances between the terminals 201, 202 is 2r. On the other hand, if the switch 220 is turned on and the switches 210, 230 are turned off, the resistance value of the fixed resistances between the terminals 201, 202 is 2*(1+A0)r. In case the switch 220 is turned on, the resistance value of the fixed resistances is (1+A0) times the resistance value when the switch 210 is turned on. However, the value of the on-resistance of the switch 220 is set to be (1+A0) times the on-resistance of the switch 210. Thus, the ratio between the resistance value of the fixed resistances between the terminals 201, 202 and the resistance value of the on-resistance of the switch remains unchanged. If the switch 230 is turned on and the switches 210, 220 are turned off, the resistance value of the fixed resistances between the terminals 201, 202 is 2*(1+A0+A1)r. In case the switch 230 is turned on, the resistance value of the fixed resistances is (1+A0+A1) times the resistance value when the switch 210 is turned on. However, since the value of the on-resistance of the switch 230 is set to be (1+A0+A1) times the on-resistance of the switch 210. Thus, the ratio between the resistance value of the fixed resistances between the terminals 201, 202 and the resistance value of the on-resistance of the switch remains unchanged.

In FIG. 32, the switches 210, 220 and 230 are of a CMOS transmission gate configuration. However, each switch may be composed of a single transistor. It is sufficient in this case that the transistor is of such size that the ratio between the resistance value of the fixed resistance elements between the terminals 201, 202 and the resistance value of the on-resistance of the switch remains unchanged.

In the example of FIG. 32, a series connection of a plurality of fixed resistances is connected to each of the terminals 201 and 202, and a plurality of switches are provided between the two series connections. Alternatively, a series connection of fixed resistances may be connected to only the terminal 201 or 202 and a plurality of switches may directly be connected in parallel with the terminal 202 or 201. For example, the fixed resistance elements 206 to 208 may not be provided and the terminal 201 may be connected via interconnects to the switches 220 and 230. It is noted that the number of the fixed resistance elements, the ratio between the resistance values of the fixed resistance elements, the ratio between the resistance values of the fixed resistances and the on-resistances of the switches, the internal arrangements of the switches, such as each switch being composed of multiple transistors or only of a single transistor, or the arrangement of the entire variable resistor composed of the fixed resistance elements and the switches, may be of optional configurations. It is however preferred to set the sizes of the transistor(s) contained in each switch so that the ratio between the resistance values of the fixed resistance elements and the on-resistances of the switches will remain constant even on changing over from one switch to another.

With progress in miniaturization of processing in the pre-stage in manufacture of semiconductor devices, the tendency is towards higher contact resistance or higher resistances of the diffusion layers of transistors. In the above arrangement, higher accuracy of the relative resistance values may be maintained even in case the on-resistances of the switch transistors may not be ignored in light of enhanced miniaturization. It becomes possible to use the transistor of the smallest size as the switch transistor to avoid the switch area from increasing.

Figure 33A:
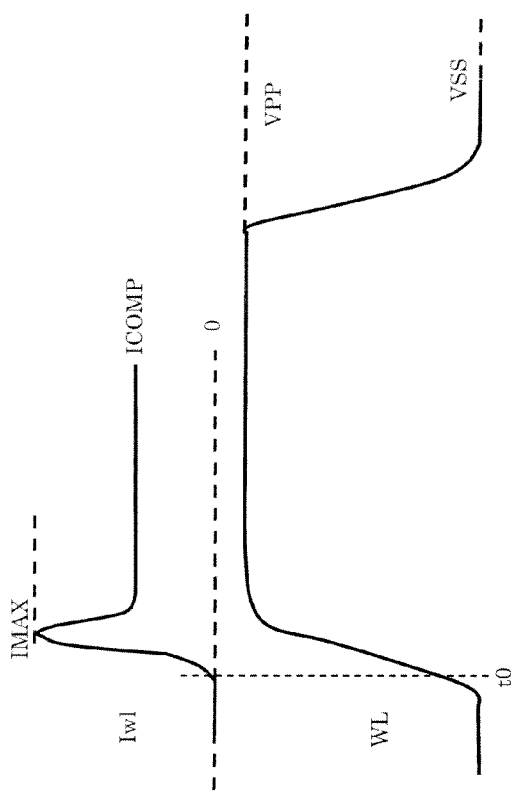
FIG. 33A is a graph showing, for SET write, a current waveform and a word line voltage waveform of a variable resistance element in case of not managing word line power supply control.
Figure 33B:
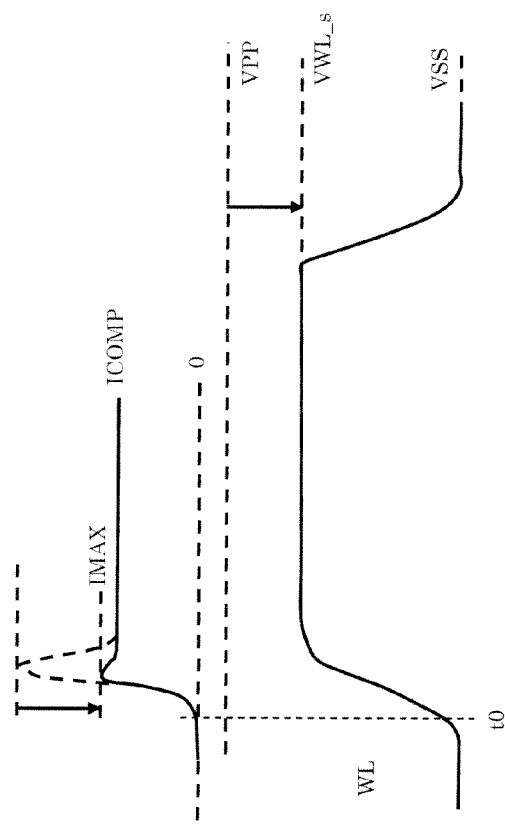
FIG. 33B is a graph showing, for SET write, a current waveform and a word line voltage waveform of a variable resistance element according to the exemplary embodiment 15.

The desirable effect resulting from using the word line power supply circuit unit 152a of the exemplary embodiment 15 in the semiconductor device of the exemplary embodiment 14 will now be explained. FIG. 33A depicts a voltage waveform diagram of a word line voltage and a current waveform of the variable resistance element in case of not managing word line power supply control in SET write. FIG. 33B depicts a voltage waveform diagram of a word line voltage and a current waveform of the variable resistance element in the exemplary embodiment 15. FIG. 33A is for a case where the word line power supply control is not managed in accordance with the Comparative Example of FIG. 5. That is, the word line selection voltage is VPP. In this case, the resistance value of the variable resistance element is changed from the high resistance to the low resistance by a constant current output from the write amplifier 60 (see FIG. 5). In a ReRAM, in which the variable resistance element is formed by exploiting the phenomenon that resistance is changed on voltage application to a transition metal oxide, a cell transistor is turned on when the word line is raised from VSS (ground level) to the selection potential of VPP. A preset voltage is then applied across the terminals of the variable resistance element. The resistance value of the variable resistance element then transitions to a low resistance state from the high resistance state. However, if the resistance value of the variable resistance element transitions to a low resistance state from the high resistance state, the terminal voltage of the variable resistance element towards the common bit line 75 decreases rapidly. The charges stored flow at this time via the bit line selection switch to the variable resistance element. The current IMAX, flowing instantaneously at this time, exceeds the current ICOMP which is the constant current designed to flow from the write amplifier 60 driving the common bit line 75 to the variable resistance element. There is fear that the resistance value of the variable resistance element transitions to a stance value lower than the resistance value to be inherently set by the current IMAX. This problem may not be coped with even if the ant current accuracy of the write amplifier 60 is raised. The reason is that it is not possible with the constant current outputting amplifier provided at the distal end of the common bit line 75 to control the current flowing from the parasitic capacitance of the common bit line 75 to the variable resistance element.

FIG. 33B depicts a current waveform of the variable resistance element and a word line voltage waveform in case of applying the word line power supply circuit unit of the exemplary embodiment 15. In the exemplary embodiment 15, the voltage of the power supply driving the selected word line is optimally controlled to control the current flowing through the cell transistor to change the variable resistance element to a desirable resistance value. That is, the voltage applied to the cell transistor is controlled to control so that the current flowing through the variable resistance element will not exceed ICOMP by a large value. In FIG. 33A, the gate voltage of the cell transistor is VPP. In the exemplary embodiment 15, shown in FIG. 33B, the gate voltage is VWL_s which is lower than VPP. Hence, the current flowing through the variable resistance element may be controlled so as not to surpass ICOMP significantly.

If, in the exemplary embodiment 15, the current value of ICOMP can be controlled simply by controlling the voltage applied to the gate of the cell transistor, it is unnecessary for the amplifier to possess the function of outputting the constant current, in contradistinction from the write amplifier 160 shown in FIG. 8. However, the current value IMAX may be limited by controlling the voltage applied to the gate of the cell transistor. The write amplifiers outputting the constant current (60, 60a, 60b, 60c) explained in connection with FIGS. 1 and 13 to 15 may be used to acquire a correct value of ICOMP.

There may be cases in which, in the word line power supply circuit unit of the exemplary embodiment 15, a plurality of power supplies with different voltages or slue rates for each write operation are used to control the gate voltage of the cell transistor in two stages at SET write, for example. In these cases, it is sufficient to provide a plurality of SET write power supplies 131 (see FIG. 29) having respective different voltages or slue rates, as necessary.

Figure 34:
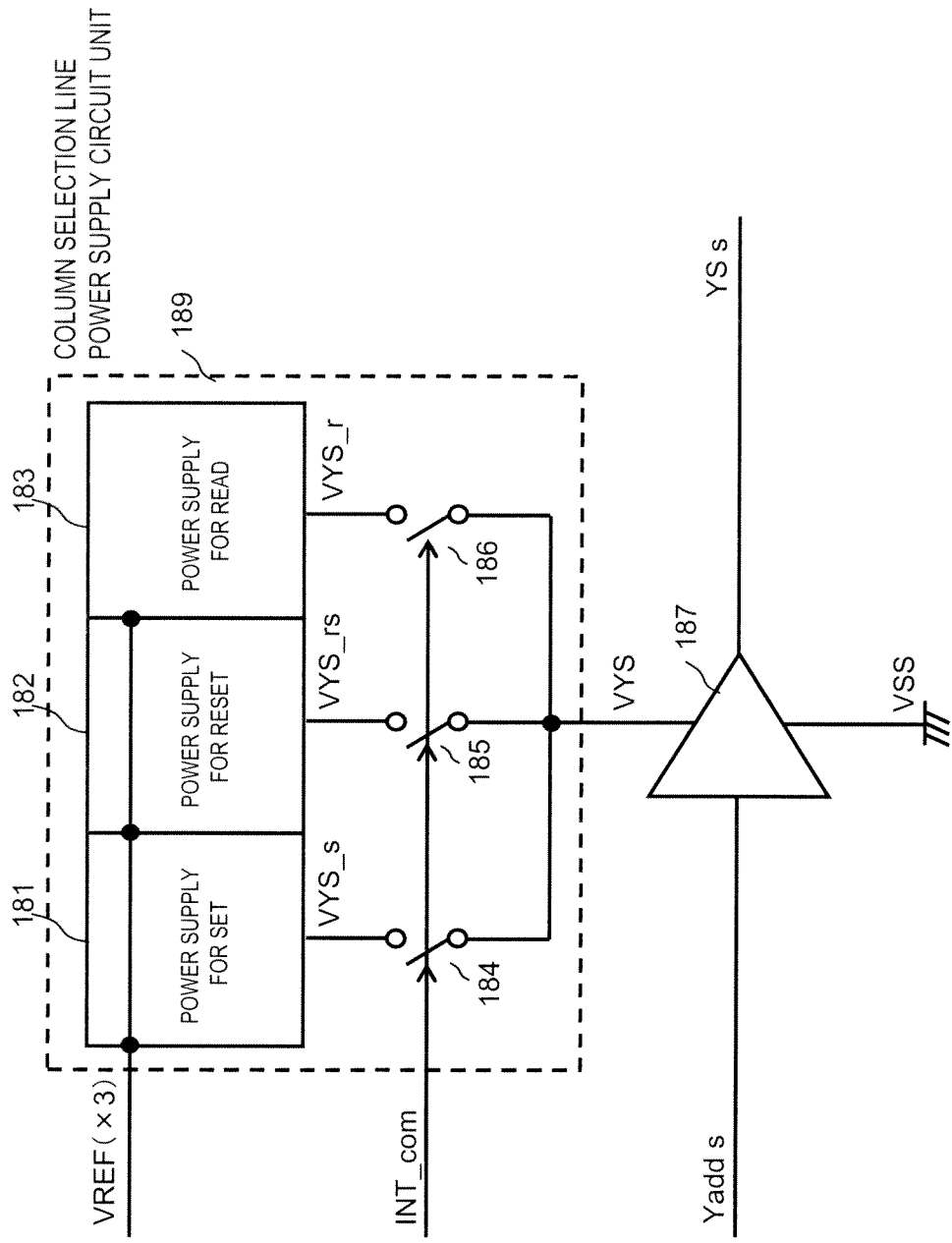
FIG. 34 is a block diagram showing a column selection line power supply circuit unit in the exemplary embodiment 16.

FIG. 34 depicts a block diagram of a column switch driver 187 and a column selection line power supply circuit unit 189 in the exemplary embodiment 15 as a reference. The column switch driver 187 receives the power supply VYS from the column selection line power supply circuit unit 189, and drives a column selection line YS based on a column address signal Yadd_s. The non-selected column selection lines are pulled down to the ground level power supply VSS.

In contrast with the word line power supply circuit unit 152a, the column selection line power supply circuit unit 189 includes a common power supply 137. The common power supply 137 receives a common reference signal VREF, and outputs a power supply VYS_c used for SET write, RESET write, and readout of the resistance value of the variable resistance element.

Exemplary Embodiment 16

In the exemplary embodiments 1 to 15, the power supply delivered to the gate electrode of the memory cell transistor 42, connected in series with the variable resistance element 41 between the common bit line 75 and the source line 33, is controlled to control the current flowing through the variable resistance element irrespectively of the parasitic capacitance of the common bit line 75 or the local bit line. Similarly to the cell transistor, the transistors of the bit line selection switches 72, 74 (FIG. 1) are connected in series with the variable resistance element between the common bit line 75 and the source line 33. It is thus possible to control the power supply applied to the control electrode of the bit line selection transistor to control the current flowing through the variable resistance element irrespectively of the parasitic capacitance of interconnects. That is, in the exemplary embodiment 16, the current flowing through the variable resistance element is controlled by controlling the power supply applied to a control electrode of a bit line selection transistor (column selection transistor).

FIG. 34 depicts a block diagram of a column switch driver 187 and a column selection line power supply circuit unit 189 in the exemplary embodiment 16. In the semiconductor device of the exemplary embodiment 16, the column selection line power supply circuit unit 189 includes a plurality of power supplies to be supplied to the column switch driver 187, in contradistinction from the word line power supply circuit units (52, 152, 152a) in the exemplary embodiments 1 to 15 including a plurality of power supplies for e.g., SET write and RESET write. The column switch driver 187 drives a column selection line YS which is a selection signal for selecting the bit line selection transistor. The column switch driver receives the power supply VYS from the column selection line power supply circuit unit 189 to drive the column selection line YS, selected based on a column address signal Yadd_s, by the power supply VYS. The non-selected column selection lines are pulled down to the ground level power supply VSS.

Similarly to the word line power supply circuit unit 152a in the exemplary embodiment 15, the column selection line power supply circuit unit 189 includes a power supply unit for SET write 181, a power supply unit for RESET write 182 and a power supply unit for read 183. The power supply unit for SET write 181, power supply unit for RESET write 182 and the power supply unit for read 183 are fed with respective different reference voltage signals VREFs, and output power supplies VYS_s, VYS_rs and VYS_r based on the different reference voltage signals VREFs. Power supply selection switches 184 to 186 are opened/closed in controlled manner based on an internal command signal INT_com to supply any of the power supplies VYS_s, VYS_rs and VYS_r to the column switch driver 187. Based on the supplied power supply, the column switch driver 187 drives a selected column selection line YS (equivalent to the control signal BLST of FIG. 1) at SET write, RESET write and read at respective different power supplies.

Figure 35A:
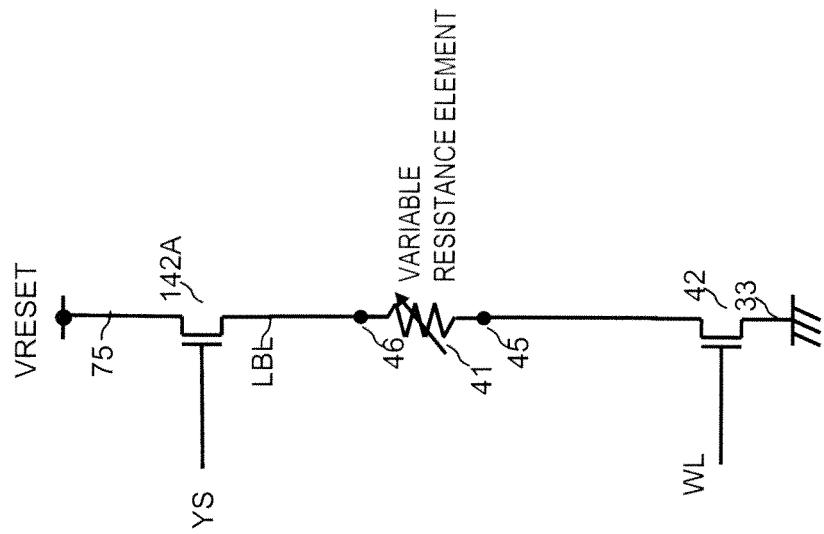
FIG. 35A illustrates a SET write operation for the variable resistance element of the exemplary embodiment 16.
Figure 35B:
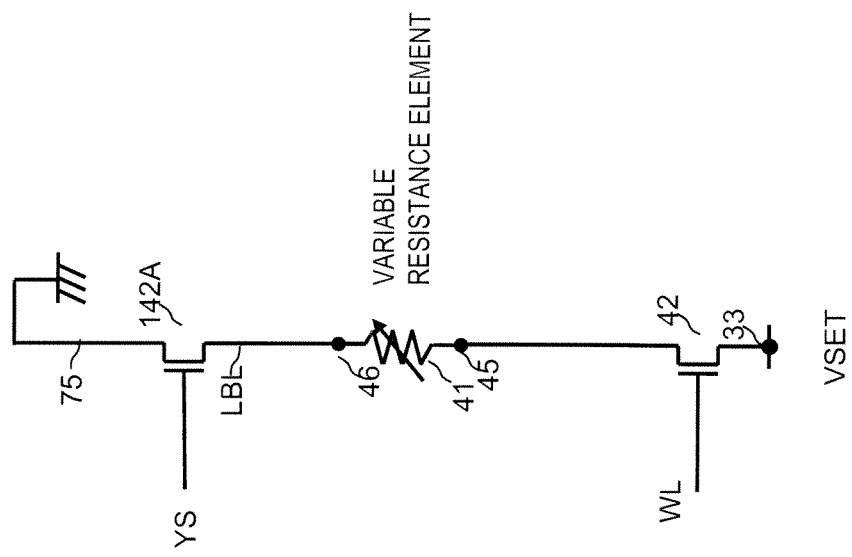
FIG. 35B illustrates a RESET write operation for the variable resistance element of the exemplary embodiment 16.

FIGS. 35A and 35B schematically show the operation at SET write and at RESET write, respectively, for the variable resistance element of the exemplary embodiment 16. As shown in FIGS. 35A and 35B, in the exemplary embodiment 16, a column selection transistor 142A, as a column selection switch, is composed just of an NMOS transistor to assure facilitated control of the control electrode of the column switch. Of course, in the exemplary embodiment 16, as in the exemplary embodiment 1, the column switch (bit line selection switch) may be arranged as a CMOS transmission gate composed of a PMOS transistor and an NMOS transistor. However, in this case, a further power supply is needed to control the power supply of control electrodes of both the PMOS and NMOS transistors, although detailed explanation for this case is dispensed with. Note that the switches 71, 73 interconnecting the source line 33 and the local bit lines (see FIG. 1) and the switch 76 interconnecting the source line 33 and the common bit line 75 are not in need of current control and hence may be arranged as a CMOS transmission gate as in FIG. 1.

In FIG. 35, the operation is the reverse of that of the exemplary embodiment 1. That is, in SET write, the current is caused to flow from the source line 33 to the common bit line 75 (see FIG. 35A) and, in RESET write, the current is caused to flow from the common bit line 75 to the source line 33 (see FIG. 35B). Hence, the terminals 45, 46 of the variable resistance element 41 are respectively connected to the cell transistor 42 and to the column selection transistor 142A. That is, the connection at the terminals 45, 46 is the reverse of that in the exemplary embodiment 1.

The reason the current is caused to flow from the source line 33 to the common bit line 75 in SET write shown in FIG. 35A in the exemplary embodiment 16 will now be explained. Suppose that, in case it is desired to change the resistance value of the variable resistance element 41 by SET write from the high resistance to the low resistance as in the exemplary embodiment 14, as in the exemplary embodiment 14, the current is caused to flow from the common bit line 75 to the source line 33. In this case, the terminal voltage towards the selection switch side of the variable resistance element is lowered when the resistance value of the variable resistance element 41 transitions from the high resistance value to the low resistance value. If the column selection transistor is the NMOS transistor 142A, the source potential of the NMOS transistor 142A is lowered. When the source potential of the NMOS transistor 142A is lowered, the gate source voltage of the NMOS transistor 142A is increased. This operates to increase the current flowing in the source and the drain of the NMOS transistor 142A. It is thus difficult to control the current caused to flow through the variable resistance element 41. Such is not the case if the current is caused to flow from the source line 33 to the common bit line 75 in SET write, as shown in FIG. 35A. On the other hand, if, in SET write, the current is caused to flow from the source line 33 to the common bit line 75, the voltage at the terminal 45 of the cell transistor 42 of the variable resistance element 41 is lowered owing to the fact that the resistance value of the variable resistance element 41 transitions from the high resistance to the low resistance. If there is large parasitic capacitance on the source line 33, no excess peak current flows since the current value may be limited by controlling the power supply of the control electrode of the NMOS transistor 142A.

In the exemplary embodiment 16, the current flow direction at write is reversed. Hence, a circuit which is about the same as that of the RESET write power supply 132 (see FIG. 30) in the exemplary embodiment 15 may be used as the power supply unit for SET write 181 (see FIG. 34). On the other hand, a circuit which is about the same as that of the SET write power supply 131 in the exemplary embodiment 15 (see FIG. 29) may be used as the power supply unit for RESET write 182 (see FIG. 34). If a plurality of power supplies with different voltage values or different slue rates are needed for write, as in the exemplary embodiment 1, it is only sufficient to provide as many power supplies as are necessary.

If, in the exemplary embodiment 16, only PMOS transistors are used as bit line selection switches, the current flow direction may be the same as that in the exemplary embodiment 1. However, if the parasitic capacitance present on the local bit lines LBL, such as that on the common bit line 75, is of a problem, it is desirable to control the control electrode of the cell transistor to limit the current, as in the exemplary embodiment 1, rather than using a PMOS transistor as the bit line selection switch to control its control electrode to limit the current. The reason is that, when the variable resistance element transitions to low resistance and the voltage across the terminals of the variable resistance element is rapidly decreased, it is not possible with the bit line selection switch disposed on an upstream side along the current flow direction to control the current flowing into the variable resistance element from the parasitic capacitance of the local bit line LBL disposed on the more downstream side than the bit line selection switch.

In the above described exemplary embodiments 15 and 16, the power supply of the word line or that of the column selection line is controlled for each of SET write, RESET write and read. However, if it is unnecessary to control the current flowing through the variable resistance element by the word line or the column selection line for all of the SET write, RESET write and read, the current flowing through the variable resistance element via the word line or the column selection line may be controlled only for SET write, RESET write or read as needed. For example, if only the peak current IMAX at SET write is of a problem, as in FIG. 33, power supply control of the word line or the column selection line may be managed only for SET write. In this case, the same power supply may be used for RESET write and read. Note that the power supply is to differ from that used for SET write.

Exemplary Embodiment 17

Figure 36:
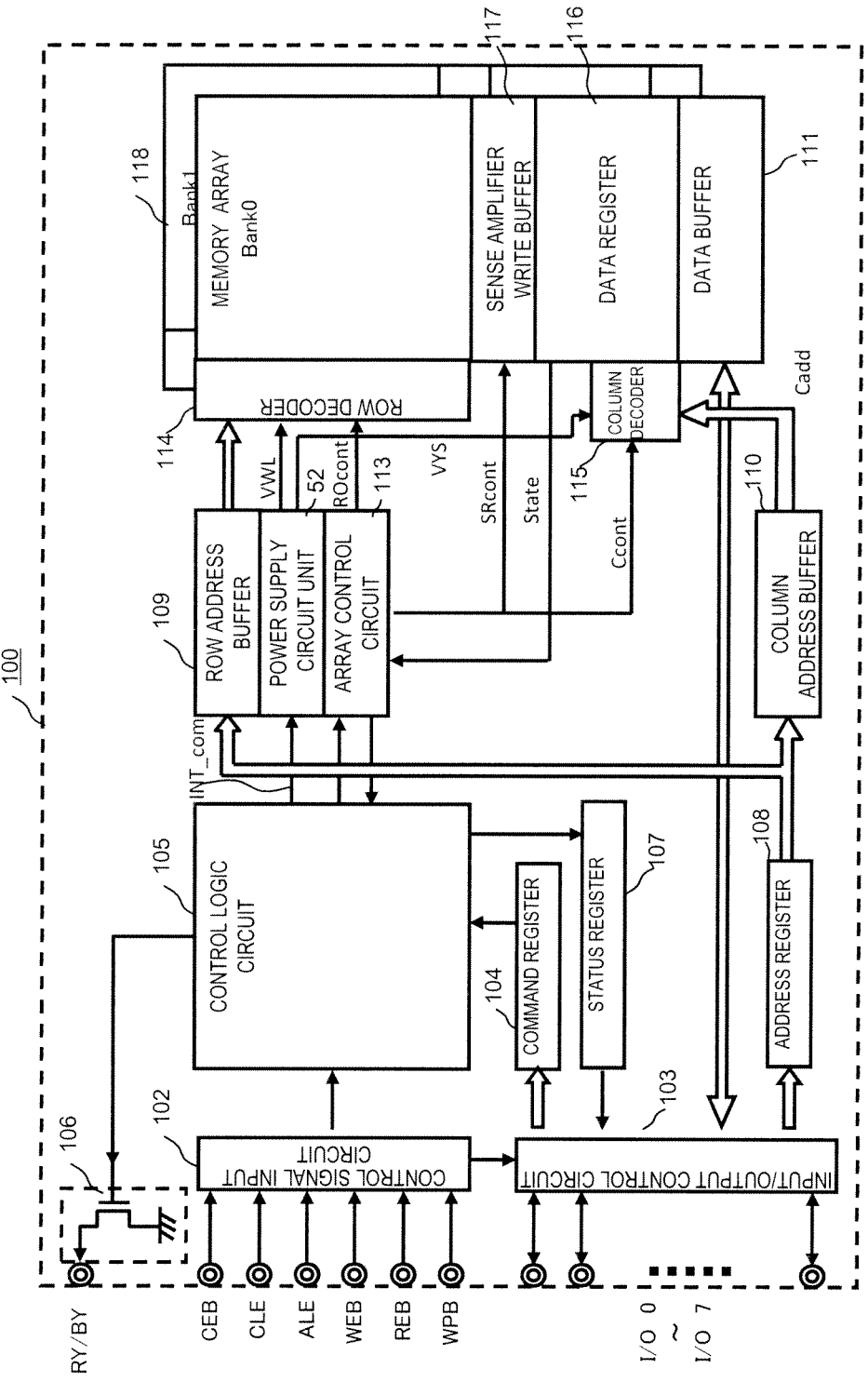
FIG. 36 is a block diagram showing a semiconductor device of an exemplary embodiment 17 in its entirety.
Figure 37:
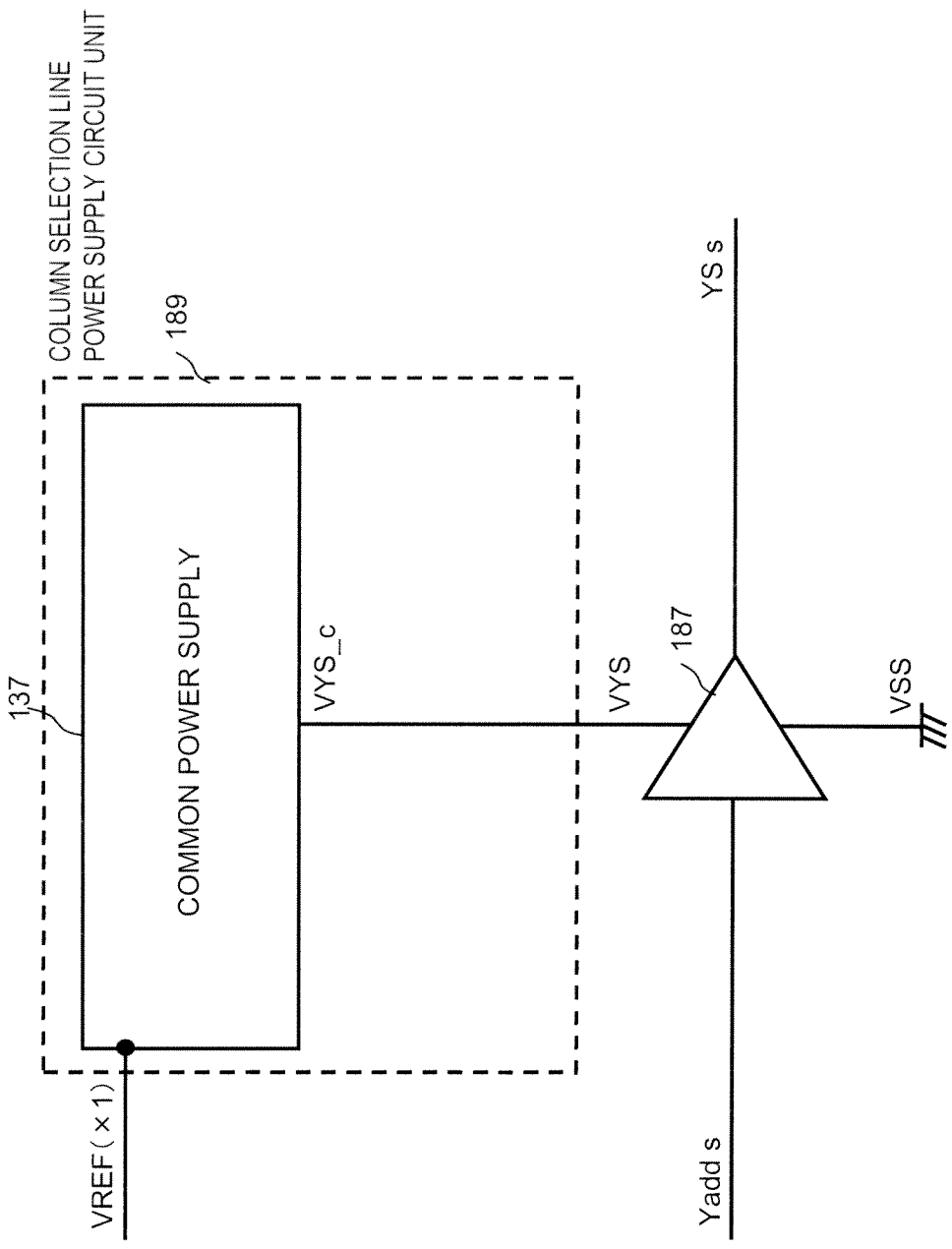
FIG. 37 is a block diagram showing a column selection line power supply circuit unit in the exemplary embodiment 15.

An exemplary embodiment 17 uses a memory, making use of the variable resistance element explained in connection with the exemplary embodiments 1 to 16, in a semiconductor device compatible with a NAND flash memory. FIG. 36 depicts a block diagram of an entire semiconductor device of the exemplary embodiment 17. A semiconductor device 100, shown in FIG. 36, is compatible with the NAND flash memory. Referring to FIG. 36, a control signal input circuit 102 strobes control signals delivered to a chip enable terminal CEB, a command latch enable terminal CLE, an address latch enable terminal ALE, a write enable terminal WEB, a read enable terminal REB and a write protect terminal WPB. An input/output control circuit 103 inputs a command and an address and inputs/outputs data at 8-bit input/output terminal I/O 0 to I/O 7. The input/output control circuit 103 inputs a command and an address and inputs/outputs data based on a control signal strobed by the control signal input circuit 102. The command strobed by the input/output control circuit 103 is delivered to a command resister 104. The address strobed by the input/output control circuit 103 is delivered to the address register. The input/output control circuit 103 inputs/outputs data between it and a data buffer 111.

A control logic circuit 105 controls the semiconductor device 100 in its entirety based on a control signal delivered to control signal input circuit 102 and a command strobed by the command resister 104. The control logic circuit 105 operates in dependence upon the state of the semiconductor device 100, that is, when the semiconductor device 100 is busy, the control logic circuit sets an RY/BY signal output circuit 106 into operation to output LOW level at an RY/BY signal output terminal to inform the outside world that the semiconductor device is busy. When the semiconductor device 100 is ready, the RY/BY signal output circuit 106 is in an output high impedance state. The RY/BY signal output terminal is brought HIGH by providing a pull-up resistor on the outside. The control logic circuit 105 outputs an inner state to a status register 107. The input/output operation performed by the input/output control circuit 103 is controlled by the status indicated by a status register 107.

Part of addresses strobed by an address register 108 is delivered to a row address buffer 109 to specify a row address of a memory array 118. Out of the addresses strobed by the address register 108, column addresses are strobed by a column address buffer 110 to specify the column addresses of the memory array 118 and a data register 116 for read/write.

In the memory array 118, a plurality of memory cells, not shown, provided with variable resistance elements, are arranged in a matrix pattern at points of intersection of a plurality of word lines, not shown, and a plurality of bit lines, also not shown. The power supply circuit unit 52 generates the power supply VWL of the word line driver, not shown, based on the internal command signal INT_com output by the control logic circuit 105. And the power supply circuit unit 52 generates the power supply VYS based on the internal command signal INT com, and supplies the power supply VYS to a column address decoder 115. An array control circuit 113 outputs a signal ROcont, controlling a row decoder 114, a signal SRcont, controlling a sense amplifier/write buffer 117 and a signal Ccont controlling a column address decoder 115. The array control circuit 113 inputs a status signal State from the data register 116. The row decoder 114 decodes a row address based on a row address output from the row address buffer 109, power supply VWL and the control signal ROcont to select a word line of read write access out of the multiple word lines extending to the memory array 118. The column decoder 115 specifies a column for read/write of the memory array 118. In case of the read operation, the sense amplifier/write buffer 117 amplifies data read out from the memory array 118 by a column address to a bit line selected by the column address to output the so amplified data to the data register 116. In the write operation, write data is written via data register 116 in the memory array 118, and data read out from the memory array 118 is stored via data register 116 in the data buffer 111. In the example of FIG. 36, the semiconductor device 100 is in-bank configuration, composed of a bank Bank0 and a bank Bank1, and the data buffer 111, row decoder 114, data register 116, sense amplifier/write buffer 117 and the memory array 118 are provided on the bank basis.

Exemplary Embodiment 18

Figure 26:
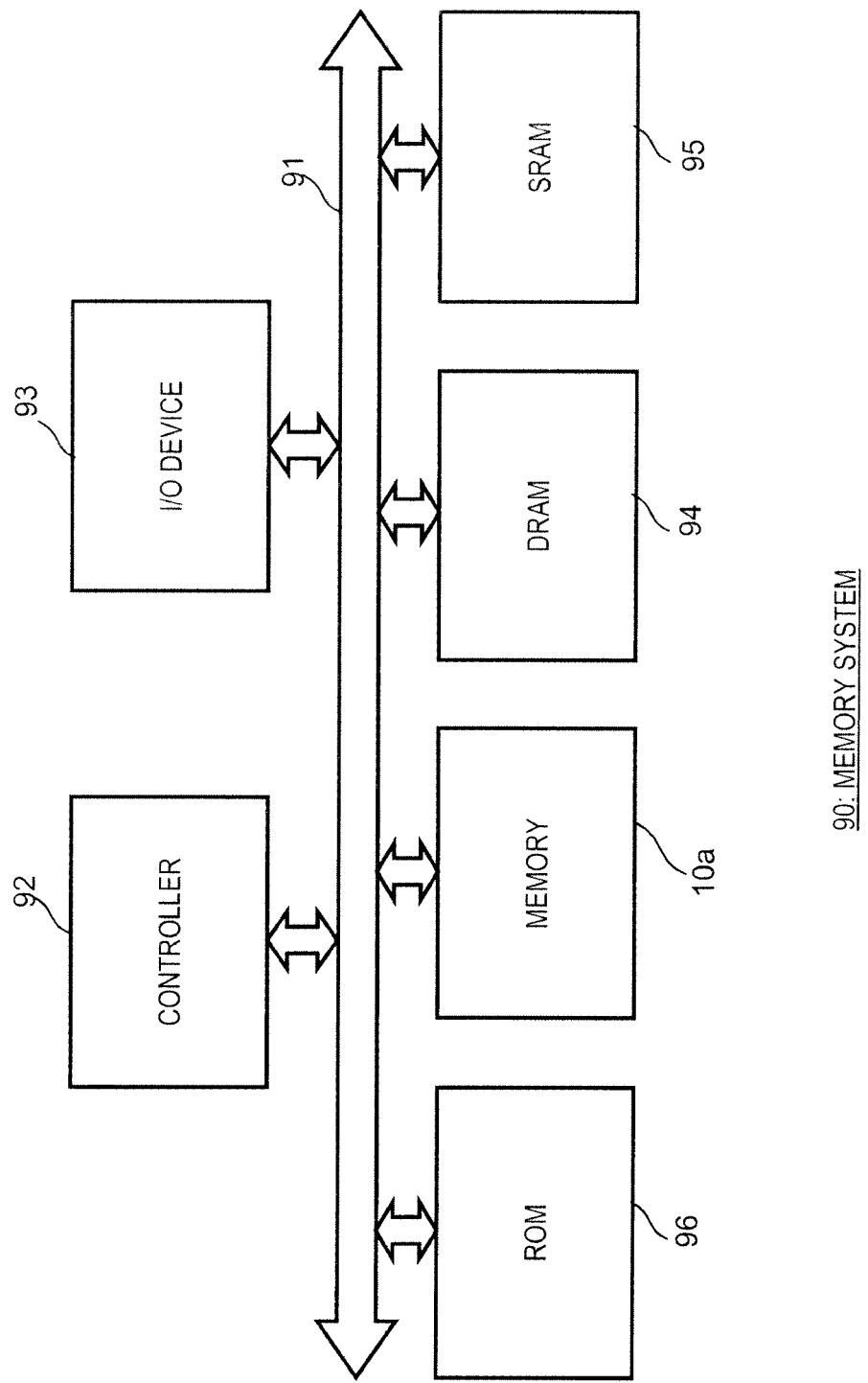
FIG. 26 is a block diagram showing a memory system according to an exemplary embodiment 18.
Figure 27:
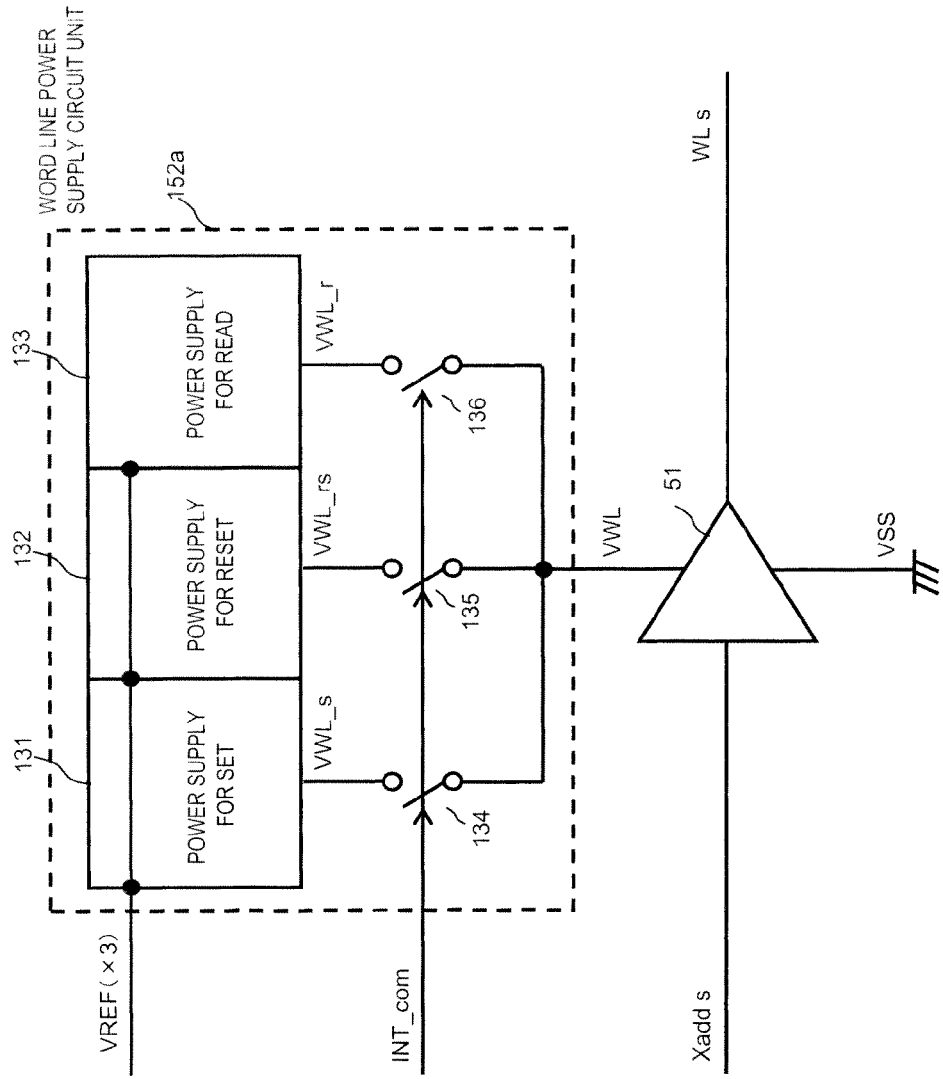
FIG. 27 is a circuit block diagram showing a word line power supply circuit unit according to an exemplary embodiment 15.

FIG. 26 is a block diagram of a memory system according to an exemplary embodiment 18. A memory system 90 of FIG. 26 includes a controller 92, controlling the memory system 90 in its entirety, a memory 10a, provided with the variable resistance element according to any of the exemplary embodiments 1 to 17, and a system bus 91, interconnecting the controller 92 and the system bus 91. Referring to FIG. 26, the system bus 91 may be provided with an I/O device 93 or semiconductor memories of different types, such as DRAM 94, SRAM 95 or ROM 96, as necessary.

The controller 92 may perform data processing based on programs or data stored in a memory 10a or other memories to store the result in the memory 10a or other memories. In the memory system 90 of FIG. 26, the memory 10a or the controller 92 may be formed by a single chip or a plurality of semiconductor chips. Or, the memory 10a and the controller 92 may be formed in their entirety as a single-chip memory system on the same semiconductor substrate.

The technical concept of the present application may apply to a semiconductor device including a non-volatile memory cell. The circuit forms in each circuit block and other circuits generating control signals, disclosed in the drawings, are not limited to the circuit forms disclosed in the exemplary embodiments.

The technical concept of the present application may apply to a variety of semiconductor devices. For example, the present invention may apply to a wide variety of semiconductor devices, such as CPU (Central Processing Unit), MCU (Micro Control Unit), DSP (Digital Signal Processor), ASIC (Application Specific Integrated Circuit), ASSP (Application Specific Standard Product) and memories. The semiconductor devices of the present invention may be in product forms including SOC (System on a Chip), MCP (Multi Chip Package) or POP (Package on package). That is, the present invention may apply to semiconductor devices in arbitrary product or package forms.

It is sufficient that the transistor is a field effect transistor (FET), such that a wide variety of FETs, including a MIS (Metal Insulator Semiconductor) or TFT (Thin Film Transistor), in addition to MOS (Metal Oxide Semiconductor). At least a part of transistors used may be bipolar transistors.

Moreover, in the present invention, it is sufficient that the variable resistance element is an element the resistance value of which is variable on passing the current through its resistance. For example, the variable resistance element may be a resistive switching element that, when current flows therein, may undergo phase change between an amorphous state and a crystalline state.

An NMOS transistor (N-type MOS transistor) is typical of a transistor of the first conductivity type, and a PMOS transistor (P-type MOS transistor) is typical of a transistor of the second conductivity type.

The disclosures of the aforementioned Non-Patent Documents are incorporated by reference herein. The particular exemplary embodiments or examples may be modified or adjusted within the scope of the entire disclosure of the present invention, inclusive of claims, based on the fundamental technical concept of the invention. In addition, a variety of combinations or selection of elements disclosed herein may be made within the context of the claims. That is, the present invention may cover a wide variety of modifications or corrections that may occur to those skilled in the art in accordance with the entire disclosure of the present invention, inclusive of claims, and the technical concept of the present invention.

What is claimed is:

1. A semiconductor device comprising
   first and second interconnects;
   a variable resistance element that may assume a first resistance value or a second resistance value in response to the current flowing therein;
   first and second transistors connected between the first and second interconnects in series with each other on both sides of the variable resistance element; and
   a power supply circuit unit that delivers the power supply to a control electrode of the first transistor;
   the power supply circuit unit supplying the power of a first power supply when the variable resistance element is to make transition to the first resistance value and the power supply circuit unit supplying the power of a second power supply when the variable resistance element is to make transition to the second resistance value, thereby allowing transitioning of the resistance values of the variable resistance element.

2. The semiconductor device according to claim 1, wherein the second power supply is a power supply different in voltage value from the first power supply.

3. The semiconductor device according to claim 2, further comprising
   a third power supply substantially equal in voltage value to the first power supply and differing in slue rate from the first power supply; the second power supply being delivered to the control electrode to cause transitioning to a third resistance value intermediate between the first and second resistance values when the variable resistance element is to make transition to the second resistance value; the third power supply being delivered to the control electrode in place of the second power supply to cause transitioning from the third resistance value to the second resistance value.

4. The semiconductor device according to claim 1, wherein,
   when the resistance value is changed to the second resistance value, the second power supply is delivered to the control electrode to cause transitioning to the second resistance value.

5. The semiconductor device according to claim 1, wherein,
   the power supply circuit unit further includes a fourth power supply different from the first and second power supplies; the fourth power supply being delivered to the control electrode in reading out the resistance value of the variable resistance element.

6. The semiconductor device according to claim 1, further comprising
   a source line;
   a common bit line;
   a plurality of bit lines arranged in a first direction;
   a plurality of word lines arranged in a second direction intersecting the first direction;
   a plurality of memory cells, each including the variable resistance element having one end connected to a relevant one of the bit lines, and a cell transistor connected between the other end of the variable resistance element and the source line; a control electrode of the cell transistor being connected to a relevant one of the word lines; the memory cells being arranged in a matrix at points of intersections of the bit lines and the word lines;

a plurality of bit line selection transistors provided associated with the bit lines; the bit line selection transistors being connected between the common bit line and a relevant one of the bit lines; and a driving circuit having an output connected to the control electrode of the first transistor;

one out of the first and second interconnects being the common bit line and the other being the source line;

one out of the first and second transistors being the cell transistor and the other being the bit line selection transistor;

the power supply circuit unit delivering the power supply to the control electrode of the first transistor via the driving circuit.

7. The semiconductor device according to claim 1, wherein, the power supply circuit unit includes a replica transistor of the first transistor;

a reference resistance having one end connected to the replica transistor;

a first voltage control circuit that controls the control electrode of the replica transistor so that, when the current is caused to flow through the reference resistance, the voltage at one end of the reference resistance will correspond to the reference voltage;

a power supply output unit that outputs a power supply to be applied to the control electrode of the first transistor; and a second voltage control circuit that controls the power supply output unit so that the output voltage of the power supply output unit will become a voltage corresponding to a voltage applied to the control electrode of the replica transistor.

8. The semiconductor device according to claim 7, wherein, the reference resistance includes a plurality of fixed resistances and a plurality of switches that change over the connection of the multiple fixed resistances connected between one and the other ends of the reference resistance; each switch including a transistor; the size of each transistor being set so that the on-resistance of each switch turned on will be proportionate to the resistance values of the fixed resistances connected between the ends of the variable resistor.

9. A semiconductor device comprising a memory cell including a series connection of a variable resistance element and a transistor accessing the variable resistance element; the variable resistance element storing the information by resistance values;

a bit line connected to one end of the memory cell;

a source line connected to the other end of the memory cell;

a word line connected to a gate electrode of the transistor; and a word line driving circuit that delivers a voltage to the word line;

the word line driving circuit in setting a resistance value of the variable resistance element from a high resistance to a low resistance causing the word line to transition from a first voltage that turns the transistor off to a third voltage that turns the transistor on at a second impedance higher than a first impedance to change the resistance value of the variable resistance element to a third resistance value intermediate between the high resistance and the low resistance; the third voltage being a voltage intermediate between the first voltage and a second voltage; the transistor being turned on at the first impedance with the second voltage;

the word line being made to transition from the third voltage to the second voltage after preset time as from transitioning to the third voltage to set the resistance value of the variable resistance element at the low resistance.

10. The semiconductor device according to claim 9, wherein the word line driving circuit in resetting the resistance value of the variable resistance element from the low resistance to the high resistance causes the word line to transition from the first voltage to the second voltage without providing for the preset time.

11. The semiconductor device according to claim 10, further comprising a bit line control circuit that controls the voltage on the bit line;

the bit line control circuit in setting the resistance value of the variable resistance element delivering a fourth voltage to the bit line after the word line has transitioned to the third voltage.

12. The semiconductor device according to claim 11, further comprising a source line control circuit that controls the voltage on the source line;

the source line control circuit in setting the resistance value of the variable resistance element delivering to the source line a fifth voltage lower in absolute value than the fourth voltage.

13. The semiconductor device according to claim 11, wherein, in resetting the resistance value of the variable resistance element, the bit line control circuit delivers a sixth voltage to the bit line after the word line has transitioned to the second voltage.

14. The semiconductor device according to claim 13, wherein, the source line control circuit in setting the resistance value of the variable resistance element delivers to the source line a seventh voltage higher in absolute value than the sixth voltage.

15. The semiconductor device according to claim 10, further comprising a bit line control circuit that controls the voltage on the bit line;

the bit line control circuit in setting the resistance value of the variable resistance element delivering the fourth voltage to the bit line before the word line transitions to the third voltage.

16. The semiconductor device according to claim 15, further comprising a source line control circuit that controls the voltage on the source line;

the source line control circuit in setting the resistance value of the variable resistance element delivering to the source line a fifth voltage lower absolute than the fourth voltage.

17. The semiconductor device according to claim 16, wherein, in resetting the resistance value of the variable resistance element, the bit line control circuit delivers the sixth voltage to the bit line;

the bit line control circuit delivering to the source line a seventh voltage higher in absolute value than the sixth voltage.

18. A semiconductor device comprising:
first and second interconnects;
a variable resistance element controlled to take an either one of first and second states, the first state being greater in resistance value than the second state;
first and second transistors provided between the first and second interconnects such that the first and second transistors and the variable resistance element are connected in series between the first and second interconnects;
a driver circuit supplying an activation voltage to a gate of the first transistor to turn on the first transistor; and
a control circuit controlling the activation voltage to take a first potential when the variable resistance element is controlled to change from the first state to the second state and controlling the activation voltage to take a second potential when the variable resistance element is controlled to change from the second state to the first state, the first and second potentials being different from each other.

19. The semiconductor device according to claim 18, further comprising:
an additional driver circuit supplying an additional activation voltage to a gate of the second transistor to turn on the second transistor; and
an additional control circuit controlling the additional activation voltage to take a third potential when the variable resistance element is controlled to change from the first state to the second state and controlling the additional activation voltage to take the third potential when the variable resistance element is controlled to change from the second state to the first state.

20. The semiconductor device according to claim 19, wherein the first and second interconnects are respectively supplied with fourth and fifth potentials when the variable resistance element is controlled to change from the first state to the second state, the first and second interconnects being respectively supplied with sixth and seventh potentials when the variable resistance element is controlled to change from the second state to the first state, the fourth potential being greater than the fifth potential, and the seventh potential being greater than the sixth potential.

* * * * *